US009845530B2

(12) United States Patent
Inoue et al.

(10) Patent No.: US 9,845,530 B2
(45) Date of Patent: Dec. 19, 2017

(54) MASK FOR VAPOR DEPOSITION APPARATUS, VAPOR DEPOSITION APPARATUS, VAPOR DEPOSITION METHOD, AND METHOD FOR PRODUCING ORGANIC ELECTROLUMINESCENCE ELEMENT

(71) Applicant: Sharp Kabushiki Kaisha, Sakai, Osaka (JP)

(72) Inventors: Satoshi Inoue, Sakai (JP); Katsuhiro Kikuchi, Sakai (JP); Shinichi Kawato, Sakai (JP); Takashi Ochi, Sakai (JP); Yuhki Kobayashi, Sakai (JP); Kazuki Matsunaga, Sakai (JP); Eiichi Matsumoto, Mitsuke (JP); Masahiro Ichihara, Mitsuke (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/310,499

(22) PCT Filed: May 7, 2015

(86) PCT No.: PCT/JP2015/063167
§ 371 (c)(1),
(2) Date: Nov. 11, 2016

(87) PCT Pub. No.: WO2015/174311
PCT Pub. Date: Nov. 19, 2015

(65) Prior Publication Data
US 2017/0081758 A1 Mar. 23, 2017

(30) Foreign Application Priority Data
May 13, 2014 (JP) .................................. 2014-099720

(51) Int. Cl.
*H01L 21/00* (2006.01)
*C23C 16/04* (2006.01)
(Continued)

(52) U.S. Cl.
CPC ............ *C23C 16/042* (2013.01); *C23C 14/04* (2013.01); *C23C 16/52* (2013.01); *H01L 51/50* (2013.01); *H01L 51/56* (2013.01)

(58) Field of Classification Search
CPC ......... H01L 51/56; H01L 51/50; C23C 14/04; C23C 14/042; C23C 16/042; C23C 16/52
See application file for complete search history.

(56) References Cited

U.S. PATENT DOCUMENTS

| 6,534,222 B1 * | 3/2003 | Suzuki ...................... G03F 1/20 219/603 |
| 2003/0137024 A1 * | 7/2003 | Moriya ................. B82Y 10/00 430/5 |

(Continued)

FOREIGN PATENT DOCUMENTS

| JP | 2011-052318 A | 3/2011 |
| JP | 2013-165060 A | 8/2013 |

(Continued)

OTHER PUBLICATIONS

Official Communication issued in International Patent Application No. PCT/JP2015/063167, dated Jul. 21, 2015.

*Primary Examiner* — Thanh Y Tran
(74) *Attorney, Agent, or Firm* — Keating & Bennett, LLP

(57) ABSTRACT

A mask for a vapor deposition apparatus includes an outer frame; a first bar disposed on an inner side of the outer frame and fixed to the outer frame; and a pattern forming portion disposed on the outer frame and the first bar and fixed to the outer frame. The pattern forming portion includes a plurality of mask openings for pattern formation. Each of the plurality of mask openings is disposed along a first direction. The (Continued)

plurality of mask openings are disposed in a second direction orthogonal to the first direction. The first bar is positioned between adjacent two mask openings among the plurality of mask openings when viewed along a third direction orthogonal to the first direction and the second direction, and is in contact with the pattern forming portion.

16 Claims, 20 Drawing Sheets

(51) Int. Cl.
*C23C 14/04* (2006.01)
*H01L 51/50* (2006.01)
*C23C 16/52* (2006.01)
*H01L 51/56* (2006.01)

(56) References Cited

U.S. PATENT DOCUMENTS

| | | | |
|---|---|---|---|
| 2004/0086790 A1* | 5/2004 | Moriya | B82Y 10/00 430/5 |
| 2007/0054203 A1* | 3/2007 | Moriya | B82Y 10/00 430/5 |
| 2011/0048320 A1 | 3/2011 | Choi et al. | |
| 2013/0059063 A1 | 3/2013 | Kawato et al. | |
| 2015/0017759 A1 | 1/2015 | Hirobe et al. | |
| 2016/0308131 A1* | 10/2016 | Kobayashi | C23C 14/54 |

FOREIGN PATENT DOCUMENTS

| JP | 2013-231238 A | 11/2013 |
|---|---|---|
| WO | 2011/145456 A1 | 11/2011 |

\* cited by examiner

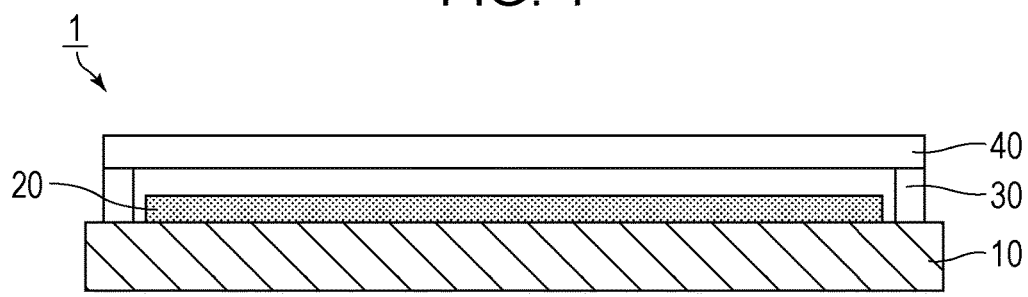
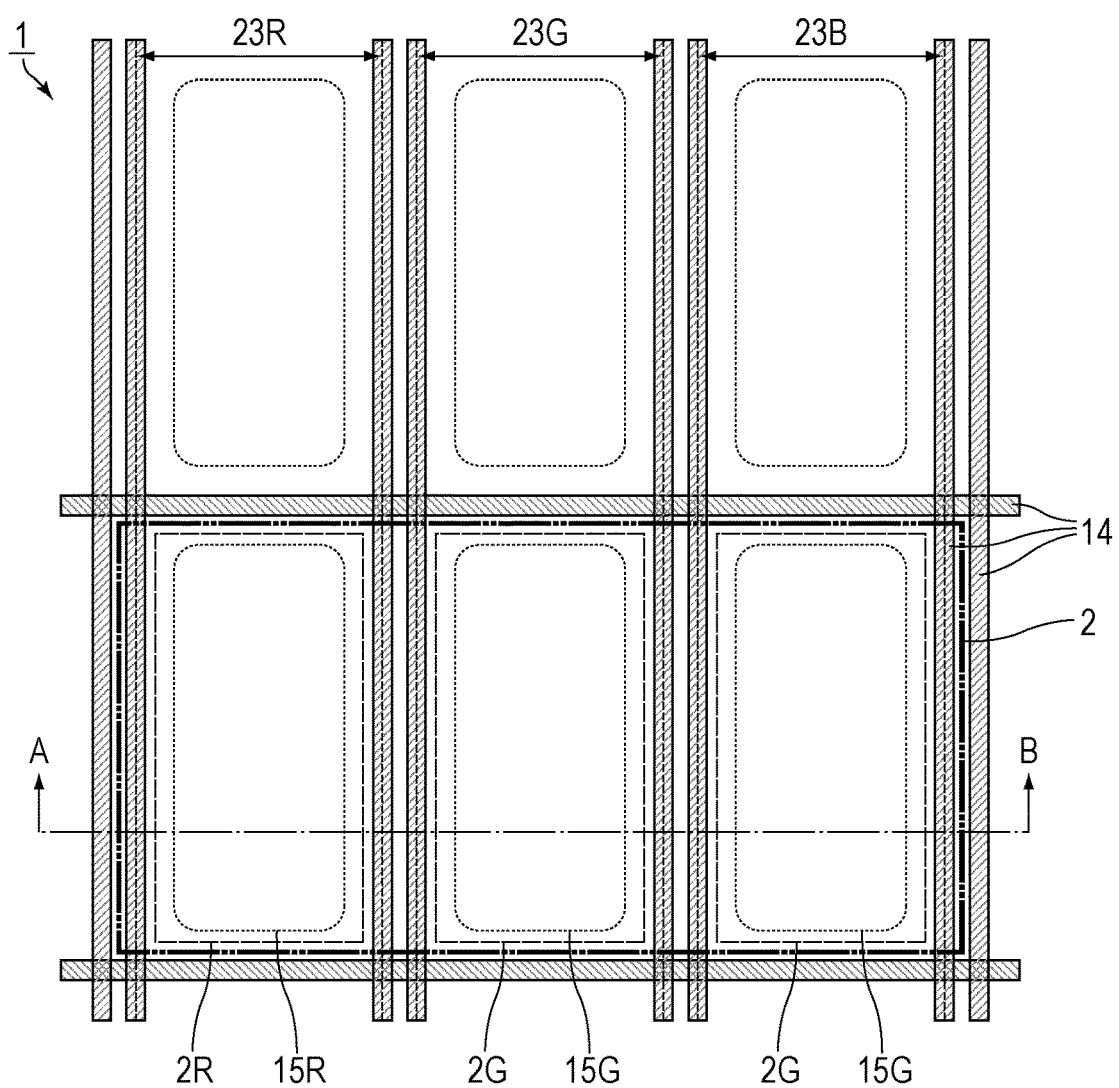

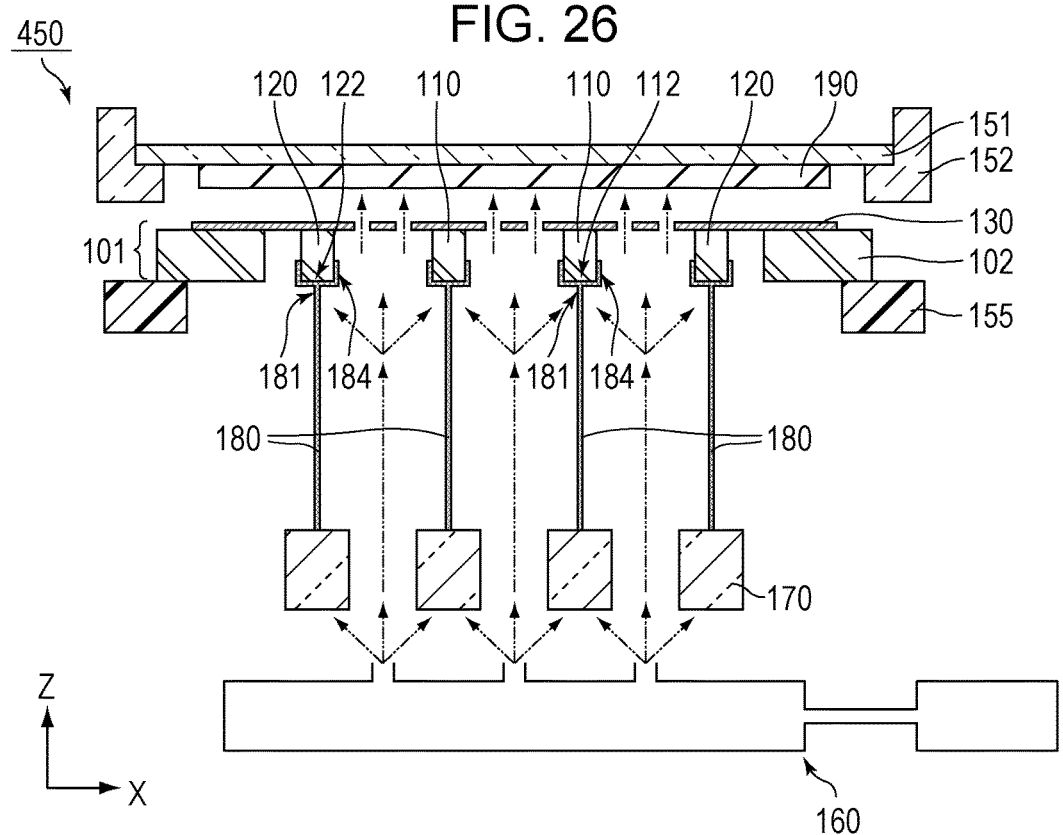
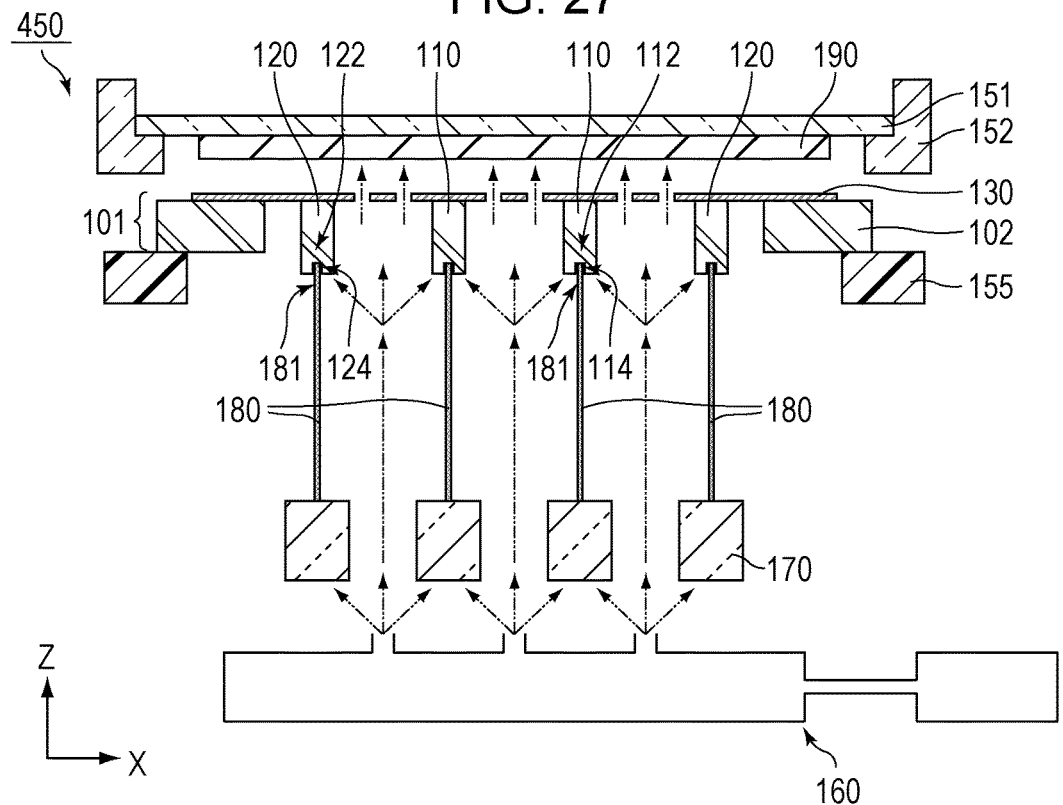

(SUBSTRATE SIDE)

(VAPOR DEPOSITION SOURCE SIDE)

(SUBSTRATE SIDE)

(VAPOR DEPOSITION SOURCE SIDE)

MASK FOR VAPOR DEPOSITION APPARATUS, VAPOR DEPOSITION APPARATUS, VAPOR DEPOSITION METHOD, AND METHOD FOR PRODUCING ORGANIC ELECTROLUMINESCENCE ELEMENT

TECHNICAL FIELD

The present disclosure relates to a mask for a vapor deposition apparatus, a vapor deposition apparatus, a vapor deposition method, and a method for producing an organic electroluminescence (hereinafter may be abbreviated to EL) element. In particular, the present disclosure relates to a mask for a vapor deposition apparatus, a vapor deposition apparatus, a vapor deposition method, and a method for producing an organic EL element that are suitable for producing organic EL elements on a large-size substrate.

BACKGROUND ART

Flat panel displays are increasingly used in various commercial products and fields in recent years and larger, higher-image-quality, and low-power-consumption flat panel displays are in demand.

Under such trends, organic EL devices equipped with organic EL elements that use electroluminescence of organic materials are attracting much attention as display devices for flat panel displays that excel in terms of low-voltage drive, high-speed response, self luminous property, etc., despite being in an all-solid state.

An organic EL device includes, for example, a thin film transistor (TFT) and an organic EL element connected to the TFT on a substrate, such as a glass substrate. The organic EL element has a structure in which a first electrode, an organic electroluminescence layer (hereinafter may also be referred to as an organic EL layer), and a second electrode are stacked on top of each other in that order. The first electrode is coupled to the TFT. The organic EL layer has a structure in which layers such as a hole injection layer, a hole transport layer, an electron blocking layer, an emission layer, a hole blocking layer, an electron transport layer, and an electron injection layer are stacked on top of each other.

An organic EL device for full color displays usually includes subpixels constituted by organic EL elements of three colors, red (R), green (G), and blue (B), and these subpixels are arranged in a matrix so that the subpixels of three colors constitute one pixel. An image is displayed when these organic EL elements are selectively caused to emit light at a desired luminance.

In producing such an organic EL device, a pattern of emission layers are formed by using a light-emitting material so as to correspond to the organic EL elements (subpixels) of respective colors.

Examples of the method for forming a pattern of emission layers proposed include a method with which vapor deposition is performed by bringing a substrate and a vapor deposition mask about the same size as the substrate into contact with each other (hereinafter this method may be referred to as a contact deposition method) and a method with which vapor deposition is carried out while moving a substrate relative to a vapor deposition mask smaller than the substrate in size (hereinafter this method may be referred to as a scan deposition method). The following techniques related to the scan deposition method have been disclosed, for example.

Disclosed is a thin-film vapor deposition apparatus for forming a thin film on a substrate, the apparatus including a vapor deposition source; a first nozzle arranged on one side of the vapor deposition source and having a plurality of first slits formed along a first direction; a second nozzle arranged to oppose the vapor deposition source and having a plurality of second slits formed along the first direction; a blocking wall assembly that includes a plurality of blocking walls arranged along the first direction so as to partition a space between the first nozzle and the second nozzle; and at least one selected from a spacing controlling member that controls spacing between the second nozzle and the substrate and an alignment controlling member that controls alignment between the second nozzle and the substrate (for example, see PTL 1).

Also disclosed is a method for producing an organic EL element that includes a coating film of a particular pattern on a substrate, the method including a vapor deposition step of forming the coating film by causing vapor deposition particles to adhere to the substrate. The vapor deposition step is a step in which a vapor deposition unit, which includes a vapor deposition source including a vapor deposition source opening through which vapor deposition particles are released and a vapor deposition mask disposed between the vapor deposition source opening and the substrate, is used. In this step, while holding the substrate distant from the vapor deposition mask by a particular distance, one of the substrate and the vapor deposition unit is relatively moved with respect to the other so that the vapor deposition particles that have passed through the mask openings formed in the vapor deposition mask are caused to adhere to the substrate. When the relative movement direction between the substrate and the vapor deposition unit is assumed to be a first direction and a direction orthogonal to the first direction is assumed to be a second direction, the vapor deposition unit includes a plurality of limit plates between the vapor deposition source opening and the vapor deposition mask and at different positions in the second direction. Each of the plurality of limit plates limits the incident angle of the vapor deposition particles entering each of the plurality of mask openings when viewed along the first direction (For example, see PTL 2).

CITATION LIST

Patent Literature

PTL 1: Japanese Unexamined Patent Application Publication No. 2013-231238
PTL 2: International Publication No. 2011/145456

SUMMARY OF INVENTION

Technical Problem

FIG. 39 is a schematic cross-sectional view of a substrate and a mask in a scan vapor deposition method. As illustrated in FIG. 39, in the scan vapor deposition method, a gap must be secured between a substrate 1290 and a mask 1201 during the period of performing deposition in order to prevent the substrate 1290 from making contact with the mask 1201 and being damaged during transportation of the substrate 1290. Thus, an abnormal (unneeded) pattern 1294 called a ghost is likely to occur in addition to a normal pattern 1293 formed of normal vapor deposition particles (vaporized material) 1297 from a vapor deposition source in accordance with the pattern of a mask opening 1232 provided in the mask 1201.

The ghost 1294 is usually formed at a location deviating from the normal pattern 1293 in a direction orthogonal to the substrate 1290 transportation direction (direction perpendicular to the plane of the paper of the drawing). A possible cause for occurrence of the ghost 1294 is the vapor deposition particles 1295 that have a large velocity component in this direction and travel outside the designated range. Presumably, such vapor deposition particles 1295 reach positions largely deviating from the mask opening 1232 in a direction orthogonal to the substrate 1290 transportation direction and the ghost 1294 occurs.

Due to the ghost, it has been difficult to fabricate high-definition panels or high-performance panels by fabricating organic EL display devices by the scan vapor deposition method, for example. More specifically, there has been a possibility that the ghost may cause abnormal emission, such as mixed color emission with which a different color mixes into the intended color of emission, in organic EL display devices for RGB full color display. Abnormal emission significantly impairs display quality of organic EL display devices.

The cause of occurrence of the ghost will now be described in detail by taking as an example the vapor deposition apparatus according to Comparative Embodiment 1 the inventors of the present invention have studied. In the description below, the Cartesian coordinate in which the X axis and the Y axis lie in a horizontal plane and the Z axis lies in a vertical direction is used where appropriate.

FIG. 40 is a schematic cross-sectional view of a vapor deposition apparatus according to Comparative Embodiment 1 the inventors of the embodiment of the invention have studied, and a section perpendicular to the Y axis is illustrated.

As illustrated in FIG. 40, the vapor deposition apparatus according to Comparative Embodiment 1 includes a vacuum chamber (not illustrated), an outer frame 1102, a mask 1101 including a pattern forming portion 1130, a mask holder 1155 that supports the mask 1101, a vapor deposition source 1160 that has multiple nozzles 1163, an aperture 1170 provided with multiple openings 1171 corresponding to the nozzles 1163, and multiple limit plates 1180 that align in the X axis direction to divide the space between the aperture 1170 and the mask 1101 into plural spaces. In the pattern forming portion 1130, multiple mask openings 1132 for forming a pattern is formed. While the vaporized material (vapor deposition particles) is being discharged upward from injection ports 1164 of the nozzles 1163, a substrate 1190 is transported in the Y axis direction (direction perpendicular to the plane of the paper of the drawing) above the pattern forming portion 1130. As a result, a normal pattern copying the pattern of the mask openings 1132 is formed on the substrate 1190.

The aperture 1170 limits the travel range of the vapor deposition particles that have isotopically spread immediately after discharge from the injection ports 1164. This is to reduce the magnitude (width) of blurs that occur in the contour portion of the deposition pattern and prevent occurrence of the ghost. The blurs are, as illustrated in FIG. 39, portions which are positioned on both sides of a portion having a particular thickness and whose thicknesses gradually decrease. The vapor deposition particles that have passed through the aperture 1170 should ideally travel within the range limited by the aperture 1170. However, in actual cases, the vapor deposition particles scatter after passing the aperture 1170 and the material adhering to the aperture 1170 is re-evaporated, for example, such that vapor deposition particles having a large velocity component in the X axis direction and that travel outside the predetermined range are generated. Moreover, there is also a possibility that vapor deposition particles may travel around toward the mask 1101 from a side in the Y axis direction due to factors such as re-evaporation of the material adhering to other parts, such as the vacuum chamber. These vapor deposition particles have a large velocity component in the direction orthogonal to the substrate 1190 transportation direction and thus cause blurs and ghosts. In order to further decrease the magnitude of blurs and prevent occurrence of ghosts, the multiple limit plates 1180 are arranged at positions different in the X axis direction. Because of this, vapor deposition particles that have a large velocity component in the X axis direction and travel outside the predetermined range can be made to adhere to the limit plates 1180.

However, in Comparative Embodiment 1, a gap is present between each of the limit plates 1180 and the pattern forming portion 1130. Thus, vapor deposition particles scatter immediately before reaching the pattern forming portion 1130 or re-evaporation of the material may occur at and near the pattern forming portion 1130 so that, as shown in FIG. 40, a small number of vapor deposition particles 1195 that have a large velocity component in the X axis direction and travel beyond the predetermined range are generated. As a result, while vapor deposition particles 1197 linearly entering the mask openings 1132 from the injection ports 1164 form the normal pattern, the vapor deposition particles 1195 form ghosts at positions deviated from the normal pattern in the X axis direction. There is also a possibility that vapor deposition particles 1196 that travel around toward the pattern forming portion 1130 from the side by passing through the gaps between the limit plates 1180 at both ends and the pattern forming portion 1130 and that have a large velocity component in the X axis direction are generated, and there is a possibility that ghosts may occur due to these vapor deposition particles 1196.

FIG. 41 is a schematic perspective view of a thin-film vapor deposition apparatus illustrated in FIG. 13 of PTL 1. According to the thin-film vapor deposition apparatus illustrated in FIG. 13 of PTL 1, as shown in FIG. 41, a vapor deposition source 1310 is arranged to oppose a substrate 1360 and a second blocking wall 1341 is disposed between a first blocking wall 1331 disposed on the side of the vapor deposition source 1310 and a second nozzle 1350 in which a second slit 1351 for pattern forming is formed. However, since the second nozzle 1350 is fixed to a second nozzle frame 1355, a gap at least equal to a thickness of the second nozzle frame 1355 is generated between the second blocking wall 1341 and the second nozzle 1350. Moreover, a gap also exists between the first blocking wall 1331 and the second blocking wall 1341. Presumably, unexpected vapor deposition particles pass through these gaps and cause ghosts.

It is described in paragraph 0128 of PTL 2, that the limit plates may contact the vapor deposition mask and, in paragraph 0160, that the upper limit of the limit plates may be extended up to the vapor deposition mask. However, if the limit plates contact the vapor deposition mask, the vapor deposition mask deforms and an accurate vapor deposition pattern cannot be formed.

In view of the above, in employing the scan vapor deposition method, there is a room for improvement from the viewpoint of suppressing occurrence of ghosts while maintaining the precision of the deposition pattern.

The embodiment of the invention has been made under the circumstances described above and aims to provide a mask for a vapor deposition apparatus, a vapor deposition apparatus, a vapor deposition method, and a method for producing an organic electroluminescence element with which occurrence of ghosts can be suppressed while maintaining the precision of the deposition pattern.

Solution to Problem

An aspect of the embodiment of the invention may be a mask for a vapor deposition apparatus, including an outer frame;
a first bar disposed on an inner side of the outer frame and fixed to the outer frame; and
a pattern forming portion disposed on the outer frame and the first bar and fixed to the outer frame,
in which the pattern forming portion includes a plurality of mask openings for pattern formation,
each of the plurality of mask openings is disposed along a first direction,
the plurality of mask openings are disposed in a second direction orthogonal to the first direction, and
the first bar is positioned between adjacent two mask openings among the plurality of mask openings when viewed along a third direction orthogonal to the first direction and the second direction, and is in contact with the pattern forming portion.

Hereinafter, this mask for a vapor deposition apparatus may be referred to as a mask for a vapor deposition apparatus according to the embodiment of the invention.

Preferred embodiments of the mask for a vapor deposition apparatus according to the embodiment of the invention are described below. These preferred embodiments may be appropriately combined with one another and an embodiment in which two or more preferred embodiments described below are combined is also one of the preferred embodiments.

The mask for a vapor deposition apparatus according to the embodiment of the invention may be used in a vapor deposition apparatus in which vapor deposition is carried out while relatively moving the substrate with respect to a deposition unit that includes the mask for a vapor deposition apparatus according to the embodiment of the invention, a limit plate, and a vapor deposition source in this order from the substrate side.

The mask for a vapor deposition apparatus according to the embodiment of the invention may include a second bar disposed on the inner side of the outer frame and fixed to the outer frame,
the pattern forming portion may be disposed on the outer frame, the first bar, and the second bar, and
when, among the plurality of mask openings, the mask opening positioned at one end in the second direction is assumed to be an endmost opening and the mask opening positioned next to the endmost opening is assumed to be an adjacent opening, the second bar may be positioned on a side opposite of the adjacent opening of the endmost opening when viewed along the third direction, and may be in contact with the pattern forming portion.

Hereinafter, this mask for a vapor deposition apparatus may be referred to as a mask for a vapor deposition apparatus according to a preferred embodiment.

Another aspect of the embodiment of the invention may be a vapor deposition apparatus for forming films on a substrate, including:
a deposition unit including the mask for a vapor deposition apparatus according to the preferred embodiment, a vapor deposition source configured to release vapor deposition particles, and a limit plate being disposed between the mask for a vapor deposition apparatus and the vapor deposition source and partitioning a space between the mask for a vapor deposition apparatus and the vapor deposition source so as to divide the space into a plurality of spaces aligned in the second direction; and
a moving mechanism configured to relatively move the substrate with respect to the deposition unit along the first direction while distancing the substrate from the mask for a vapor deposition apparatus,
in which the mask for a vapor deposition apparatus is disposed so that the pattern forming portion is positioned on a substrate side and the first bar is positioned on a limit plate side, and
the limit plate is in contact with the first bar but not the pattern forming portion.

Hereinafter, this vapor deposition apparatus may be referred to as a first vapor deposition apparatus according to the embodiment of the invention.

Preferred embodiments of the first vapor deposition apparatus according to the embodiment of the invention are described below. These preferred embodiments may be appropriately combined with one another and an embodiment in which two or more preferred embodiments described below are combined is also one of the preferred embodiments. The aforementioned preferred embodiments and the preferred embodiments described below may be combined as desired and an embodiment in which two or more preferred embodiments are combined is also one of the preferred embodiments.

The first vapor deposition apparatus according to the embodiment of the invention may include an aperture disposed between the limit plate and the vapor deposition source,
a plurality of openings may be formed in the aperture,
the plurality of openings of the aperture may be disposed in the second direction, and
the limit plate may be positioned between adjacent two openings among the plurality of openings of the aperture when viewed along the third direction, and may be in contact with the aperture.

Of the first bar and the limit plate, one may include a recess and a part of the other may be fitted into the recess.

The deposition unit may include a temperature controlling device configured to cool the mask for a vapor deposition apparatus and a temperature sensor in contact with the mask for a vapor deposition apparatus, and the temperature controlling device may be in contact with at least one selected from the first bar and the limit plate.

The deposition unit may include the mask for a vapor deposition apparatus according the preferred embodiment and a plurality of the limit plates, and
the plurality of limit plates may include a limit plate in contact with the second bar but not the pattern forming portion.

Of the second bar and the limit plate in contact with the second bar, one may include a recess and a part of the other may be fitted into the recess.

The deposition unit may include a temperature controlling device configured to cool the mask for a vapor deposition apparatus and a temperature sensor in contact with the mask for a vapor deposition apparatus, and
the temperature controlling device may be in contact with at least one selected from the first bar and the limit plate in contact with the first bar, and may be also in contact with at least one selected from the second bar and the limit plate in contact with the second bar.

Another aspect of the embodiment of the invention may be a vapor deposition apparatus for forming films on a substrate, including a deposition unit including the mask for a vapor deposition apparatus according to the preferred embodiment, a vapor deposition source configured to release vapor deposition particles, a limit plate being disposed between the mask for a vapor deposition apparatus and the vapor deposition source and partitioning a space between the mask for a vapor deposition apparatus and the vapor deposition source so as to divide the space into a plurality of spaces aligned in the second direction, a temperature controlling device configured to cool the mask for a vapor deposition apparatus, and a temperature sensor in contact with the mask for a vapor deposition apparatus; and a moving mechanism configured to relatively move the substrate with respect to the deposition unit along the first direction while distancing the substrate from the mask for a vapor deposition apparatus, in which the mask for a vapor deposition apparatus is disposed so that the pattern forming portion is positioned on a substrate side and the first bar is positioned on a limit plate side, and the temperature controlling device is disposed between the first bar and the limit plate and is in contact with the first bar and the limit plate.

Hereinafter, this vapor deposition apparatus may be referred to as a second vapor deposition apparatus according to the embodiment of the invention.

Preferred embodiments of the second vapor deposition apparatus according to the embodiment of the invention are described below. These preferred embodiments may be appropriately combined with one another and an embodiment in which two or more preferred embodiments described below are combined is also one of the preferred embodiments. The aforementioned preferred embodiments and the preferred embodiments described below may be combined as desired and an embodiment in which two or more preferred embodiments are combined is also one of the preferred embodiments.

The second vapor deposition apparatus according to the embodiment of the invention may include an aperture disposed between the limit plate and the vapor deposition source, in which a plurality of openings may be formed in the aperture, the plurality of openings of the aperture may be disposed in the second direction, and the limit plate may be positioned between adjacent two openings among the plurality of openings of the aperture when viewed along the third direction, and may be in contact with the aperture.

The deposition unit may include the mask for a vapor deposition apparatus according to the preferred embodiment and a plurality of the limit plates, and the plurality of limit plates may include a limit plate being disposed such that the temperature controlling device is disposed between the second bar and the limit plate, and being in contact with the temperature controlling device, and the temperature controlling device may be in contact with the second bar.

Another aspect of the embodiment of the invention may be a vapor deposition method including a vapor deposition step of forming films on a substrate, and the vapor deposition step may be performed by using the first or second vapor deposition apparatus according to the embodiment of the invention.

Yet another aspect of the embodiment of the invention may be a method for producing an organic electroluminescence element, including a vapor deposition step of forming films by using the first or second vapor deposition apparatus according to the embodiment of the invention.

Advantageous Effects of Invention

According to the embodiment of the invention, a mask for a vapor deposition apparatus, a vapor deposition apparatus, a vapor deposition method, and a method for producing an organic electroluminescence element with which generation of ghosts can be suppressed while precision of the deposition pattern is maintained can be achieved.

BRIEF DESCRIPTION OF DRAWINGS

FIG. 1 is a schematic cross-sectional view of an organic EL display device equipped with organic EL elements fabricated by the method for producing an organic EL element according to Embodiment 1.

FIG. 2 is a schematic plan view of a structure within a display region of the organic EL display device illustrated in FIG. 1.

FIG. 26 is a schematic cross-sectional view of the vapor deposition apparatus according to Embodiment 4 taken in a direction perpendicular to the Y axis direction.

FIG. 27 is a schematic cross-sectional view of the vapor deposition apparatus according to Embodiment 4 taken in a direction perpendicular to the Y axis direction.

DESCRIPTION OF EMBODIMENTS

In the description below, the embodiment of the invention is described in further detail by using embodiments with reference to the drawings; however, the embodiment of the invention is not limited to these embodiments.

In the description of the embodiments below, the Cartesian coordinate in which the X axis and the Y axis lie in a horizontal plane and the Z axis is oriented in a vertical direction is used where appropriate. In the embodiments below, the X axis direction, the Y axis direction, and the Z axis direction respectively correspond to a second direction, a first direction, and a third direction in a mask according to the embodiment of the invention and a vapor deposition apparatus according to the embodiment of the invention.

Embodiment 1

In this embodiment, a method for producing a bottom-emission-type, RGB full-color-display organic EL element with which light is output from the TFT substrate side, and an organic EL display device equipped with an organic EL element fabricated by this production method are mainly described; however, this embodiment is also applicable to methods for producing other types of organic EL elements.

Figure 3:
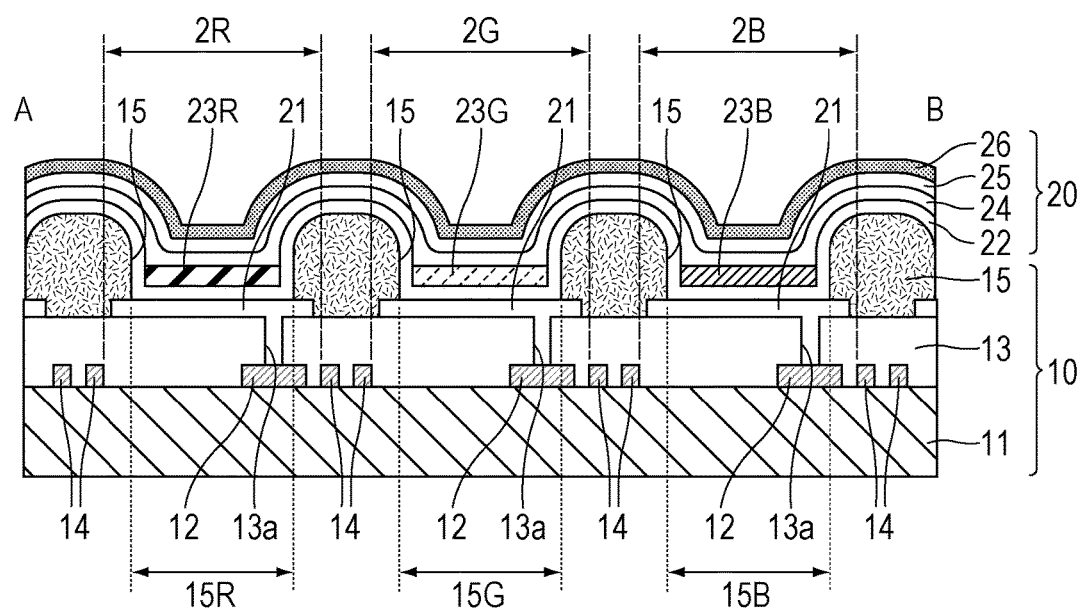
FIG. 3 is a schematic cross-sectional view of a structure of a TFT substrate of the organic EL display device illustrated in FIG. 1 and is taken along line A-B in FIG. 2.

First, the overall structure of the organic EL display device according to this embodiment is described. FIG. 1 is a schematic cross-sectional view of an organic EL display device equipped with organic EL elements fabricated by the method for producing an organic EL element according to Embodiment 1. FIG. 2 is a schematic plan view of a structure within a display region of the organic EL display device illustrated in FIG. 1. FIG. 3 is a schematic cross-sectional view of a structure of a TFT substrate of the organic EL display device illustrated in FIG. 1 and is taken along line A-B in FIG. 2.

As illustrated in FIG. 1, an organic EL display device 1 according to this embodiment includes a TFT substrate 10 that includes TFTs 12 (refer to FIG. 3), organic EL elements 20 disposed on the TFT substrate 10 and coupled to the TFTs 12, an adhesive layer 30 formed to have a frame shape that surrounds the organic EL elements 20, and a sealing substrate 40 arranged to cover the organic EL elements 20. The adhesive layer 30 bonds the peripheral portion of the TFT substrate 10 and the peripheral portion of the sealing substrate 40 to each other.

By bonding the TFT substrate 10 on which the organic EL elements 20 are stacked to the sealing substrate 40 with the adhesive layer 30, the organic EL elements 20 are sealed between a pair of substrates 10 and 40. In this manner, penetration of oxygen and moisture from outside into the organic EL elements 20 is prevented.

As illustrated in FIG. 3, the TFT substrate 10 includes a transparent insulating substrate 11, such as a glass substrate for example, as a supporting substrate. As illustrated in FIG. 2, multiple wires 14 are formed on the insulating substrate 11 and the wires 14 include multiple gate lines provided in a horizontal (lengthwise) direction and multiple signal lines that are provided in a vertical (width) direction and intersect the gate lines. A gate line driving circuit (not illustrated) that drives the gate lines is connected to the gate lines and a signal line driving circuit (not illustrated) that drives the signal lines is connected to the signal lines.

The organic EL display device 1 is an RGB full-color-display active-matrix-type display apparatus and each of the regions defined by the wires 14 includes a subpixel (dot) 2R, 2G, or 2B of red (R), green (G), or blue (B). The subpixels 2R, 2G, and 2B are aligned into a matrix. In the subpixels 2R, 2G, and 2B of respective colors, organic EL elements 20 of the corresponding colors and the emission regions are formed.

The red, green, and blue subpixels 2R, 2G, and 2B respectively emit red light, green light, and blue light, and three subpixels 2R, 2G, and 2B constitute one pixel 2.

Openings 15R, 15G, and 15B are respectively formed in the subpixels 2R, 2G, and 2B, and the openings 15R, 15G, and 15B are respectively covered with red, green, and blue emission layers 23R, 23G, and 23B. The emission layers 23R, 23G, and 23B are formed in a stripe shape in a vertical (lengthwise) direction. The patterns of the emission layers 23R, 23G, and 23B are formed by performing vapor deposition for each color. The openings 15R, 15G, and 15B are described later.

In each of the subpixels 2R, 2G, and 2B, a TFT 12 connected to a first electrode 21 of an organic EL element 20 is provided. The emission intensities of the subpixels 2R, 2G, and 2B are determined by scanning and selection using the wires 14 and the TFTs 12. As such, the organic EL display device 1 displays images by causing selected organic EL elements 20 of respective colors to emit light at a desired luminance by using the TFTs 12.

Next, the structures of the TFT substrate 10 and the organic EL element 20 are described in detail. First, the TFT substrate 10 is described.

As illustrated in FIG. 3, the TFT substrate 10 includes TFTs 12 (switching elements) and wires 14 formed on the insulating substrate 11, an interlayer film (interlayer insulating film or planarizing film) 13 covering them, and an edge cover 15, which is an insulating layer formed on the interlayer film 13.

The TFTs 12 are provided to correspond to the subpixels 2R, 2G, and 2B. Since the structure of the TFTs 12 may be typical one, illustration and descriptions of each layer of the TFT 12 are omitted.

The interlayer film 13 is formed on the insulating substrate 11 and throughout the entire region of the insulating substrate 11. The first electrodes 21 of the organic EL elements 20 are formed on the interlayer film 13. Contact holes 13a that electrically couple the first electrodes 21 to the TFTs 12 are formed in the interlayer film 13. In this manner, the TFTs 12 are electrically coupled to the organic EL elements 20 through the contact holes 13a.

The edge cover 15 is formed to prevent short-circuiting between the first electrode 21 and a second electrode 26 of the organic EL element 20 due to thinning of an organic EL layer at an end portion of the first electrode 21 or occurrence of electric field concentration. Thus, the edge cover 15 is formed so as to partly cover the end portion of the first electrode 21.

The openings 15R, 15G, and 15B are formed in the edge cover 15. The openings 15R, 15G, and 15B in the edge cover 15 form emission regions of the subpixels 2R, 2G, and 2B. In other words, the subpixels 2R, 2G, and 2B are partitioned by the edge cover 15 having an insulating property. The edge cover 15 also serves as an element isolation film.

Next, the organic EL element 20 is described.

The organic EL element 20 is a light-emitting element that can emit high-luminance light by DC driving and includes a first electrode 21, organic EL layers, and a second electrode 26, which are stacked in that order.

The first electrode 21 is a layer that has a function of injecting (supplying) holes to the organic EL layers. The first electrode 21 is coupled to the TFT 12 through the contact hole 13a, as described above.

As illustrated in FIG. 3, organic EL layers, namely, a hole transport and injection layer 22, emission layers 23R, 23G, and 23B, an electron transport layer 24, and an electron injection layer 25, are stacked between the first electrode 21 and the second electrode 26 in that order from the first electrode 21 side.

This order of stacking is when the first electrode 21 functions as an anode and the second electrode 26 functions as a cathode. The order of stacking organic EL layers is reversed when the first electrode 21 functions as a cathode and the second electrode 26 functions as an anode.

The hole injection layer is a layer that has a function of increasing the efficiency of injecting holes into the emission layers 23R, 23G, and 23B. The hole transport layer is a layer that has a function of increasing the efficiency of transporting holes into the emission layers 23R, 23G, and 23B. The hole transport and injection layer 22 is uniformly formed on the entire surface of the display region of the TFT substrate 10 so as to cover the first electrodes 21 and the edge cover 15.

In this embodiment, as described above, an example in which the hole transport and injection layer 22 prepared by integrating a hole injection layer and a hole transportation layer is provided as the hole injection layer and the hole transport layer is described. However, this embodiment is not limited to such a case. The hole injection layer and the hole transport layer may be formed as layers independent from each other.

The emission layers 23R, 23G, and 23B are formed on the hole transport and injection layer 22 so that they cover the openings 15R, 15G, and 15B of the edge cover 15 and correspond to the subpixels 2R, 2G, and 2B.

Each of the emission layers 23R, 23G, and 23B is a layer that has a function of outputting light by recombining a hole injected from the first electrode 21 side and an electron injected from the second electrode 26 side. Each of the emission layers 23R, 23G, and 23B is formed of a material having high emission efficiency, such as a low-molecular-weight fluorescent pigment or a metal complex.

The electron transport layer 24 is a layer that has a function of increasing the efficiency of transporting electrons from the second electrode 26 to each of the emission layers 23R, 23G, and 23B. The electron injection layer 25 is a layer that has a function of increasing the efficiency of injecting electrons from the second electrode 26 into each of the emission layers 23R, 23G, and 23B.

The electron transport layer 24 is uniformly formed on the entire surface of the display region of the TFT substrate 10 so as to cover the emission layers 23R, 23G, and 23B and the hole transport and injection layer 22. The electron injection layer 25 is uniformly formed on the entire surface of the display region of the TFT substrate 10 so as to cover the electron transport layer 24.

The electron transport layer 24 and the electron injection layer 25 may be formed as layers independent from each other as described above or may be integrated with each other. In other words, the organic EL display device 1 may include an electron injection layer also serving as an electron transport layer instead of the electron transport layer 24 and the electron injection layer 25.

The second electrode 26 is a layer that has a function of injecting electrons into the organic EL layers. The second electrode 26 is uniformly formed on the entire surface of the display region of the TFT substrate 10 so as to cover the electron injection layer 25.

Organic layers other than the emission layers 23R, 23G, and 23B are optional organic EL layers and may be formed as needed depending on the properties required for the organic EL element 20. If needed, a carrier blocking layer may be added as an organic EL layer. For example, a hole blocking layer may be added between the electron transport layer 24 and the emission layers 23R, 23G, and 23B so as to serve as a carrier blocking layer; in this manner, less holes reach the electron transport layer 24 and the emission efficiency can be improved.

For examples, layer structures described in (1) to (8) below can be employed as the structure of the organic EL element 20.
(1) first electrode/emission layer/second electrode
(2) first electrode/hole transport layer/emission layer/electron transport layer/second electrode
(3) first electrode/hole transport layer/emission layer/hole blocking layer/electron transport layer/second electrode
(4) first electrode/hole transport layer/emission layer/hole blocking layer/electron transport layer/electron injection layer/second electrode
(5) first electrode/hole injection layer/hole transport layer/emission layer/electron transport layer/electron injection layer/second electrode
(6) first electrode/hole injection layer/hole transport layer/emission layer/hole blocking layer/electron transport layer/second electrode
(7) first electrode/hole injection layer/hole transport layer/emission layer/hole blocking layer/electron transport layer/electron injection layer/second electrode
(8) first electrode/hole injection layer/hole transport layer/electron blocking layer (carrier blocking layer)/emission layer/hole blocking layer/electron transport layer/electron injection layer/second electrode
As described above, the hole injection layer and the hole transport layer may be integrated. The electron transport layer and the electron injection layer may be integrated.

The structure of the organic EL element 20 is not particularly limited to the layer structures of (1) to (8) above and a desired layer structure can be employed depending on the properties required for the organic EL element 20.

Next, a method for producing the organic EL display device 1 is described.

Figure 4:
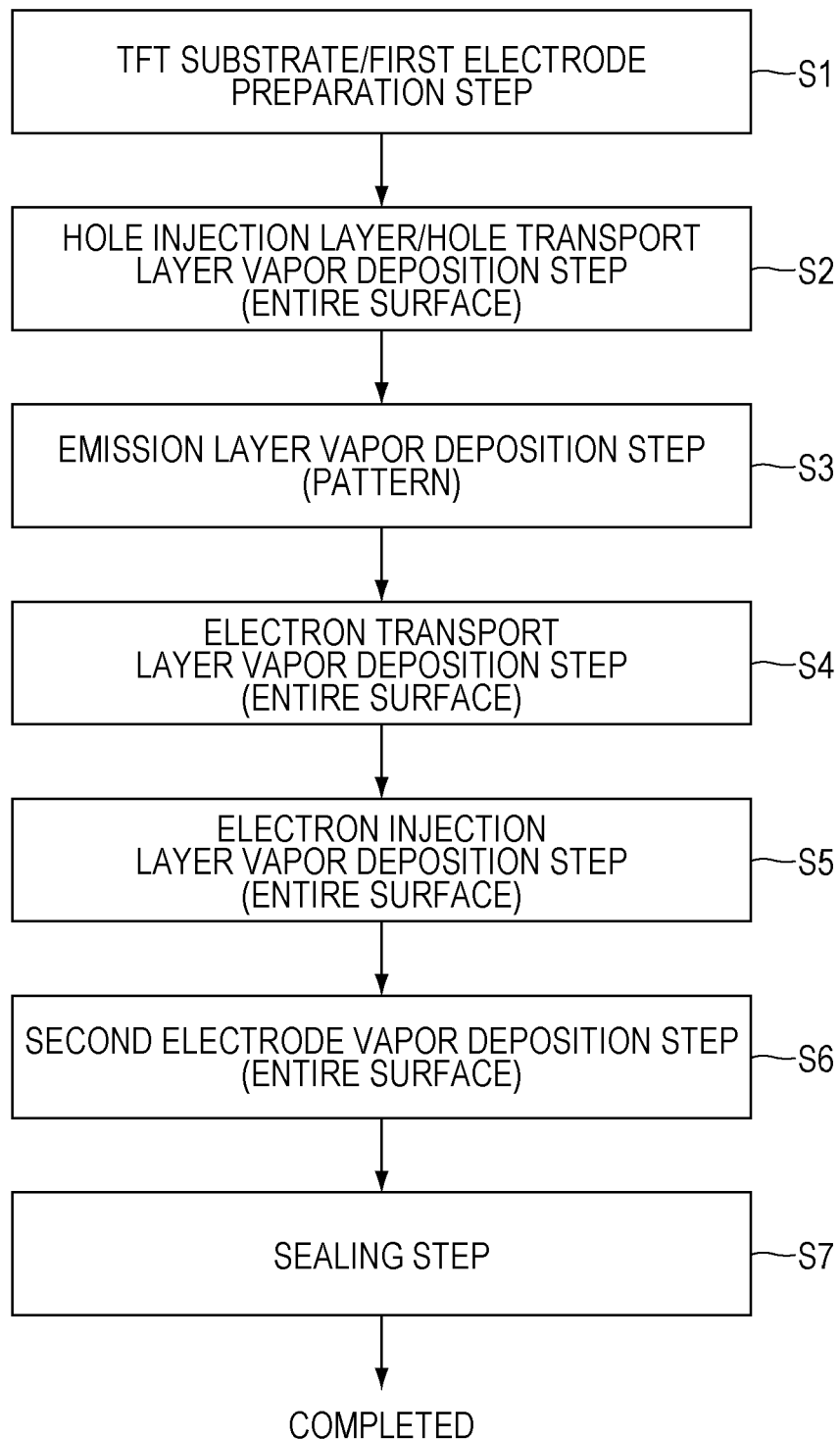
FIG. 4 is a flowchart for describing production steps of producing an organic EL display device according to Embodiment 1.

FIG. 4 is a flowchart for describing production steps of producing an organic EL display device according to Embodiment 1.

As illustrated in FIG. 4, a method for producing an organic EL display device according to this embodiment includes, for example, a TFT substrate/first electrode preparation step S1, a hole injection layer/hole transport layer vapor deposition step S2, an emission layer vapor deposition step S3, an electron transport layer vapor deposition step S4, an electron injection layer vapor deposition step S5, a second electrode vapor deposition step S6, and a sealing step S7.

Steps of producing the respective structural elements described with reference to FIGS. 1 to 3 are described below according to the flowchart of FIG. 4. It should be understood that the size, material, shape, etc., of the structural elements described in this embodiment are merely examples and do not limit the interpretation of the scope of the embodiment of the invention.

Furthermore, as mentioned above, the order of stacking described in this embodiment is the one when the first electrode 21 serves as an anode and the second electrode 26 serves as a cathode; conversely, when the first electrode 21 serves as a cathode and the second electrode 26 serves as an anode, the order of stacking the organic EL layers is reversed. Similarly, the materials constituting the first electrode 21 and the second electrode 26 are also reversed.

First, as illustrated in FIG. 3, a photosensitive resin is applied to the insulating substrate 11, on which the TFTs 12, the wires 14, etc., are formed, by a typical method and patterning is performed by a photolithographic technique so as to form an interlayer film 13 on the insulating substrate 11.

An example of the insulating substrate 11 is a glass or plastic substrate having a thickness of 0.7 to 1.1 mm, a length (lengthwise length) of 400 to 500 mm in the Y axis direction, and a length of 300 to 400 mm in the X axis direction (widthwise length).

A resin such as an acrylic resin or a polyimide resin can be used as the material for the interlayer film 13. Examples of the acrylic resin include OPTMER Series produced by JSR Corporation. Examples of the polyimide resin include Photoneece Series produced by Toray Industries, Inc. However, polyimide resins are usually not transparent and are colored. Thus, when a bottom-emission-type organic EL display device is produced as the organic EL display device 1 as illustrated in FIG. 3, a transparent resin such as an acrylic resin is more preferably used as the interlayer film 13.

The thickness of the interlayer film 13 may be any thickness as long as the level differences produced by the TFTs 12 are filled and the surface of the interlayer film 13 is planarized. For example, the thickness may be about 2 µm.

Next, contact holes 13a for electrically coupling the first electrodes 21 to the TFTs 12 are formed in the interlayer film 13.

Next, for example, an indium tin oxide (ITO) film serving as a conductive film (electrode film) is deposited to a thickness of 100 nm by a sputtering method or the like.

A photoresist is then applied to the ITO film, the photoresist is patterned by using a photolithographic technique, and then the ITO film is etched by using ferric chloride as an etching solution. Subsequently, the photoresist is stripped with a resist stripping solution and the substrate is washed. As a result, the first electrodes 21 are formed into a matrix on the interlayer film 13.

Examples of the conductive film material used for the first electrode 21 include transparent conductive materials such as ITO, indium zinc oxide (IZO), and gallium-doped zinc oxide (GZO), and metal materials such as gold (Au), nickel (Ni), and platinum (Pt).

As the method for stacking the conductive film, a vacuum vapor deposition method, a chemical vapor deposition (CVD) method, a plasma CVD method, a printing method, or the like can be employed as well as the sputtering method.

The thickness of the first electrode 21 is not particularly limited and may be, for example, 100 nm, as described above.

Next, the edge cover 15 is formed to, for example, a thickness of about 1 µm by the same method as that for the interlayer film 13. The material for the edge cover 15 may be the same insulating material as that for the interlayer film 13.

Through the above-described step, the TFT substrate 10 and the first electrodes 21 are produced (S1).

Next, the TFT substrate 10 that has undergone the above-described step is subjected to low-pressure baking for dehydration and an oxygen plasma treatment for washing the surfaces of the first electrodes 21.

Next, a hole injection layer and a hole transport layer (in this embodiment, the hole injection and transport layer 22) is vapor-deposited onto the TFT substrate 10 by using a typical vapor deposition apparatus so as to cover the entire surface of the display region of the TFT substrate 10 (S2).

Specifically, an open mask having openings corresponding to the entire surface of the display region is aligned with the TFT substrate 10 and then closely bonded. While rotating the TFT substrate 10 and the open mask together, vapor deposition particles travelling from the vapor deposition source are uniformly deposited on the entire surface of the display region through the openings of the open mask.

Performing vapor deposition on the entire surface of the display region means that vapor deposition is performed continuously over spaces between adjacent subpixels of different colors.

Examples of the material for the hole injection layer and the hole transport layer include benzine, styrylamine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, and derivatives thereof; polysilane compounds; vinylcarbazole compounds; and heterocyclic conjugated monomers, oligomers, or polymers such as thiophene compounds and aniline compounds.

The hole injection layer and the hole transport layer may be integrated as described above or may be formed as independent layers. The thickness of each layer is, for example, 10 to 100 nm.

When the hole transport and injection layer 22 is formed as the hole injection layer and the hole transport layer, for example, 4,4'-bis[N-(1-naphthyl)-N-phenylamino]biphenyl (α-NPD) can be used as the material for the hole transport and injection layer 22. The thickness of the hole transport and injection layer 22 can be, for example, 30 nm.

Next, the emission layers 23R, 23G, and 23B corresponding to the subpixels 2R, 2G, and 2B are separately formed (pattern formation) on the hole transport and injection layer 22 so as to cover the openings 15R, 15G, and 15B of the edge cover 15 (S3).

As described above, a material having high emission efficiency, such as a low-molecular-weight fluorescent pigment or a metal complex, is used for the emission layers 23R, 23G, and 23B.

Examples of the material for the emission layers 23R, 23G, and 23B include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, and derivatives thereof; tris(8-quinolinolato) aluminum complex; bis(benzoquinolinolato)beryllium complex; tri(dibenzoylmethyl)phenanthroline europium complex; and ditoluylvinylbiphenyl.

The thickness of each of the emission layers 23R, 23G, and 23B is, for example, 10 to 100 nm.

The production method according to the embodiment of the invention is particularly suitable for forming such emission layers 23R, 23G, and 23B.

A method forming patterns of the emission layers 23R, 23G, and 23B by the production method according to the embodiment of the invention is described in detail later.

Next, an electron transport layer 24 is vapor-deposited on the entire surface of the display region of the TFT substrate 10 by the same method as in the hole injection layer/hole transport layer vapor deposition step S2 so as to cover the hole transport and injection layer 22 and the emission layers 23R, 23G, and 23B (S4).

Subsequently, an electron injection layer 25 is vapor-deposited on the entire surface of the display region of the TFT substrate 10 by the same method as in the hole injection layer/hole transport layer vapor deposition step S2 so as to cover the electron transport layer 24 (S5).

Examples of the material for the electron transport layer 24 and the electron injection layer 25 include quinoline, perylene, phenanthroline, bisstyryl, pyrazine, triazole, oxazole, oxadiazole, fluorenone, and derivatives and metal complexes thereof; and lithium fluoride (LiF).

More specifically, examples include $Alq_3$ (tris(8-hydroxyquinoline)aluminum), anthracene, naphthalene, phenanthrene, pyrene, anthracene, perylene, butadiene, coumarin, acridine, stilbene, 1,10-phenanthroline, and derivatives and metal complexes thereof; and LiF.

As described above, the electron transport layer 24 and the electron injection layer 25 may be integrated or may be formed as independent layers. The thickness of each layer is, for example, 1 to 100 nm and preferably 10 to 100 nm. The total thickness of the electron transport layer 24 and the electron injection layer 25 is, for example, 20 to 200 nm.

Typically, $Alq_3$ is used as the material for the electron transport layer 24 and LiF is used as the material for the electron injection layer 25. For example, the thickness of the electron transport layer 24 is 30 nm and the thickness of the electron injection layer 25 is 1 nm.

Next, a second electrode 26 is vapor-deposited on the entire surface of the display region of the TFT substrate 10 by the same method as that in the hole injection layer/hole transport layer vapor deposition step (S2) so as to cover the electron injection layer 25 (S6). As a result, organic EL elements 20 that include organic EL layers, first electrodes 21, and a second electrode 26 are formed on the TFT substrate 10.

The material for the second electrode 26 (electrode material) is preferably a metal or the like that has a small work function. Examples of such an electrode material include magnesium alloys (MgAg etc.), aluminum alloys (AlLi, AlCa, AlMg, etc.), and metal calcium. The thickness of the second electrode 26 is, for example 50 to 100 nm.

Typically, the second electrode 26 is formed of an aluminum thin film having a thickness of 50 nm.

Then, as illustrated in FIG. 1, the TFT substrate 10 on which the organic EL elements 20 are formed and the sealing substrate 40 are bonded to each other with an adhesive layer 30 so as to seal the organic EL elements 20.

For example, a sealing resin, frit glass, or the like can be used as the material for the adhesive layer 30. For example, an insulating substrate, such as a glass or plastic substrate, having a thickness of 0.4 to 1.1 mm is used as the sealing substrate 40. Alternatively, an engraved glass may be used as the sealing substrate 40.

The lengthwise length and the widthwise length of the sealing substrate 40 may be appropriately adjusted according to the desired size of the organic EL display device 1. An insulating substrate having substantially the same size as the insulating substrate 11 of the TFT substrate 10 can be used as the sealing substrate 40 and after sealing of the organic EL elements 20, the substrate may be cut according to the desired size for the organic EL display device 1.

The method for sealing the organic EL elements 20 is not particularly limited to the above-mentioned method and any other sealing method can be employed. An example of other sealing methods is a method of filling a gap between the TFT substrate 10 and the sealing substrate 40 with a resin.

In order to prevent penetration of oxygen and moisture from outside into the organic EL elements 20, a protective film (not illustrated) may be provided on the second electrode 26 so as to cover the second electrode 26.

The protective film can be formed of an insulating or conductive material. Examples of such a material include silicon nitride and silicon oxide. The thickness of the protective film is, for example, 100 to 1000 nm.

As a result of the steps described above, preparation of the organic EL display device 1 is completed.

In this organic EL display device 1, when the TFTs 12 are turned ON in response to input of a signal from the wires 14, holes are injected from the first electrodes 21 into the organic EL layers. Meanwhile, electrons are injected from the second electrode 26 into the organic EL layers and the holes and electrons recombine within the emission layers 23R, 23G, and 23B. Energy of recombination of the holes and electrons excites the light-emitting material and light is emitted as the excited state returns to the ground state. By controlling the luminance of the emission from the subpixels 2R, 2G, and 2B, a particular image is displayed.

Next, the emission layer vapor deposition step S3, a mask for a vapor deposition apparatus according to this embodiment, and a vapor deposition apparatus according to this embodiment are described.

The mask for a vapor deposition apparatus according to this embodiment is a mask used with a vapor deposition apparatus according to this embodiment, in which vapor deposition is performed while relatively moving the substrate with respect to a vapor deposition unit that includes a mask, a limit plate, and a vapor deposition source in that order from the substrate side. First, the mask for a vapor deposition apparatus according to this embodiment is described in detail, and the vapor deposition apparatus according to this embodiment is described later.

Figure 5:
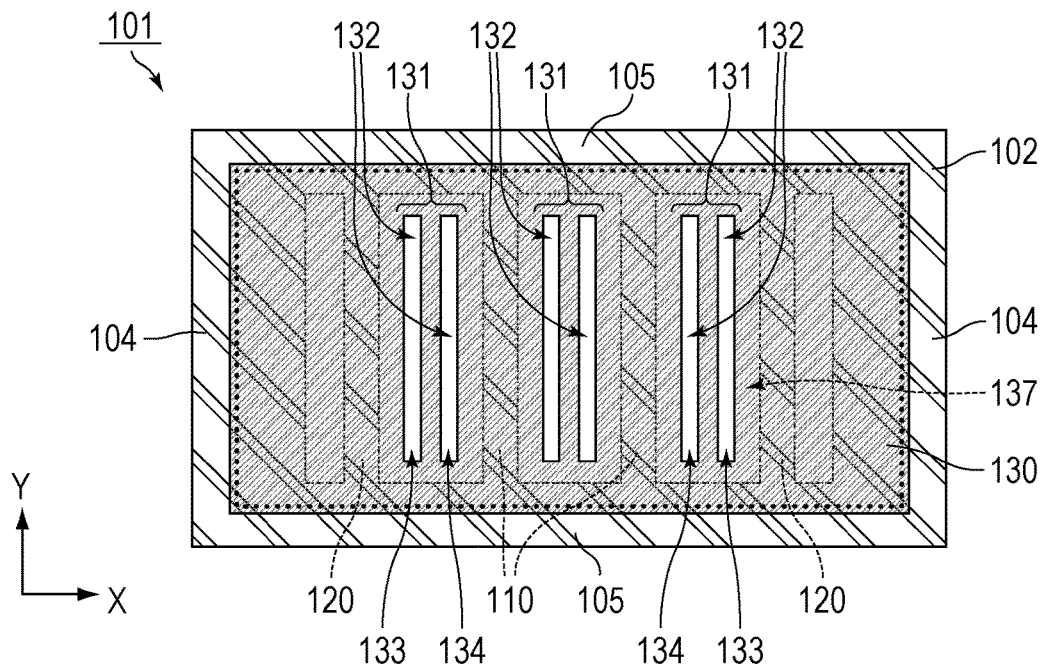
FIG. 5 is a schematic plan view of a mask for a vapor deposition apparatus according to Embodiment 1.
Figure 6:
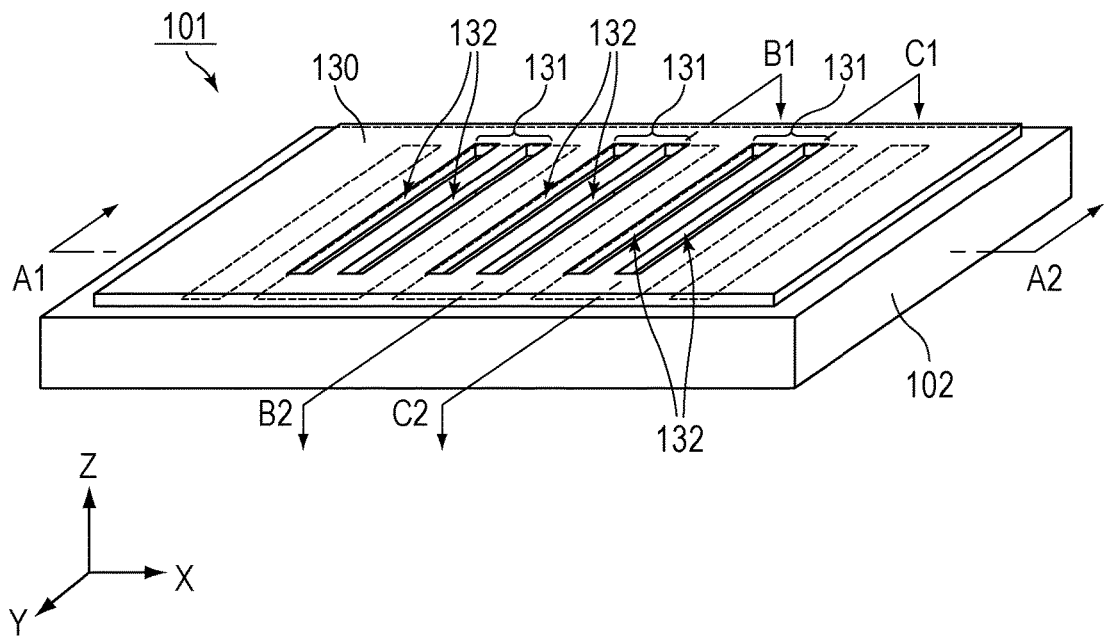
FIG. 6 is a schematic perspective view of the mask for a vapor deposition apparatus according to Embodiment 1.
Figure 7:
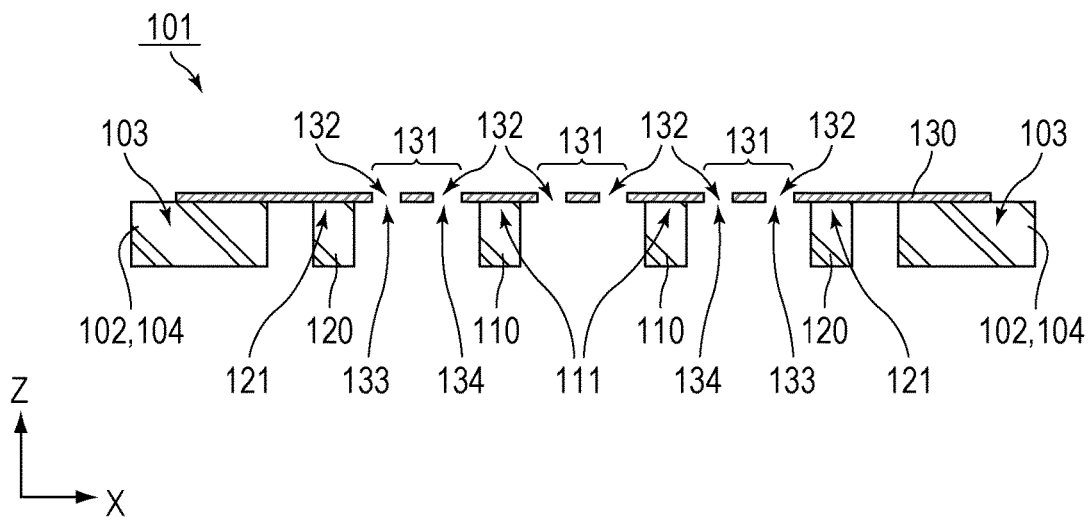
FIG. 7 is a schematic cross-sectional view of the mask for a vapor deposition apparatus according to Embodiment 1 taken along line A1-A2 in FIG. 6.
Figure 8:
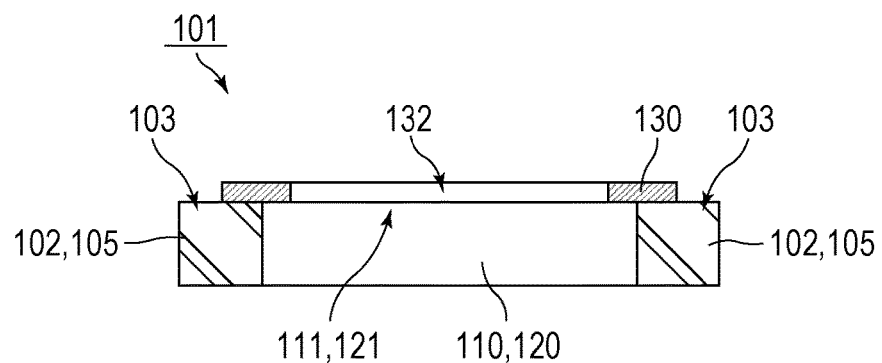
FIG. 8 is a schematic cross-sectional view of the mask for a vapor deposition apparatus according to Embodiment 1 taken along line B1-B2 or line C1-C2 in FIG. 6.

FIG. 5 is a schematic plan view of a mask for a vapor deposition apparatus according to Embodiment 1. FIG. 6 is a schematic perspective view of the mask for a vapor deposition apparatus according to Embodiment 1. FIG. 7 is a schematic cross-sectional view of the mask for a vapor deposition apparatus according to Embodiment 1 taken along line A1-A2 in FIG. 6. FIG. 8 is a schematic cross-sectional view of the mask for a vapor deposition apparatus according to Embodiment 1 taken along line B1-B2 or line C1-C2 in FIG. 6.

As illustrated in FIGS. 5 to 8, a mask 101 for a vapor deposition apparatus includes an outer frame 102, a plurality of first bars 110, two second bars 120, and a pattern forming portion 130.

The outer frame 102 is a frame member having an opening on the inner side and includes a pair of longitudinal (for example, rectangular parallelepiped) vertical frame portions 104 opposing each other and a pair of longitudinal (for example, rectangular parallelepiped) horizontal frame portions 105 opposing each other. The shape of the outer frame 102 as viewed along the Z axis direction is not particularly limited and may be appropriately set. For example, the shape may be rectangular.

The width of the outer frame 102 in the X axis direction is set to be larger than the width of the substrate in the X axis direction, and the width of the outer frame 102 in the Y axis direction is set to be smaller than the width of the substrate in the Y axis direction. However, the dimensions of other parts of the outer frame 102 (for example, the dimension in the Z axis direction and the width of the vertical frame portions 104 and the horizontal frame portions 105 in the transversal direction as viewed along the Z axis direction) are not particularly limited and may be set as desired. For example, the dimensions may be set to substantially the same dimensions as those of the mask frames employed in a typical scan vapor deposition method.

The first and second bars 110 and 120 are each longitudinal (for example, rectangular parallelepiped), provided on the inner side of the outer frame 102, and fixed to the outer frame 102. The bars 110 and 120 are installed between the pair of horizontal frame portions 105 along the Y axis direction (for example, parallel to the Y axis direction), and both ends of each bar are connected to the pair of horizontal frame portion 105. Through holes 137 are formed to be adjacent to the bars 110 and 112 in the X axis direction, and one of the second bars 120, the first bars 110, and the other of the second bars 120 are arranged in this order in the X axis direction at, for example, regular intervals.

The position (height) of upper portions (portions on the pattern forming portion 130 side) 111 of the first bars 110 in the Z axis direction and the position (height) of upper portions (potions on the pattern forming portion 130 side) 121 of the second bars 120 in the Z axis direction are substantially the same as the position (height) of an upper portion (portion on the pattern forming portion 130 side) 103 of the outer frame 102 in the Z axis direction. For example, surfaces of the upper portions 111 of the first bars 110, the surfaces of the upper portions 121 of the second bars 120, and the surface of the upper portion 103 of the outer frame 102 may be positioned within the same XY plane (a plane parallel to the X axis and the Y axis).

The dimensions of the first and second bars 110 and 120 are not particularly limited as long as the required stiffness can be secured and the deposition pattern can be formed at a desired position of a substrate 190 without clogging mask openings 132 described below, and can be set appropriately.

However, since the pattern forming portion 130 having mask opening 132 for pattern formation formed therein is disposed on top of the first and second bars 110 and 120 and the outer frame 102, the flatness of the first and second bars 110 and 120 and the outer frame 102 is preferably high. In view of this, the dimensions (thickness) of the bars 110 and 120 in the Z axis direction is preferably substantially the same as the dimension (thickness) of the outer frame 102 in the Z axis direction. Moreover, this also improves processability of the materials for the bars 110 and 120 and the outer frame 102.

When the pattern forming portion 130 is joined (for example, spot-welded) to the bars 110 and 120, the pattern of the mask opening 132 may deform if the strength of the bars 110 and 120 is low and an accurate pattern may not be formed on the substrate. Thus, in this case, assuming that the dimensions of the substrate are about 400 mm×500 mm, the width of each of the bars 110 and 120 in the transversal direction when viewed along the Z axis direction is empirically preferably 5 mm or more.

On the other hand, since the pattern forming portion 130 is fixed to the outer frame 102 while being put under tension, the width of the outer frame 102 in the transversal direction when viewed along the Z axis direction is preferably several times larger than the width of each of the bars 110 and 120 in the transversal direction when viewed along the Z axis direction.

The method for fixing the bars 110 and 120 to the outer frame 102 is not particularly limited; for example, the bars 110 and 120 and the outer frame 102 may be prepared separately and then the bars 110 and 120 may be joined, for example, spot-welded, to the outer frame 102. Then the bars 110 and 120 and the outer frame 102 may be polished so the pattern forming portion 130 side surfaces and the opposite surfaces have the desired parallelism and flatness. Alternatively, multiple through holes 137 may be formed in a thick plate and the partition walls between adjacent through holes 137 may be used as the bars 110 and 120. More specifically, for example, a rectangular parallelepiped material may be subjected to a drilling process or a cutting process and, if needed, a tapering process, and then at the final stage the bars 110 and 120 and the outer frame 102 may be polished so that the pattern forming portion 130 side surfaces and the opposite surfaces have the desired parallelism and flatness. According to this method, the bars 110 and 120 and the outer frame 102 can be formed simultaneously, and, compared to the method of joining the bars 110 and 120 to the outer frame 102, the bars 110 and 120 can be formed at higher precision. Thus, polishing for flattening and parallelizing can be performed at higher precision.

The number of first bars 110 is not particularly limited and may be appropriately set according to the pattern of the mask openings 132 described below. The number may be 1.

The pattern forming portion 130 has a flat plate shape in which an opening pattern is formed, and is disposed on the outer frame 102 and the bars 110 and 120 so as to cover the first and second bars 110 and 120. The pattern forming portion 130 covers the through holes 137 adjacent to the bars 110 and 120.

The pattern forming portion 130 is joined, for example, spot-welded, to the outer frame 102 while being put under tension. As a result, deflection of the pattern forming portion 130 due to its own weight is reduced. As illustrated in FIG. 5, the peripheral portion of the pattern forming portion 130 may be spot-welded to the outer frame 102. The spot-welded portion is indicated by dotted lines in FIG. 5.

The shape of the pattern forming portion 130 when viewed along the Z axis direction is not particularly limited and can be set appropriately. For example, the shape may be rectangular.

The dimension (thickness) of the pattern forming portion 130 in the Z axis direction is not particularly limited and can be set appropriately. For example, the dimension may be set to be substantially the same as the thickness of the pattern forming portion employed in a typical scan vapor deposition method.

Multiple opening groups 131 are formed in the pattern forming portion 130 and each of the opening groups 131 include multiple mask opening (through holes) 132 for pattern formation. The opening groups 131 may be formed to have patterns different from one another but are usually formed to have substantially the same pattern. In other words, the mask openings 132 included in the opening groups 131 are usually formed to have substantially the same pattern as each other.

The multiple opening groups 131 are disposed, for example, at regular intervals in the X axis direction. The distance between adjacent two opening groups 131 in the X axis direction is not particularly limited as long as it is larger than the width of the first bars 110 in the transversal direction when viewed along the Z axis direction, and can be set appropriately. For example, when the width of each of the first bars 110 in the transversal direction when viewed along the Z axis direction is 5 mm or more, the distance between the adjacent two opening groups 131 in the X axis direction is also set to 5 mm or more.

The distance between the adjacent two opening groups 131 in the X axis direction may be set to be larger than the width of each of the opening groups 131 in the X axis direction, namely, the distance, in the X axis direction, between two mask openings 132 positioned at both ends in the X axis direction in each of the opening groups 131. As a result, the flexibility of designing the vapor deposition apparatus equipped with a mask 101 can be improved. On the other hand, with such arrangement of the mask openings 132, the pattern cannot be formed on the entire vapor deposition region of the substrate by carrying out transportation of the substrate just once; however, it is possible to form the pattern on the entire vapor deposition region of the substrate by transporting the substrate two or more times while shifting the vapor deposition unit that includes the mask 101 in the X axis direction. The details thereof are described below.

In each of the opening groups 131, the mask openings 132 are disposed, for example, at regular intervals in the X axis direction. Each of the mask openings 132 is formed to have a longitudinal shape in the Y axis direction (for example, parallel to the Y axis direction). A stripe pattern (in other words, the emission layers 23R, 23G, and 23B) extending in the Y axis direction can be formed on the substrate through such mask openings 132 by causing vaporized materials to adhere to the substrate while transporting the substrate along the Y axis direction.

The pattern of the mask openings 132 formed in the pattern forming portion 130 is not limited and may be set appropriately as long as it is a pattern in which mask openings 132 each extending along the Y axis direction are disposed in the X axis direction and at least one first bar 110 can be disposed between adjacent two mask openings 132.

For example, the pitch of the mask openings 132 in each of the opening groups 131 is not particularly limited and can be set appropriately by geometric calculation on the basis of conditions such as the position of the pattern to be deposited, the relative positional relationship between the mask 101, the substrate, and the vapor deposition source in the vapor deposition apparatus, the thickness of the pattern forming portion 130, etc.

The dimension of each of the mask opening 132 in the X axis direction is not particularly limited and may be set appropriately by geometric calculation on the basis of conditions such as the position and width of the pattern to be deposited in the X axis direction, the relative positional relationship between the mask 101, the substrate, and the vapor deposition source in the vapor deposition apparatus, the thickness of the pattern forming portion 130, etc.

The dimension of each of the mask openings 132 in the Y direction is not particularly limited and may be set appropriately by geometric calculation on the basis of conditions such as the vapor deposition rate, the transportation speed of the substrate, the thickness and the position in the X axis direction of the pattern to be deposited, the relative positional relationship between the mask 101, the substrate, and the vapor deposition source in the vapor deposition apparatus, the thickness of the pattern forming portion 130, etc.

The number of the mask openings 132 included in each of the opening groups 131 is not particularly limited and can be independently set appropriately.

The shape of each of the mask openings 132 when viewed along the Z axis direction is not particularly limited and each of the mask openings 132 may be a slit-shaped opening extending in the Y axis direction, for example. Each of the mask openings 132 may be divided into multiple parts (mask opening portions) and these mask opening portions may be disposed along the Y axis direction. In other words, each of the mask openings 132 may be a mask opening row that includes multiple mask opening portions disposed along the Y axis direction.

Hereinafter, two mask openings positioned at the endmost positions in the X axis direction may be referred to as "endmost openings 133" and two mask openings positioned next to (on the inner side of) the endmost openings 133 may be referred to as "adjacent openings 134".

As illustrated in FIG. 5, when viewed along the Z axis direction, each of the first bars 110 is placed between two mask openings 132 adjacent in the X axis direction. As illustrated in FIG. 7, each of the first bars 110 is in contact with the pattern forming portion 130 between the two mask openings 132. The distance between these two mask openings 132 is not particularly limited as long as it is larger than the width of the first bar 110 in the transversal direction when viewed along the Z axis direction. The distance may be, for example, set to be larger than 5 mm.

As illustrated in FIG. 5, when viewed along the Z axis direction, each of the first bars 110 is placed between the mask opening 132 included in one of the two opening groups 131 adjacent in the X axis direction and the mask opening 132 included in the other of the two opening groups. The "two opening groups 131 adjacent in the X axis direction" refer to the two opening groups 131, a distance between which is set to be larger than the width of the first bar 110 in the transversal direction when viewed along the Z axis direction.

As illustrated in FIG. 5, when viewed along the Z axis direction, one second bar 120 is placed for each of the endmost openings 133 on the side opposite to the adjacent opening 134. In other words, when viewed along the Z axis direction, each of the endmost openings 133 is disposed between the second bar 120 and the adjacent opening 134. As illustrated in FIG. 7, each of the second bars 120 is in contact with a portion of the pattern forming portion 130 on the side opposite of the adjacent opening 134 of the endmost opening 133. The endmost openings 133 are respectively positioned at the endmost positions in the X axis direction among all the mask openings 132 formed in the pattern forming portion 130.

Figure 9:
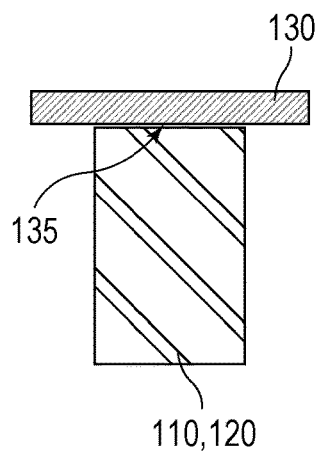
FIG. 9 is an enlarged schematic cross-sectional view of the mask for a vapor deposition apparatus according to Embodiment 1.
Figure 10:
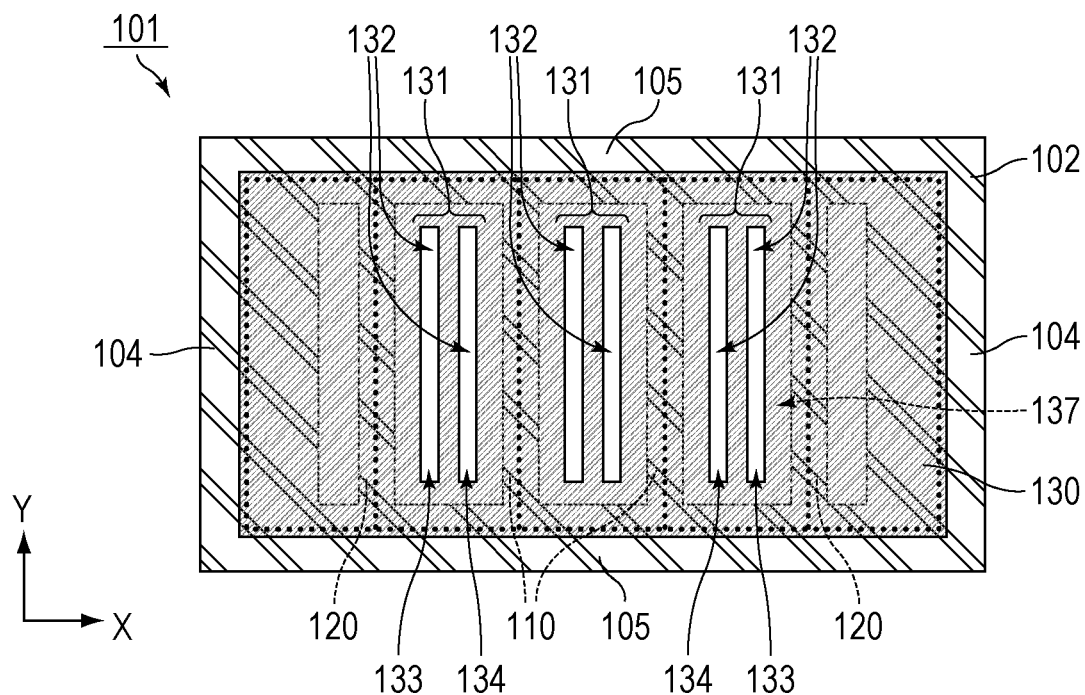
FIG. 10 is a schematic plan view of the mask for a vapor deposition apparatus according to Embodiment 1.
Figure 11:
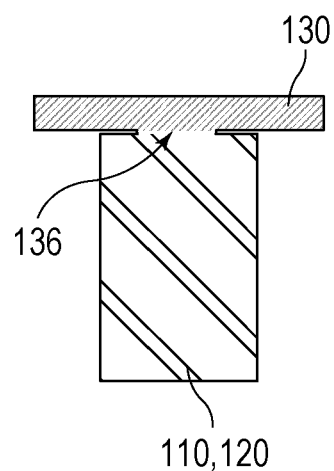
FIG. 11 is a schematic plan view of the mask for a vapor deposition apparatus according to Embodiment 1.

FIGS. 9 and 11 are enlarged schematic cross-sectional views of a mask for a vapor deposition apparatus according to Embodiment 1. FIG. 10 is a schematic plan view of the mask for a vapor deposition apparatus according to Embodiment 1. In FIG. 10, the spot-welded portions are indicated by dotted lines.

Each of the bars 110 and 120 may be simply in contact with the pattern forming portion 130 as illustrated in FIG. 7 or may be joined (for example, spot-welded) as illustrated in FIGS. 10 and 11. In either case, since the pattern forming portion 130 can be supported by the bars 110 and 120, deflection of the pattern forming portion 130 due to its own weight can be reduced.

In the former case, the portions to be joined are the same as those for typical masks for a vapor deposition apparatus. However, as illustrated in FIG. 9, there is a possibility that a minute gap 135 may be formed between the pattern forming portion 130 and the bars 110 and 120 due to flow of the vapor deposition particles and ultra-small strain in parts of the mask 101. This gap causes no problem in the typical vapor deposition but if the deposition rate is increased to a very high level, vapor deposition particles that pass through this gap may pose a problem.

In contrast, in the latter case, the bars 110 and 120 are integrated with the pattern forming portion 130 at a joined portion 136 and thus hardly any gap is formed between the pattern forming portion 130 and the bars 110 and 120. Thus there is an advantage that vapor deposition particles passing through this gap do not pose a problem even at a very high deposition rate.

The strength of the bars 110 and 120 is smaller than the strength of the outer frame 102 and the tension of the pattern forming portion 130 is supported by the outer frame 102. Thus, in the latter case also, joining of the pattern forming portion 130 to outer frame 102 is usually indispensable. Thus, in the latter case, the number of joined portions increases compared to the case of typical masks for a vapor deposition apparatus. However, joining the bars 110 and 120 to the pattern forming portion 130 is performed to eliminate the gap between these parts and thus the number of portions where the bars 110 and 120 are joined to the pattern forming portion 130 may be reduced.

The materials for the respective parts of the mask 101 are not particularly limited and may be selected appropriately. The materials are preferably materials having small thermal strain and invar materials (alloys produced by adding 36% by mass of nickel to iron, small amounts of Co may also be mixed) are preferable as the materials for the outer frame 102 and the first and second bars 110 and 120. When the thermal strain of the outer frame 102 and the bars 110 and 120 is high, the pattern of the mask openings 132 may deform during vapor deposition but the invar materials have a small thermal expansion coefficient and suppress generation of thermal strain in the outer frame 102 and the bars 110 and 120, thereby being able to suppress deformation of the pattern of the mask openings 132. From the same viewpoint, invar materials are also suitable as the material for the pattern forming portion 130. However, where the pattern precision need not be high, stainless steel alloys can be used. When the dimension (thickness) of the pattern forming portion 130 in the Z axis direction is to be extremely small, nickel (Ni) alloys with superior processability can be used.

As described above, the mask 101 for a vapor deposition apparatus according to this embodiment includes an outer frame 102, a first bar 110 disposed on the inner side of the outer frame 102 and fixed to the outer frame 102, and a pattern forming portion 130 disposed on the outer frame 102 and the first bar 110 and fixed to the outer frame 102. Multiple mask opening 132 for pattern formation are formed in the pattern forming portion 130, and each of the mask openings 132 is disposed along the Y axis direction (first direction). The mask openings 132 are arranged in the X axis direction (second direction) orthogonal to the Y axis direction (first direction). The first bar 110 is positioned between adjacent two mask openings 132 among the mask openings 132 when viewed along the Z axis direction (third direction) orthogonal to the Y axis direction (first direction) and the X axis direction (second direction), and is in contact with the pattern forming portion 130. According to the mask 101 of this embodiment, generation of ghosts can be suppressed while maintaining the precision of the deposition pattern.

In detail, the mask openings 132 are arranged in the X axis direction (second direction) orthogonal to the Y axis direction (first direction), and the first bar 110 is positioned between adjacent two mask openings 132 among the mask openings 132 when viewed along the Z axis direction (third direction) orthogonal to the Y axis direction (first direction) and the X axis direction (second direction) and in contact with the pattern forming portion 130. Therefore, the limit plate can be cause to contact the first bar 110 but not the pattern forming portion 130. Thus, the first bar 110 can be disposed between the limit plate and a portion of the pattern forming portion 130 between adjacent two mask openings 132 in the X axis direction and the gap between these components can be covered with the first bar 110. Thus, even when vapor deposition particles that have a large velocity component in the X axis direction and travel in an unexpected direction are generated due to scattering of the vapor deposition particles near the mask 101 and re-evaporation of the material adhering to the limit plate near the mask 101, movement of such vapor deposition particles can be effectively blocked by the first bar 110 and the limit plate. Thus, generation of ghosts can be suppressed.

Since the first bar 110 is disposed on the inner side of the outer frame 102 and fixed to the outer frame 102, the stiffness of the first bar 110 can be easily increased. Thus, even when the limit plate 180 is brought into contact with the first bar 110, deformation of the pattern forming portion 130 can be prevented. Thus, deterioration of the precision of the deposition pattern can be prevented.

Since the pattern forming portion 130 can be supported by not only the outer frame 102 but also the first bar 110, deflection of the pattern forming portion 130 by its own weight can be effectively reduced.

The mask 101 for a vapor deposition apparatus according to this embodiment includes a second bar 120 disposed on the inner side of the outer frame 102 and fixed to the outer frame 102. The pattern forming portion 130 is formed on the outer frame 102, the first bar 110, and the second bar 120. When, among the multiple mask openings 132, the mask opening positioned at one end in the X axis direction (second direction) is assumed to be an endmost opening 133 and the mask opening positioned next to the endmost opening 133 is assumed to be an adjacent opening 134, the second bar 120 is positioned on the side opposite of the adjacent opening 134 of the endmost opening 133 when viewed along the Z axis direction (third direction) and is in contact with the pattern forming portion 130.

As described above, when, among the multiple mask openings 132, the mask opening positioned at one end in the X axis direction (second direction) is assumed to be an endmost opening 133 and the mask opening positioned next to the endmost opening 133 is assumed to be an adjacent opening 134, the second bar 120 is positioned on the side opposite of the adjacent opening 134 of the endmost opening 133 when viewed along the Z axis direction (third direction) and is in contact with the pattern forming portion 130. Thus the limit plate can brought into contact the second bar 120 but not the pattern forming portion 130. Thus, the second bar 120 can be placed between the limit plate and a portion of the pattern forming portion 130 on the side opposite of the adjacent opening 134 of the endmost opening 133, and the region between these parts can be covered with the second bar 120. Thus, even when vapor deposition particles that have a large velocity component in the X axis direction and travel around from the side in the Y axis direction toward the pattern forming portion 130 are generated, movement of such vapor deposition particles can be effectively blocked by the second bar 120 and the limit plate. Thus, generation of ghosts can be more effectively suppressed.

Since the second bar 120 is disposed on the inner side of the outer frame 102 and fixed to the outer frame 102, the stiffness of the second bar 120 can be easily increased. Thus, even when the limit plate is in contact with the second bar 120, deformation of the pattern forming portion 130 can be prevented and thus the precision of the deposition pattern can be maintained.

Next, a vapor deposition apparatus according to this embodiment is described in detail.

Figure 12:
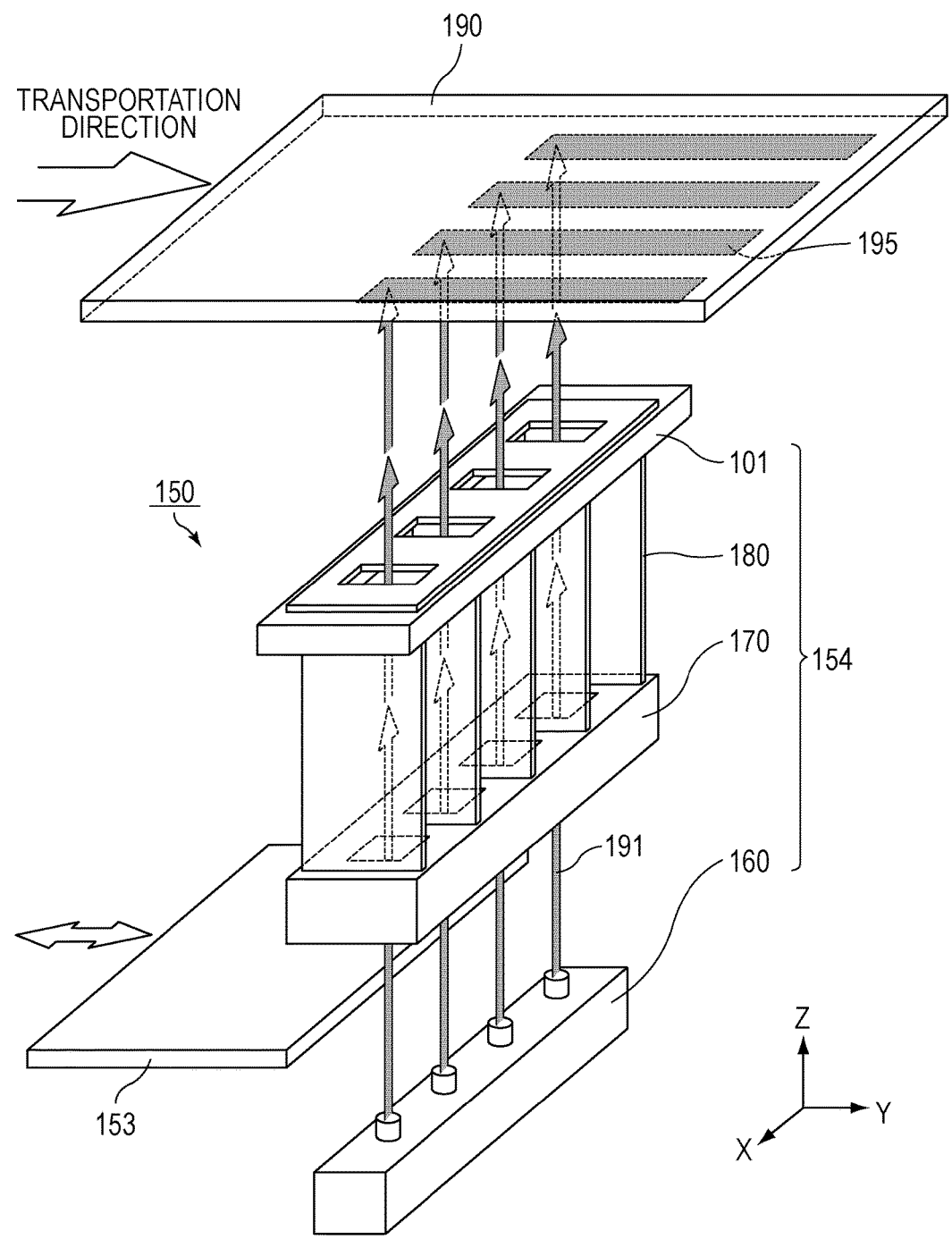
FIG. 12 is a schematic perspective view of a vapor deposition apparatus according to Embodiment 1.
Figure 13:
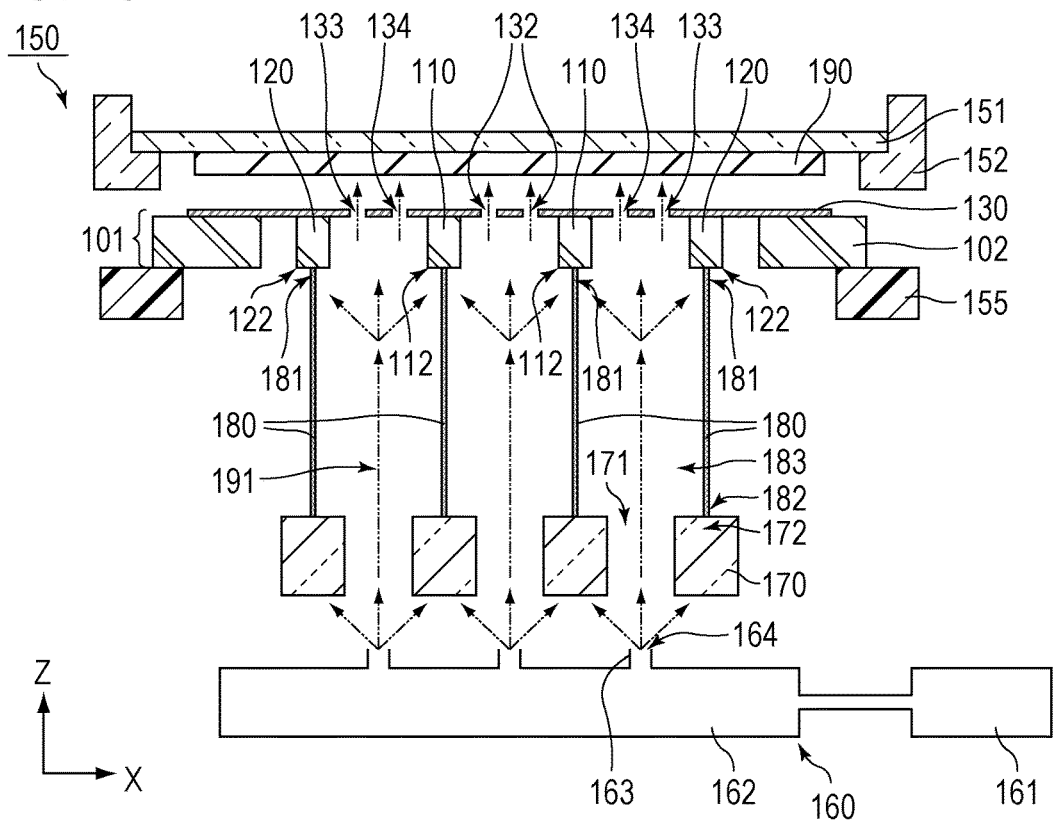
FIG. 13 is a schematic cross-sectional view of the vapor deposition apparatus according to Embodiment 1 taken in a direction perpendicular to a Y axis direction.
Figure 14:
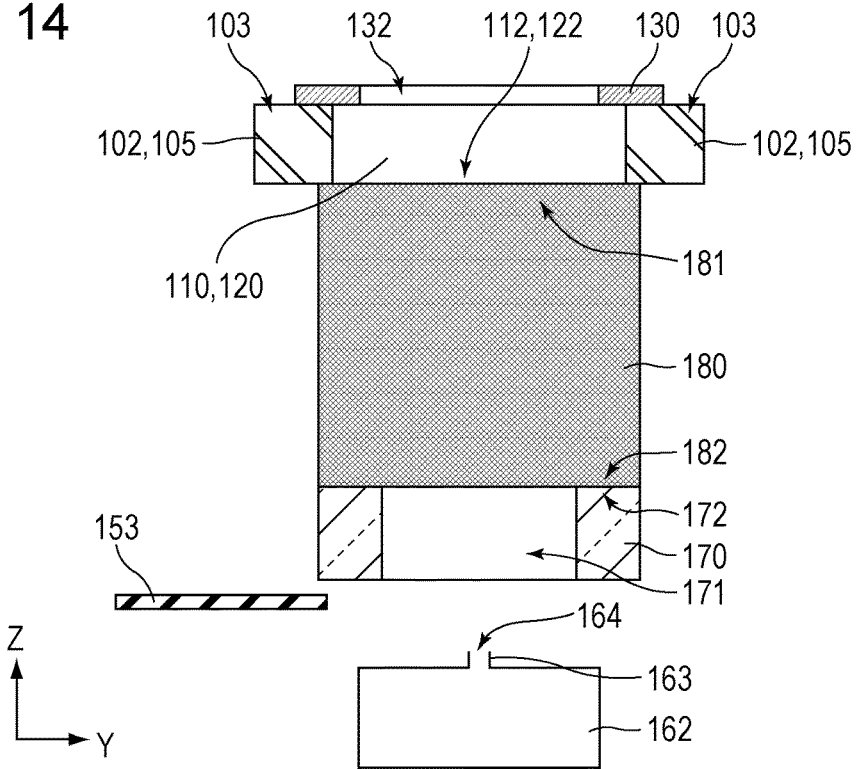
FIG. 14 is a schematic cross-sectional view of the vapor deposition apparatus according to Embodiment 1 taken in a direction perpendicular to an X axis direction.
Figure 15:
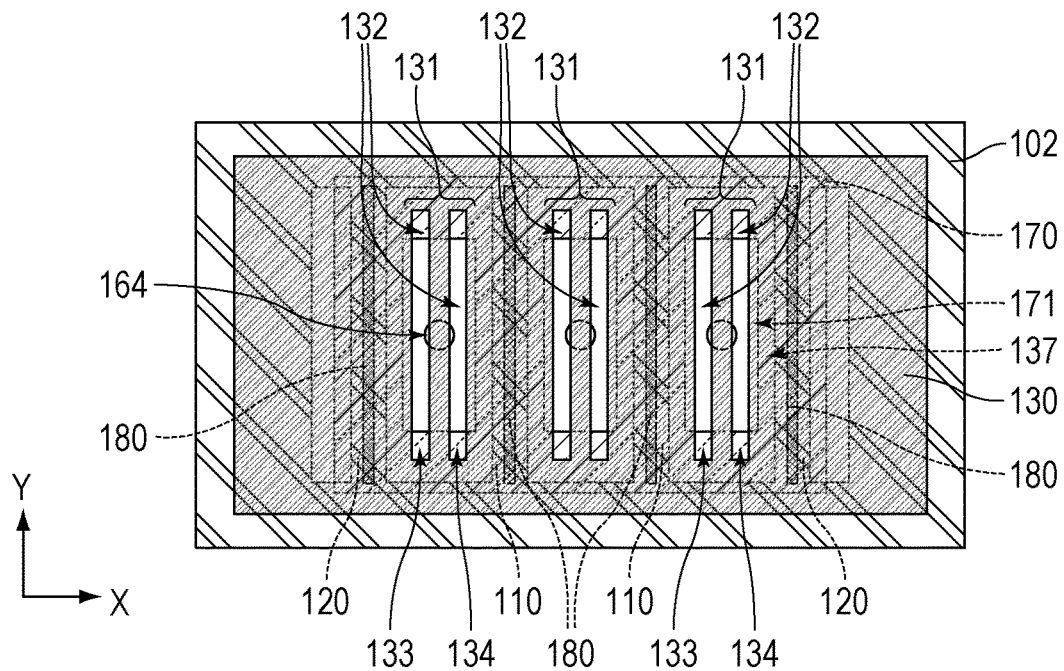
FIG. 15 is a schematic plan view of the vapor deposition apparatus according to Embodiment 1.

FIG. 12 is a schematic perspective view of a vapor deposition apparatus according to Embodiment 1. FIG. 13 is a schematic cross-sectional view of the vapor deposition apparatus according to Embodiment 1 and illustrates a section perpendicular to the Y axis direction. FIG. 14 is a schematic cross-sectional view of the vapor deposition apparatus of Embodiment 1 and illustrates a section perpendicular to the X axis direction. FIG. 15 is a schematic plan view of the vapor deposition apparatus according to Embodiment 1.

As illustrated in FIGS. 12 to 15, a vapor deposition apparatus 150 according to this embodiment includes a vacuum chamber (deposition chamber not illustrated), a vacuum pump (not illustrated) connected to the vacuum chamber, a substrate holder 151, a moving mechanism (transportation mechanism) 152, a shutter 153, an alignment means (not illustrated), a drive controller (not illustrated) for controlling driving of the vapor deposition apparatus 150, and a deposition unit 154. The deposition unit 154 includes a unit holder that includes a vapor deposition source 160, an aperture 170, multiple limit plates 180, a mask 101, and a mask holder 155 that supports the mask 101; and a sliding device (not illustrated). A substrate 190 onto which vacuum vapor deposition (film formation) is carried out is transported above the mask 101. The mask 101, the limit plate 180, the aperture 170, and the vapor deposition source 160 are arranged in this order from the substrate 190 side.

The vacuum chamber is a container that defines a space where vacuum vapor deposition is carried out. The deposition unit 154, the substrate holder 151, at least part of the moving mechanism 152, the shutter 153, and at least part of the alignment means are disposed inside the vacuum chamber. In conducting vapor deposition, the vacuum chamber is evacuated (vacuumed) with the vacuum pump, and the interior of the vacuum chamber is maintained in a high vacuum state (for example, ultimate pressure: $1 \times 10^{-2}$ Pa or less) at least during the period of vapor deposition.

The unit holder is a member that integrates the mask 101, the limit plates 180, the aperture 170, and the vapor deposition source 160 to one another at least during the period of vapor deposition. The purpose of the integration is to maintain constant the relative positions and postures of the mask 101, the limit plates 180, the aperture 170, and injection ports 164 of the vapor deposition source 160 during this period. As described below, when the mask 101 is slid by using the sliding device, the limit plates 180, the aperture 170, and the injection ports 164 of the vapor deposition source 160 also need to be slid; however, by integrating these components with the unit holder, these components can be slid together while unchanging the positional relationship and the postures of these components.

The sliding device is a device that enables the above-described components integrated with the unit holder to slide in the X axis direction. The purpose of sliding is to slide the whole deposition unit 154 in the X axis direction and repeat vapor deposition while moving the substrate so as to carry out vapor deposition in the region not subjected to the first vapor deposition. This is because when the mask 101 is used, vapor deposition cannot be carried out on the entire surface of the substrate 190 by just moving the substrate 190 above the mask 101 once.

The substrate holder 151 is a component that can hold the substrate 190 and is disposed in the upper portion of the vacuum chamber. The substrate holder 151 holds the substrate 190 so that the mask 101 opposes the deposition surface of the substrate 190. The substrate holder 151 is preferably an electrostatic chuck.

In the process up to and not including the emission layer vapor deposition step S3, the TFTs 12, the wires 14, the interlayer film 13, the first electrodes 21, the edge cover 15, and the hole transport and injection layer 22 are formed on the transparent insulating substrate 11 of the substrate 190, as described above.

The substrate holder 151 is connected to the moving mechanism 152. The moving mechanism 152 guides the substrate holder 151 in the Y axis direction so that the substrate 190 opposes the pattern forming portion 130 of the mask 101. Then the substrate holder 151 and the substrate 190 held by the substrate holder 151 are moved along the Y axis direction at a constant speed so that they pass near the pattern forming portion 130. Meanwhile, the deposition unit 154 is fixed to the vacuum chamber and remains still at least during the period of vapor deposition. Accordingly, it is possible to relatively move the substrate 190 along the Y axis direction with respect to the deposition unit 154 by using the moving mechanism 152. The moving mechanism 152 may be a mechanism that includes a straight guide extending in the Y axis direction, a ball screw extending in the Y axis direction, a ball nut fitted to the ball screw, a driving motor (electric motor), such as a servomotor or stepping motor, that rotates and drives the ball screw, and a motor drive controller electrically coupled to the driving motor.

The moving mechanism 152 may be any mechanism capable of relatively moving the substrate 190 with respect to the deposition unit 154. Thus, the moving mechanism 152 may be connected to the substrate holder 151 and the deposition unit 154 and both the substrate holder 151 and the deposition unit 154 may be moved by the moving mechanism 152. The moving mechanism 152 may be connected to the deposition unit 154, the deposition unit 154 may be moved by the moving mechanism 152, and the substrate 190 and the substrate holder 151 may be fixed to the vacuum chamber.

The mask 101 is disposed so that the pattern forming portion 130 is positioned on the substrate 190 side and the first and second bars 110 and 120 are positioned on the limit plate 180 side.

The mask 101 is smaller than the substrate 190 and the dimension of the mask 101 in the Y axis direction is smaller than the dimension of the substrate 190 in the Y axis direction. In this manner, size reduction of the mask 101 is possible and the manufacturability of the mask 101 can be ensured even when the size of the substrate 190 is increased. Moreover, deflection of the mask 101 by its own weight can be reduced.

In order to prevent the substrate 190 from being damaged during transportation of the substrate 190, the substrate 190 is moved above the mask 101 with a particular gap therebetween during the period of vapor deposition. The size of this gap is not particularly limited and may be set appropriately. For example, the gap may be set to be about the same as the gap between a mask and a substrate employed in a typical scan vapor deposition method.

The vapor deposition source 160 is a component that heats the material (preferably an organic material) to be vapor deposited so as to gasify the material, in other words, evaporate or sublimate the material, and releases the gasified material into the vacuum chamber. The vapor deposition source 160 is disposed in a lower portion of the vacuum chamber. More specifically, the vapor deposition source 160 includes an evaporating portion 161, a scattering portion 162 connected to the evaporating portion 161 and configured to form a space in which the gasified material scatters, and multiple nozzles 163 periodically disposed in an upper portion (the mask 101 side portion) of the scattering portion 162. The evaporating portion 161 includes a heat-resistant container (not illustrated), for example, a crucible, that accommodates the material and a heating device (not illustrated), for example, a heater and a heating power supply, that heats the material accommodated in the container. An injection port (opening) 164 is formed at the tip of each nozzle 163. The injection ports 164 penetrate to the scattering portion 162 and are disposed at regular intervals in the X axis direction. When a material is placed in the container of the evaporating portion 161 and heated with the heating device to be gasified, the gasified material (vapor deposition particles) scatters inside the scattering portion 162 and is ultimately released from the injection ports 164. As a result, vapor deposition flows 191, which are flows of vapor deposition particles, are generated from the injection ports 164, and the vapor deposition flows 191 (vapor deposition particles) isotopically spread from the injection ports 164.

The type of the vapor deposition source 160 is not particularly limited and may be, for example, a point source, a line source, or a plane source. The method for heating the vapor deposition source 160 is not particularly limited and examples thereof include a resistive heating method, an electron beam method, a laser vapor deposition method, a high frequency induction heating method, and an arc method. The arrangement of the nozzles 163 are not particularly limited and, for example, multiple nozzles 163 may be arranged into multiple rows in the Y axis direction. Furthermore, multiple vapor deposition sources 160 may be arranged to align in the Y axis direction.

The shutter 153 is provided so as to be insertable between the vapor deposition source 160 and the aperture 170. When the shutter 153 is inserted between these components, the vapor deposition flows 191 are blocked. When the shutter 153 is inserted between the vapor deposition source 160 and the aperture 170 as needed as such, vapor deposition onto undesired portions (non-vapor-deposition region) of the substrate 190 can be prevented.

The aperture 170 is a thick-plate-shaped component in which multiple openings (through holes) 171 are formed and is disposed substantially in parallel to the XY plane remote from the vapor deposition source 160. The openings 171 are disposed at regular intervals in the X axis direction at substantially the same pitch as the pitch of the injection ports 164 of the vapor deposition source 160 in the X axis direction.

The distance between the vapor deposition source 160 and the aperture 170 is not particularly limited and may be set appropriately. For example, the distance may be about the same as the distance between the vapor deposition source and the aperture employed in a typical scan vapor deposition method.

All of the openings 171 are formed to have substantially the same dimensions and substantially the same shape. The shape of each of the openings 171 when viewed along the Z axis direction is, for example, oblong or square. The shape of each of the openings 171 when viewed along the Z axis direction is not particularly limited and may be independently set appropriately. Typically, the shape includes a pair of sides parallel to the Y axis direction.

One injection port 164 is disposed under each opening 171 so that the openings 171 and the injection ports 164 have one-to-one correspondence. The position of each injection port 164 in the X axis direction is substantially the same as the position of the center of the corresponding opening 171 in the X axis direction. When viewed along the Y axis direction, each injection port 164 is positioned substantially directly below the center of the corresponding opening 171.

However, the correspondence between the openings 171 and the injection ports 164 is not particularly limited. For example, two or more openings 171 may be provided with respect to one injection port 164 or one opening 171 may be provided with respect to two or more injection ports 164. The latter is preferable for co-vapor deposition, namely, vapor deposition of two or more materials simultaneously. Each of the injection ports 164 may be disposed at a position deviating from directly below the center of the corresponding opening 171 when viewed along the Y axis direction.

The "opening 171 corresponding to the injection port 164" means that this opening 171 is designed to pass vapor deposition particles released from that injection port 164.

A vapor deposition flow 191 that has a particular breadth and released from the injection port 164 ascends from below each opening 171. Some of the vapor deposition particles contained in the vapor deposition flow 191 can pass through the opening 171. Other vapor deposition particles collide with a bottom portion of the aperture 170 or the wall of the aperture 170 in the opening 171 and adhere thereto, and thus cannot pass through the opening 171 or reach the mask 101. The aperture 170 prevents passage of the vapor deposition flow 191 through the openings 171 other than the opening 171 to which it corresponds (for example, the opening 171 next to the corresponding opening 171).

The aperture 170 limits the travel range of the vapor deposition particles that spread isotopically immediately after discharge from the respective injection ports 164, blocks components having poor directivity, specifically, vapor deposition particles having a relatively large velocity component in the X axis direction, and passes components having high directivity, specifically, vapor deposition particles having a relatively small velocity component in the X axis direction. The aperture 170 prevents the incident angle of the vapor deposition flow 191 with respect to the substrate 190 from becoming unnecessarily large and improves the X-axis-direction directivity of the vapor deposition particles incident on the substrate 190. When the aperture 170 is disposed as such, the magnitudes of blurring of the deposition pattern can be decreased and generation of ghosts can be suppressed.

The vapor deposition particles that have passed through the aperture 170 should ideally travel within the range limited by the aperture 170. However, in actual instances, the vapor deposition particles scatter before they reach the mask 101 and there is a possibility that vapor deposition particles that have a large velocity component in the X axis direction and travel outside the predetermined range may occur. There is also a possibility that the material adhering to the aperture 170 may re-evaporate and vapor deposition particles that have a large velocity component in the X axis direction and travel outside the predetermined range may occur. Thus, if only the aperture 170 is disposed between the vapor deposition source 160 and the mask 101, due to the presence of the vapor deposition particles that have a large velocity component in the X axis direction and travel outside the predetermine range, blurring of the deposition pattern is intensified and ghosts are generated. Moreover, due to the vapor deposition particles that have a large velocity component in the X axis direction and travel around from the side toward the pattern forming portion 130, blurring of the deposition pattern is intensified and ghosts may be generated. Thus, in this embodiment, multiple limit plates 180 are disposed between the aperture 170 and the mask 101 so as to prevent the vapor deposition particles that scatter after passing the aperture 170 from traveling outside the predetermined range. This also prevents the vapor deposition particles generated by re-evaporation of the material adhering to the aperture 170 from travelling outside the predetermined range. Furthermore, the vapor deposition particles that have travelled around are prevented from reaching the mask openings 132.

The limit plates 180 are disposed to partition the space between the mask 101 and the vapor deposition source 160 so as to divide the space into multiple spaces aligned in the X axis direction. In this manner, the vapor deposition particles having a large velocity component in the X axis direction caused by scattering, re-evaporation, and the like collide with and adhere to the limit plates 180 and cannot reach the mask 101. Even if the vapor deposition particles having a large velocity component in the X axis direction have travelled around toward the mask 101, these vapor deposition particles can be made to collide with and adhere to the limit plates 180. Thus, when the limit plates 180 are disposed together with the aperture 170, magnitude of blurring of the deposition pattern can be further reduced and generation of ghosts can be further suppressed compared to when only the aperture 170 is disposed.

The limit plates 180 are plate-shaped members and are disposed at different positions in the X axis direction. The limit plates 180 are arranged at regular intervals in the X axis direction and at a pitch substantially the same as the pitch of the openings 171 of the aperture 170 in the X axis direction.

The material for the limit plates 180 is not particularly limited but is preferably a material having a small thermal strain. Specifically, SUS 304 is preferable and Invar materials are more preferable.

The shape of each of the limit plates 180 is not particularly limited and may be independently set appropriately. For example, each limit plate 180 may be a flat-plate-shaped, bended, curved, or corrugated.

When viewed along the Z axis direction, one injection port 164 of the vapor deposition source 160, one opening 171 of the aperture 170, and one opening group 131 of the mask 101 are disposed between a pair of limit plates 180 adjacent to each other. When viewed along the Z axis direction, the position of each injection port 164 in the X axis direction is substantially the same as the position of the center between the pair of limit plates 180 sandwiching that injection port 164 in the X axis direction.

However, the correspondence between the limit plates 180 and the injection ports 164 is not particularly limited. For example, multiple pairs of limit plates 180 adjacent in the X axis direction may be disposed to correspond to one injection port 164 or a pair of limit plates 180 adjacent in the X axis direction may be arranged to correspond to multiple injection ports 164. The latter case is preferable for co-vapor deposition, namely, vapor deposition of two or more materials simultaneously. When viewed along the Z axis direction, the position of each injection port 164 in the X axis direction may be deviated from the position of the center between the pair of the limit plates 180 sandwiching that injection port 164 in the X axis direction.

The "pair of limit plates 180 adjacent to each other corresponding to the injection port 164" refers to a pair of limit plates 180 that are adjacent to each other and designed to allow passage of the vapor deposition particles released from that injection port 164.

The correspondence between the limit plates 180 and the opening groups 131 is not particularly limited. For example, a pair of limit plates 180 adjacent in the X axis direction may be provided to correspond to multiple opening groups 131.

The "pair of limit plates 180 adjacent in the X axis direction corresponding to the opening group 131" refers to the opening group 131 designed to pass vapor deposition particles that have passed through between the pair of limit plates 180.

All of the limit plates 180 have substantially the same dimensions and substantially the same shape and each limit plate 180 is disposed along the YZ plane (plane parallel to the Y axis and the Z axis), in other words, disposed along the Y axis direction and the Z axis direction. Each limit plate 180 may be a flat-plate-shaped component disposed substantially parallel to the YZ plane. The shape of each limit plate 180 when viewed along the X axis direction is, for example, oblong or square.

The dimension (thickness) of each limit plate 180 in the X axis direction is not particularly limited as long as the deposition pattern can be formed at the desired position of the substrate 190 without covering the mask opening 132, and may be set appropriately. For example, the dimension may be about the same as the dimension of a limit plate in the X axis direction employed in a typical scan vapor deposition method. The thickness of each limit plate 180 may be constant or varied. For example, each limit plate 180 may be thick on the vapor deposition source 160 side and thin on the mask 101 side so as to have a tapered cross section.

The dimension of each limit plate 180 in the Y axis direction is not particularly limited and is usually set to be larger than the dimension of each opening 171 of the aperture 170 in the Y axis direction, larger than the dimension of each of the bars 110 and 120 in the Y axis direction, and larger than the dimension of each mask opening 132 in the Y axis direction.

The dimension of each limit plate 180 in the Z axis direction is not particularly limited and may be set appropriately. For example, the dimension may be about the same as the dimension of the limit plate in the Z axis direction employed in a typical scan vapor deposition method.

When the limit plates 180 are disposed as such, the vapor deposition flows 191 ascend into spaces 183 (hereinafter also referred to as "limited spaces") between the adjacent limit plates 180 from the corresponding injection ports 164 below. Most of the vapor deposition particles contained in the vapor deposition flows 191 can pass through the limited spaces 183 and can reach the mask 101. Meanwhile, other vapor deposition particles travelling outside the predetermined range adhere to the limit plates 180, cannot pass through the limited spaces 183, and cannot reach the mask 101.

However, even when the limit plates 180 are disposed, ghosts would still occur if there is a gap between the mask 101 and each of the limit plates 180 as described above in Comparative Embodiment 1. Thus, in this embodiment, the limit plates 180 are in contact with the mask 101. In this manner, the probability that vapor deposition particles that have a large velocity component in the X axis direction and travel outside the predetermined range, namely, vapor deposition particles that have scattered after passing through the aperture 170 and vapor deposition particles generated by re-evaporation, would enter other limited spaces 183 can be significantly decreased and preferably can be decreased to nearly zero. As a result, generation of ghosts can be effectively suppressed.

In particular, except for the two limit plates 180 positioned at both ends in the X axis direction, mask-101-side edge portions (upper edge portions) 181 of the limit plates 180 are formed along lower portions (portions on the limit plate 180 side) 112 of the first bars 110. The upper edge portion 181 of each limit plate 180 and the lower portion 112 of the substrate first bar 110 are in contact with each other. For example, the lower portion 112 of each first bar 110 may have a flat surface and the upper edge portion 181 of each limit plate 180 may have a straight contour in contact with the flat surface of the lower portion 112 of the corresponding first bar 110.

There are no mask openings on the outer side of the two limit plates 180 positioned at both ends in the X axis direction; thus, scattering that occurs after the vapor deposition particles have passed through the aperture 170 and re-evaporation of the material adhering to the limit plates 180 and the aperture 170 rarely pose any problem even when these limit plates 180 are not in contact with the mask 101. However, ghosts may be generated due to the vapor deposition particles that travel around from the side in the Y axis direction toward the pattern forming portion 130 and have a large velocity component in the X axis direction. In such a case, the two limit plates 180 positioned at both ends in the X axis direction are preferably also in contact with the mask 101.

Specifically, the mask-101-side edge portions (upper edge portions) 181 of the two limit plates 180 positioned at both ends in the X axis direction are formed along the lower portions (portions on the limit plate 180 side) 122 of the second bars 120 and the upper edge portion 181 of each limit plate 180 is preferably in contact with the lower portion 122 of the second bar 120. For example, the lower portion 122 of each second bar 120 may have a flat surface and the upper edge portion 181 of each limit plate 180 may have a straight contour in contact with the flat surface of the lower portion 122 of the corresponding second bar 120.

The dimension of a region where each limit plate 180 contacts the corresponding bar 110 or 120 in the Y axis direction is not particularly limited but is preferably set to be larger than the dimension of each mask opening 132 in the Y axis direction from the viewpoint of effectively suppressing generation of ghosts.

Each of the limit plates 180 may be disposed away from the aperture 170 but is preferably in contact with the aperture 170 from the viewpoint of effectively suppressing generation of ghosts.

More specifically, an edge portion (edge portion on the aperture 170 side, lower edge portion) 182 opposite to the upper edge portion 181 of each limit plate 180 is preferably formed along an upper portion 172 (portion on the limit plate 180 side) of the aperture 170, and the lower edge portion 182 of each limit plate 180 is preferably in contact with the upper portion 172 of the aperture 170. For example, the upper portion 172 of the aperture 170 may have a flat surface and the lower edge portion 182 of each limit plate 180 may have a straight contour in contact with the flat surface of the upper portion 172 of the aperture 170.

The dimension of a region where each limit plate 180 contacts the aperture 170 in the Y axis direction axis direction is not particularly limited but is preferably set to be larger than the dimension of each opening 171 of the aperture 170 in the Y axis direction from the viewpoint of effectively suppressing generation of ghosts.

Each of the limit plates 180 may be joined, for example, spot-welded, to the aperture 170; however, from the viewpoint of facilitating the maintenance of the internal structure of the vapor deposition apparatus 150, each limit plate 180 is preferably in contact with the aperture 170 but not jointed thereto.

Most of the vapor deposition particles that have passed through the limited spaces 183 reach the pattern forming portion 130 of the mask 101. Since the mask openings 132 are formed in the pattern forming portion 130, some of the vapor deposition particles that have reached the pattern forming portion 130 are allowed to pass through the mask openings 132 and thus the vapor deposition particles can be deposited on the substrate 190 by forming a pattern corresponding to the mask openings 132.

There is a possibility that some of the vapor deposition particles that have passed through the limited spaces 183 may scatter near the pattern forming portion 130 or the material adhered to the bars 110 and 120 and the limit plate 180 may re-evaporate. However, in this embodiment, since the bars 110 and 120 are disposed to be in contact with the pattern forming portion 130, generation of ghosts caused by such vapor deposition particles can be suppressed.

The vapor deposition particles having a large velocity component in the Y axis direction do not particularly cause ghosts since they travel along the transportation direction of the substrate 190 and along the mask openings 132.

In the description below, operation of the vapor deposition apparatus 150 in the emission layer vapor deposition step S3 is described.

In the emission layer vapor deposition step S3, first, the pressure inside the vacuum chamber is decreased to create a high vacuum state (for example, ultimate vacuum: $1 \times 10^{-2}$ Pa or less). The material is heated to generate vapor deposition flows 191. Next, the substrate 190 is transported through an inlet (not illustrated) into the vacuum chamber and the substrate 190 is held by the substrate holder 151. Next, at a stand-by position outside the vapor deposition range, the substrate 190 and the mask 101 are aligned by using an alignment means. While leaving the substrate 190 at the stand-by position outside the vapor deposition range, the shutter 153 is retracted from between the vapor deposition source 160 and the aperture 170 and a waiting period is provided until the deposition rate becomes stable. It takes about 30 minutes for the deposition rate to stabilize. Immediately after opening the shutter 153, the vapor deposition flows are not stable and the deposition rate fluctuates, which makes it difficult to form a film of an accurate thickness. Thus, after the shutter 153 is opened, film deposition is conducted after elapse of a particular amount of time (about 30 minutes). During this time, a dummy substrate is placed inside the vapor deposition range and vapor deposition is conducted on the dummy substrate (dummy vapor deposition). After the deposition rate is stabilized, the dummy substrate is removed.

Next, as illustrated in FIG. 12, the substrate 190 is relatively moved with respect to the deposition unit 154 by using the moving mechanism 152 so that the substrate 190 and the mask 101 pass by each other along the Y axis direction at a constant relative speed. As a result, vapor deposition particles that have passed through mask openings 132 adhere one after next to the vapor deposition region of the substrate 190 moving relative to the deposition unit 154 and a stripe pattern (vapor deposition film) 195 is formed as a result. After the vapor deposition region of the substrate 190 has passed above the mask 101, the shutter 153 is inserted between the vapor deposition source 160 and the aperture 170 so as to end first vapor deposition on the substrate 190. After the substrate 190 passes above the mask 101, the substrate 190 is stopped temporarily. Each of the lines in the pattern 195 illustrated in FIG. 12 corresponds to an opening group and in actual cases, each line includes multiple fine lines that correspond to the mask openings 132.

After the first vapor deposition, the sliding device is used to slide the deposition unit 154 in the X axis direction. Then the substrate 190 and the mask 101 are aligned, the shutter is opened, and after the deposition rate has stabilized, second vapor deposition is conducted as in the first vapor deposition. Specifically, while the substrate 190 is being relatively moved with respect to the mask 101 by using the moving mechanism 152 at a constant relative speed in a direction opposite to that of the first vapor deposition, a stripe-shaped film (vapor deposition film) is formed by causing vapor deposition particles passing through the mask 101 to adhere to the vapor deposition region (this time the region in which no pattern has been formed in the first vapor deposition) of the substrate 190. As a result, a stripe pattern for the emission layers 23R, 23G, and 23B is formed in the entire vapor deposition region of the substrate 190.

The substrate 190 may be moved above the mask 101 in a reciprocal manner more than once during which vapor deposition may be performed more than once so that the pattern achieves a desired thickness.

The shutter may be left open between the first deposition and the second deposition so that the stabilizing the deposition rate before the second vapor deposition can be omitted.

After completion of the first vapor deposition, the substrate 190 may be returned to the initial stand-by position and the substrate 190 and the mask 101 of the deposition unit 154 slid in the X axis direction may be aligned with each other at that position. Then while the substrate 190 is being relatively moved by the moving mechanism 152 with respect to the mask 101 at a constant relative speed in the same direction as the first vapor deposition, vapor deposition particles passing through the mask 101 may be caused to adhere to the vapor deposition region (this time the region in which no pattern has been formed in the first vapor deposition) of the substrate 190.

In the emission layer vapor deposition step S3, three types of light-emitting materials are used to conduct the above-described series of vapor deposition three times so that the emission layers 23R, 23G, and 23B of three colors are formed sequentially. The order in which the emission layers 23R, 23G, and 23B are formed is not particularly limited and can be set appropriately.

After completion of vapor deposition of all of the emission layers, the substrate 190 is transported by the moving mechanism 152 to a position immediately before the outlet (not illustrated) and the substrate 190 is discharged to outside the vacuum chamber from the outlet. With this operation, the emission layer vapor deposition step S3 is ended.

As described above, the vapor deposition apparatus 150 according to this embodiment is a vapor deposition apparatus for forming films on a substrate 190. The vapor deposition apparatus 150 according to this embodiment includes a deposition unit 154 that includes the mask 101 according to this embodiment, a vapor deposition source 160 that releases vapor deposition particles, and a limit plate 180 that is disposed between the mask 101 and the vapor deposition source 160 and partitions the space between the mask 101 and the vapor deposition source 160 so as to divide the space into multiple spaces aligned in the X axis direction (second direction); and a moving mechanism 152 that relatively moves the substrate 190 with respect to the deposition unit 154 in the Y axis direction (first direction) while distancing the substrate 190 from the mask 101. The mask 101 is disposed so that a pattern forming portion 130 is positioned on the substrate 190 side and the first bar 110 is positioned on the limit plate 180 side, and the limit plate 180 is in contact with the first bar 110 but not with the pattern forming portion 130.

Since the vapor deposition apparatus 150 according to this embodiment includes the mask 101 according to this embodiment and the limit plate 180, and the limit plate 180 is in contact with the first bar 110 but not with the pattern forming portion 130, generation of ghosts can be suppressed while maintaining the precision of the deposition pattern.

More specifically, since the limit plate 180 is in contact with the first bar 110 but not with the pattern forming portion 130, the first bar 110 can be disposed between the limit plate 180 and a portion of the pattern forming portion 130 between two mask openings 132 adjacent in the X axis direction and thus the region between these components can be covered with the first bar 110. Therefore, even when vapor deposition particles that have a large velocity component in the X axis direction and travel in unexpected directions are generated due to scattering of the vapor deposition particles near the mask 101 or re-evaporation of the materials adhering to the limit plate near the mask 101, the first bar 110 and the limit plate 180 can effectively block movement of the vapor deposition particles. Thus, generation of ghosts can be suppressed.

As described above, the first bar 110 is disposed on the inner side of the outer frame 102 and fixed to the outer frame 102; hence, the stiffness of the first bar 110 can be easily increased. Thus, even when the limit plate 180 is in contact with the first bar 110, deformation of the pattern forming portion 130 can be prevented and thus degradation of the precision of the deposition pattern can be prevented.

The vapor deposition apparatus 150 according to this embodiment includes an aperture 170 disposed between the limit plate 180 and the vapor deposition source 160, multiple openings 171 are formed in the aperture 170, the openings 171 of the aperture 170 are disposed in the X axis direction (second direction), and the limit plate 180 is positioned between adjacent two openings 171 among the opening 171 of the aperture 170 when viewed along the Z axis direction (third direction), and is in contact with the aperture 170.

As such, the vapor deposition apparatus 150 according to this embodiment includes the aperture 170 disposed between the limit plate 180 and the vapor deposition source 160, multiple openings 171 are formed in the aperture 170, and the openings 171 of the aperture 170 are disposed in the X axis direction (second direction). Thus, irrespective of where the limit plate 180 is positioned, the positions and dimensions of the openings 171 of the aperture 170 can be determined and unneeded components (for example, vapor deposition particles having a large velocity component in the X axis direction) among vapor deposition particles released from the vapor deposition source 160 can be efficiently made to adhere to the aperture 170. As a result, the range of the vapor deposition flow 191 can be effectively limited. In other words, the incident angle of the vapor deposition particles entering the mask 101 when viewed along the Y axis direction can be effectively decreased.

The limit plate 180 is positioned between adjacent two openings 171 among the openings 171 of the aperture 170 when viewed along the Z axis direction (third direction) and is in contact with the aperture 170; thus, the region between the limit plate 180 and a portion of the aperture 170 sandwiched by the adjacent two openings 171 in the X axis direction can be covered with the limit plate 180. Thus, even when vapor deposition particles that have a large velocity component in the X axis direction and travel in unexpected directions are generated by scattering of the vapor deposition particles near the aperture 170 or re-evaporation of the material adhering to the aperture 170 or the limit plate 180, movement of the vapor deposition particles can be effectively blocked by the limit plate 180. Thus, generation of ghosts can be effectively suppressed compared to when only the limit plate 180 is provided without the aperture 170.

As described above, the mask 101 includes a second bar that is disposed on the inner side of the outer frame 102 and fixed to the outer frame 102; the pattern forming portion 130 is disposed on the outer frame 102, the first bar 110, and the second bar 120; when, among the multiple mask openings 132, the mask opening positioned at one end in the X axis direction (second direction) is assumed to be an endmost opening 133 and the mask opening positioned next to the endmost opening 133 is assumed to be an adjacent opening 134, the second bar 120 is positioned on the side opposite of the adjacent opening 134 of the endmost opening 133 when viewed along the Z axis direction (third direction) and is in contact with the pattern forming portion 130; and the limit plates 180 include limit plates in contact with the second bar 120 but not the pattern forming portion 130. Thus, the second bar 120 can be disposed between the limit plate 180 and a portion of the pattern forming portion 130 on the side opposite of the adjacent opening 134 of the endmost opening 133, and the region between these components can be covered with the second bar 120. Thus, even when vapor deposition particles that have a large velocity component in the X axis direction and travelling around from the side in the Y axis direction toward the pattern forming portion 130 are generated, movement of the vapor deposition particles can be effectively blocked by the second bar 120 and the limit plates 180. Thus, generation of ghosts can be more effectively suppressed.

As described above, since the second bar 120 is disposed on the inner side of the outer frame 102 and fixed to the outer frame 102, the stiffness of the second bar 120 can be easily increased. Thus, even when the limit plate 180 is in contact with the second bar 120, deformation of the pattern forming portion 130 can be prevented and thus the precision of the deposition pattern can be maintained.

Examples of this embodiment will now be described.

First, a raw glass substrate (alkali-free glass) was washed, placed in an 200° C. oven for 1 hour in a nitrogen atmosphere at an atmospheric pressure, and then heated in vacuum at 200° C. for 2 hours. Next, the surface of the substrate was treated with $UV/O_3$ (ultraviolet/ozone). Subsequently, by using the vapor deposition apparatus according to this embodiment, $Alq_3$ (tris(8-quinolinolato)aluminum) was deposited on the substrate to a thickness of 100 nm through the mask for a vapor deposition apparatus according to this embodiment in high vacuum of $10^{-3}$ Pa or less. Then the surface profile of the deposition pattern was measured with a step meter (trade name: "Alpha-Step" produced by KLA-Tencor Corporation).

SUS 304 was used as the material for the limit plates and the limit plates were installed so that only predetermined vapor deposition particles would travel to the mask. Invar material was used as the material for the outer frame and bars. This is because the pattern of the mask openings may deform if the thermal strain is large. The temperature of the crucible of the vapor deposition source was in the range of 260° C. to 280° C. The same experiment was conducted multiple times. However, since the conditions such as feed amounts of the materials differed, the crucible temperature varied for each experiment within the range described above.

Figure 16:
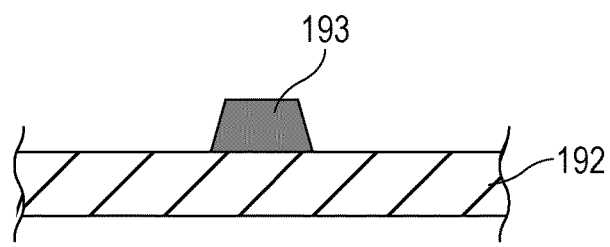
FIG. 16 is a schematic cross-sectional view of a substrate prepared in Example of Embodiment 1.

FIG. 16 is a schematic cross-sectional view of a substrate prepared in Example of Embodiment 1.

As illustrated in FIG. 16, in this Example, no ghost occurred on a raw glass substrate 192 and only a normal pattern 193 was formed.

Next, Comparative Example is described.

Comparative Example was the same as Example described above except that the first and second bars were not formed in the mask and a gap was left between the mask and each limit plate. The surface profile of the deposition pattern formed on the substrate prepared in Comparative Example was also studied as in Example.

Figure 17:
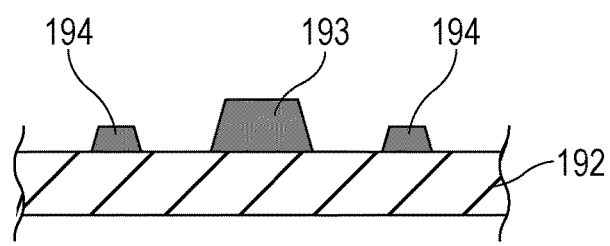
FIG. 17 is a schematic cross-sectional view of a substrate prepared in Comparative Example.

FIG. 17 is a schematic cross-sectional view of the substrate prepared in Comparative Example.

As illustrated in FIG. 17, in this Comparative Example, a ghost 194 was formed in addition to a normal pattern 193 on the raw glass substrate 192.

Embodiment 2

In this embodiment, features unique to this embodiment are mainly described and the contents that overlap with those of Embodiment 1 are omitted from the description. In this embodiment and Embodiment 1, components that have the same or similar function are referred to by the same or similar reference symbols and the descriptions of these components are omitted in this embodiment. This embodiment is materially identical to Embodiment 1 except for the points described below.

FIGS. 18 to 21 are schematic cross-sectional views of a vapor deposition apparatus according to Embodiment 2 taken in a direction perpendicular to the Y axis direction.

In Embodiment 1, the limit plates are positioned so that there are no gaps between them and corresponding end portions; thus, heat of the vapor deposition source is easily transmitted to the mask and the mask, particularly the pattern forming portion, may deform due to thermal strain.

Figure 18:
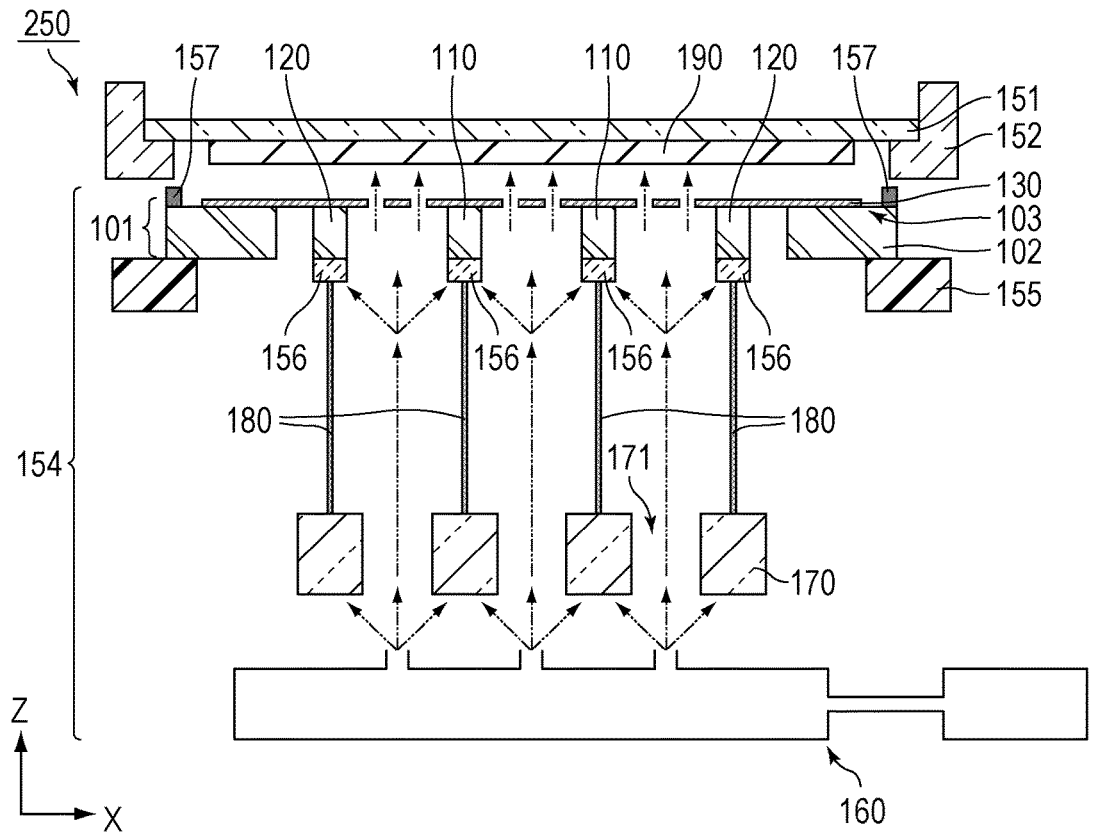
FIG. 18 is a schematic cross-sectional view of a vapor deposition apparatus according to Embodiment 2 taken in a direction perpendicular to the Y axis direction.

In contrast, as illustrated in FIG. 18, the deposition unit 154 of a vapor deposition apparatus 250 according to this embodiment further includes a temperature controlling device 156 that cools the mask 101 and multiple temperature sensors 157 in contact with the mask 101. Based on the temperatures of the mask 101 detected by the temperature sensors 157, the mask 101 can be cooled by the temperature controlling device 156 as needed and it becomes possible to effectively prevent deformation of the mask 101, in particular, the pattern forming portion 130, due to thermal strain.

The temperature controlling device 156 is disposed between each of the bars 110 and 120 and the corresponding limit plate 180 and is in contact with the bars 110 and 120 and the limit plate 180. Thus, movement of unneeded vapor deposition particles that have a large velocity component in the X axis direction can be effectively blocked by the bars 110 and 120, the limit plate 180, and the temperature controlling device 156, and generation of ghosts can be effectively suppressed as in Embodiment 1.

The specific structure of the temperature controlling device 156 is not particularly limited and specific examples thereof include pipes through which a cooling medium such as water or liquid nitrogen flows.

The specific structure of the temperature sensors 157 is not particularly limited and specific examples thereof include thermocouples.

The positions of the temperature sensors 157 to be installed are not particularly limited. For example, as illustrated in FIG. 18, they may be installed on the upper portion 103 of the outer frame 102 of the mask 101. The gap between the substrate 190 and the pattern forming portion 130 is usually very narrow and it is difficult to install the temperature sensors 157 in this gap. However, a region where the substrate 190 is absent can exist above the outer frame 102 and thus it is possible to install the temperature sensors 157 on the upper portion 103 of the outer frame 102.

Figure 19:
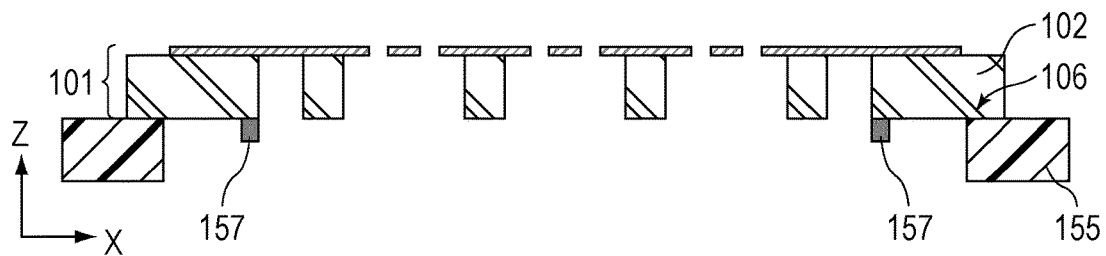
FIG. 19 is a schematic cross-sectional view of the vapor deposition apparatus according to Embodiment 2 taken in a direction perpendicular to the Y axis direction.

As illustrated in FIG. 19, the temperature sensors 157 may be disposed to be in contact with the lower portion (portion on the limit plate 180 side) 106 of the outer frame 102 of the mask 101. In this case, the temperature sensors 157 are installed at positions remote from the mask holder 155.

Figure 20:
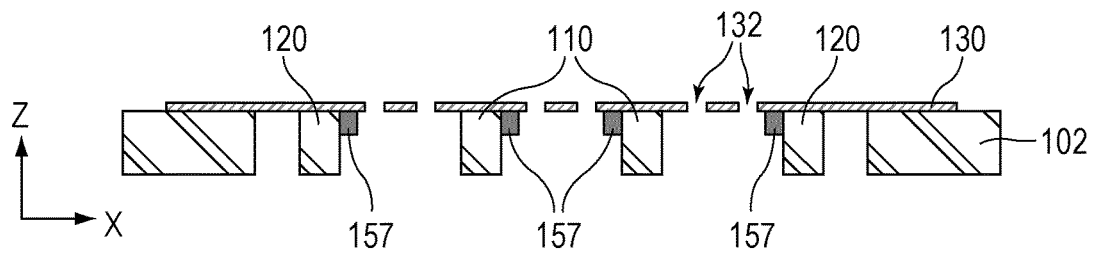
FIG. 20 is a schematic cross-sectional view of the vapor deposition apparatus according to Embodiment 2 taken in a direction perpendicular to the Y axis direction.

Since the gap between the substrate 190 and the pattern forming portion 130 is usually very narrow, it is difficult to install the temperature sensors 157 on the substrate 190 side of the pattern forming portion 130 in the region where the mask openings 132 are formed. Meanwhile, a space can exist between the mask openings 132 and the bars 110 and 120. Thus, as illustrated in FIG. 20, the temperature sensors 157 may be brought into contact with the bars 110 and 120 so that the temperature sensors 157 are installed near the pattern forming portion 130.

Figure 21:
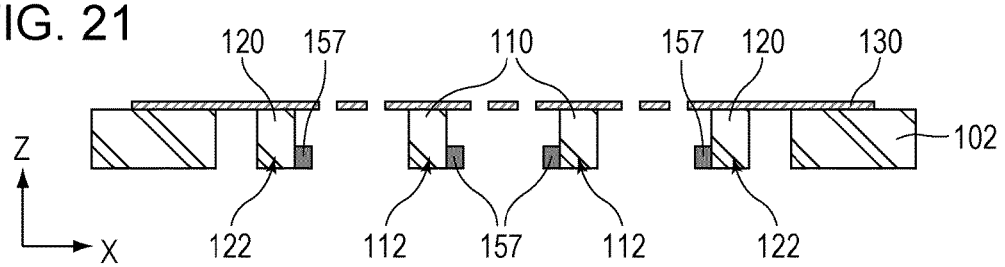
FIG. 21 is a schematic cross-sectional view of the vapor deposition apparatus according to Embodiment 2 taken in a direction perpendicular to the Y axis direction.

As illustrated in FIG. 21, the temperature sensors 157 may be in contact with the vicinities of the lower portions 112 and 122 of the bars 110 and 120.

As described above, the vapor deposition apparatus 250 according to this embodiment is a vapor deposition apparatus for forming films on a substrate 190. The vapor deposition apparatus 250 according to this embodiment includes a deposition unit 154 that includes a mask 101, a vapor deposition source 160 that releases vapor deposition particles, a limit plate 180 that are disposed between the mask 101 and the vapor deposition source 160 and partition the space between the mask 101 and the vapor deposition source 160 so as to divide the space into multiple spaces aligned in the X axis direction (second direction), a temperature controlling device 156 that cools the mask 101, and temperature sensors 157 in contact with the mask 101; and a moving mechanism 152 that relatively moves the substrate 190 with respect to the deposition unit 154 in the Y axis direction (first direction) while distancing the substrate 190 from the mask 101. The mask 101 is disposed so that a pattern forming portion 130 is positioned on the substrate 190 side and the first bar 110 is positioned on the limit plate 180 side. The temperature controlling device 156 is disposed between the first bar 110 and the limit plate 180 and in contact with the first bar 110 and the limit plate 180.

Since the deposition unit 154 includes the temperature controlling device 156 that cools the mask 101 and the temperature sensors 157 in contact with the mask 101, deformation of the mask 101, in particular, the pattern forming portion 130, can be effectively prevented.

The temperature controlling device 156 is disposed between the first bar 110 and the limit plate 180 and in contact with the first bar 110 and the limit plate 180; thus, movement of the unneeded vapor deposition particles having a large velocity component in the X axis direction can be effectively blocked by the first bar 110, the limit plate 180, and the temperature controlling device 156 and generation of ghosts can be effectively suppressed as in Embodiment 1.

The mask 101 includes a second bar 120 disposed on the inner side of the outer frame 102 and fixed to the outer frame 102. The pattern forming portion 130 is disposed on the outer frame 102, the first bar 110, and the second bar 120. When, among the multiple mask openings 132, the mask opening positioned at one end in the X axis direction (second direction) is assumed to be an endmost opening 133 and the mask opening positioned next to the endmost opening 133 is assumed to be an adjacent opening 134, the second bar 120 is positioned on the side opposite of the adjacent opening 134 of the endmost opening 133 when viewed along the Z axis direction (third direction) and is in contact with the pattern forming portion 130. The limit plates 180 includes a limit plate 180 in contact with the temperature controlling device 156 which is disposed between the second bar 120 and this limit plate 180. The temperature controlling device 156 is in contact with the second bar 120.

As described above, when viewed in the Z axis direction (third direction), the second bar 120 is positioned on the side opposite of the adjacent opening 134 of the endmost opening 133 and is in contact with the pattern forming portion 130; the limit plates 180 includes a limit plate 180 in contact with the temperature controlling device 156 which is disposed between the second bar 120 and this limit plate 180; and the temperature controlling device 156 is in contact with the second bar 120. Thus, even when vapor deposition particles having a large velocity component in the X axis direction traveling around from the side in the Y axis direction toward the pattern forming portion 130 are generated, movement of the vapor deposition particles can be effectively blocked by the second bar 120, the limit plates 180, and the temperature controlling device 156. Thus, generation of ghosts can be more effectively suppressed.

Since the second bar 120 is disposed on the inner side of the outer frame 102 and fixed to the outer frame 102, the stiffness of the second bar 120 can be easily increased. Thus, even when the limit plates 180 are brought into contact with the temperature controlling device 156 and the temperature controlling device 156 is brought into contact with the second bar 120, deformation of the pattern forming portion 130 can be prevented. Thus, precision of the deposition pattern can be maintained.

The vapor deposition apparatus 250 according to this embodiment includes the aperture 170 disposed between the limit plate 180 and the vapor deposition source 160. Multiple openings 171 are formed in the aperture 170. The openings 171 of the aperture 170 are disposed in the X axis direction (second direction). When viewed along the Z axis direction (third direction), the limit plate 180 is positioned between adjacent two openings 171 among the openings 171 of the aperture 170 and is in contact with the aperture 170. Thus, as in Embodiment 1, the incident angle of the vapor deposition particles entering the mask 101 when viewed along the Y axis direction can be effectively decreased and generation of ghosts can be more effectively suppressed.

Figure 22:
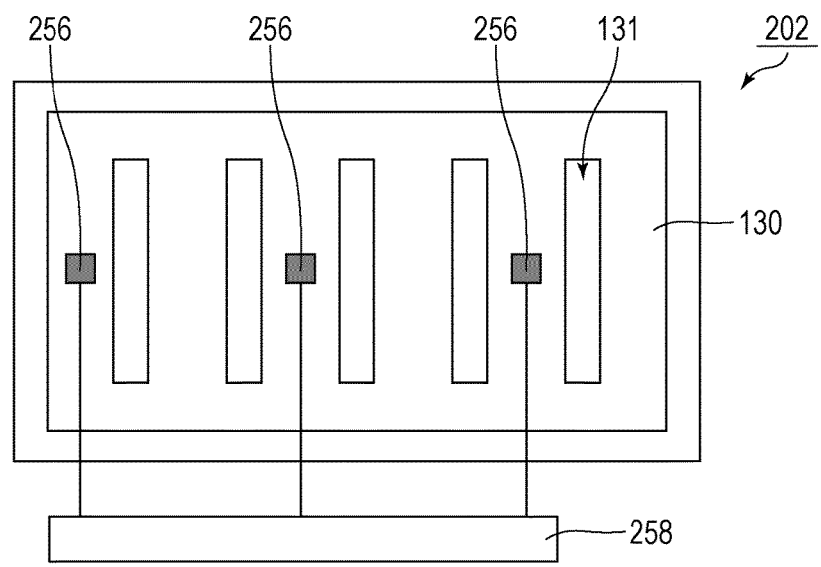
FIG. 22 is a schematic plan view of a mask used in Example of Embodiment 2.

Example of this embodiment will now be described. FIG. 22 is a schematic plan view of a mask used in Example according to Embodiment 2.

In this Example, multiple thermocouples were installed as temperature sensors at positions such that the vapor deposition flows were not affected. Specifically, as illustrated in FIG. 22, the substrate was not used in this Example and thermocouples 256 were installed on the pattern forming portion 130 near the opening groups 131. The temperature of a mask 202 was detected with a temperature monitor 258 connected to the thermocouples 256 and feed back control of the temperature controlling device was conducted based on the detection results so that the temperature of the mask 202 was substantially equal to the set temperature. The set temperature was room temperature (20° C. to 28° C.) This is because the mask 202 is likely to deform due to thermal strain if the temperature is higher than room temperature. A SUS pipe having a diameter of 5 mm through which cooling water flowed was used as the temperature controlling device, and the cooling water was introduced into the pipe from outside the vacuum chamber. The thickness of each limit plate was 5 mm, a pipe was installed between each limit plate and each bar, and cooling water was allowed to flow through the pipe. The limit plate and the pipe were installed so as not to change the position of the mask 202 installed.

Under the same conditions as in Example of Embodiment 1, vapor deposition flows were generated. In this Example, the increase in temperature of the mask 202 could be prevented and the temperature of the mask 202 could be controlled to 20° C. to 28° C.

On the other hand, in Example of Embodiment 1, thermocouples were installed on the pattern forming portion as in this Example so as to measure the temperature of the mask. The temperature was 60° C. to 80° C.

Embodiment 3

In this embodiment, features unique to this embodiment are mainly described and the contents that overlap with those of Embodiment 1 and Embodiment 2 are omitted from the description. In this embodiments and Embodiments 1 and 2, components that have the same or similar function are referred to by the same or similar reference symbols and the descriptions of these components are omitted in this embodiment. This embodiment is materially identical to Embodiment 1 except for the points described below.

Figure 23:
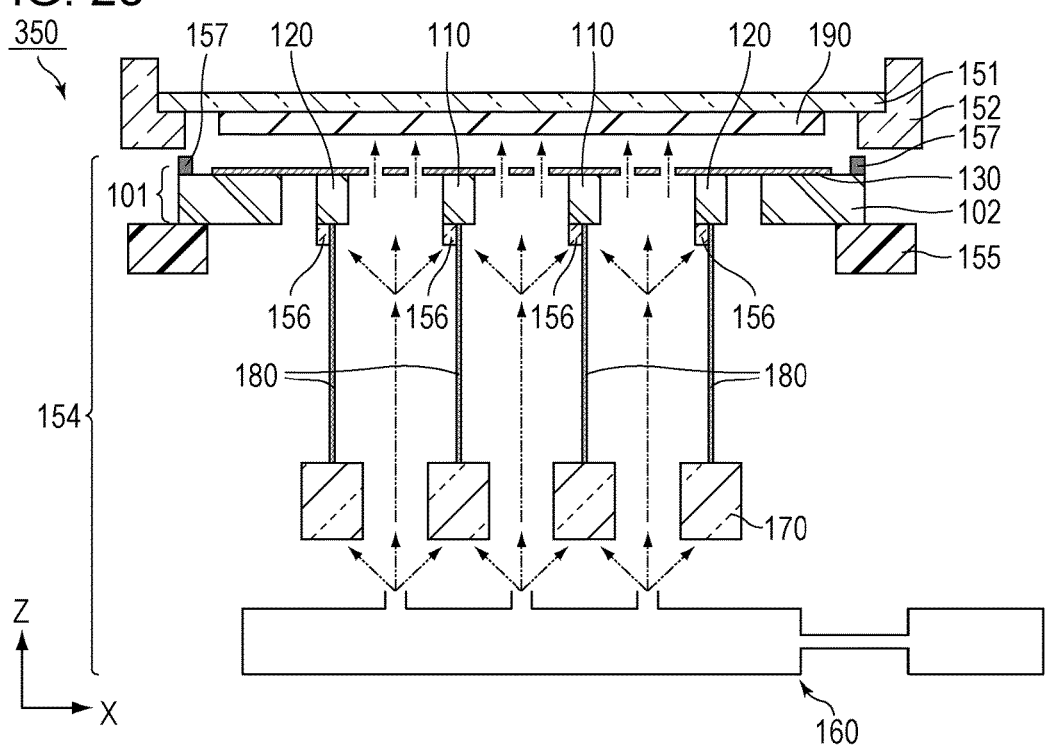
FIG. 23 is a schematic cross-sectional view of a vapor deposition apparatus according to Embodiment 3 taken in a direction perpendicular to the Y axis direction.

FIG. 23 is a schematic cross-sectional view of a vapor deposition apparatus according to Embodiment 3 taken in a direction perpendicular to the Y axis direction.

In Embodiment 2, the temperature controlling device was installed between each bar and the corresponding limit plate; however, the position of installing the temperature controlling device is not particularly limited and may be set appropriately.

As illustrated in FIG. 23, the deposition unit 154 of a vapor deposition apparatus 350 according to this embodiment further includes a temperature controlling device 156 that cools the mask 101 and multiple temperature sensors 157 in contact with the mask 101 as in Embodiment 2. However, the temperature controlling device 156 is not disposed between each of the bars 110 and 120 and the corresponding limit plate 180. The bars 110 and 120 are in contact with the corresponding limit plates 180 and the temperature controlling device 156 is disposed so as to contact at least one selected from a bar 110, a bar 120, and a limit plate 180. In other words, the vapor deposition apparatus 350 according to this embodiment is substantially the same as the vapor deposition apparatus of Embodiment 1 except that the temperature controlling device 156 and the temperature sensors 157 are provided. This embodiment can also have the same effects as those of Embodiment 2. However, when this embodiment is compared with Embodiment 2, the position where the temperature controlling device 156 is installed is different and thus Embodiment 2 has an advantage that heat from the limit plates 180 does not readily transmit to the bars 110 and 120. However, Embodiment 2 requires higher processing precision of each component. In contrast, although it takes time for controlling the temperature of the limit plates 180 in this embodiment compared to Embodiment 2, the processing precision of each component may be somewhat relaxed in this embodiment.

The temperature controlling device 156 may be disposed so as to contact the bars 110 and 120 and the limit plates 180 as illustrated in FIG. 23, may be disposed so as to contact the bars 110 and 120 but not the limit plates 180, or may be disposed so as to contact the limit plates 180 but not the bars 110 and 120.

As described above, in this embodiment, the deposition unit 154 includes the temperature controlling device 156 that cools the mask 101 and the temperature sensors 157 in contact with the mask 101. The temperature controlling device 156 is in contact with at least one selected from the first bar 110 and the limit plate 180 (the limit plate in contact with the first bar 110). The temperature controlling device 156 is in contact with at least one selected from the second bar 120 and the limit plate 180 in contact with the second bar 120. Thus, deformation of the mask 101, in particular, pattern forming portion 130, due to thermal strain can be effectively prevented.

Embodiment 4

In this embodiment, features unique to this embodiment are mainly described and the contents that overlap with those of Embodiments 1 to 3 are omitted from the description. In this embodiment and Embodiments 1 to 3, components that have the same or similar function are referred to by the same or similar reference symbols and descriptions of these components are omitted in this embodiment. This embodiment is materially identical to Embodiment 1 except for the points described below.

Figure 24:
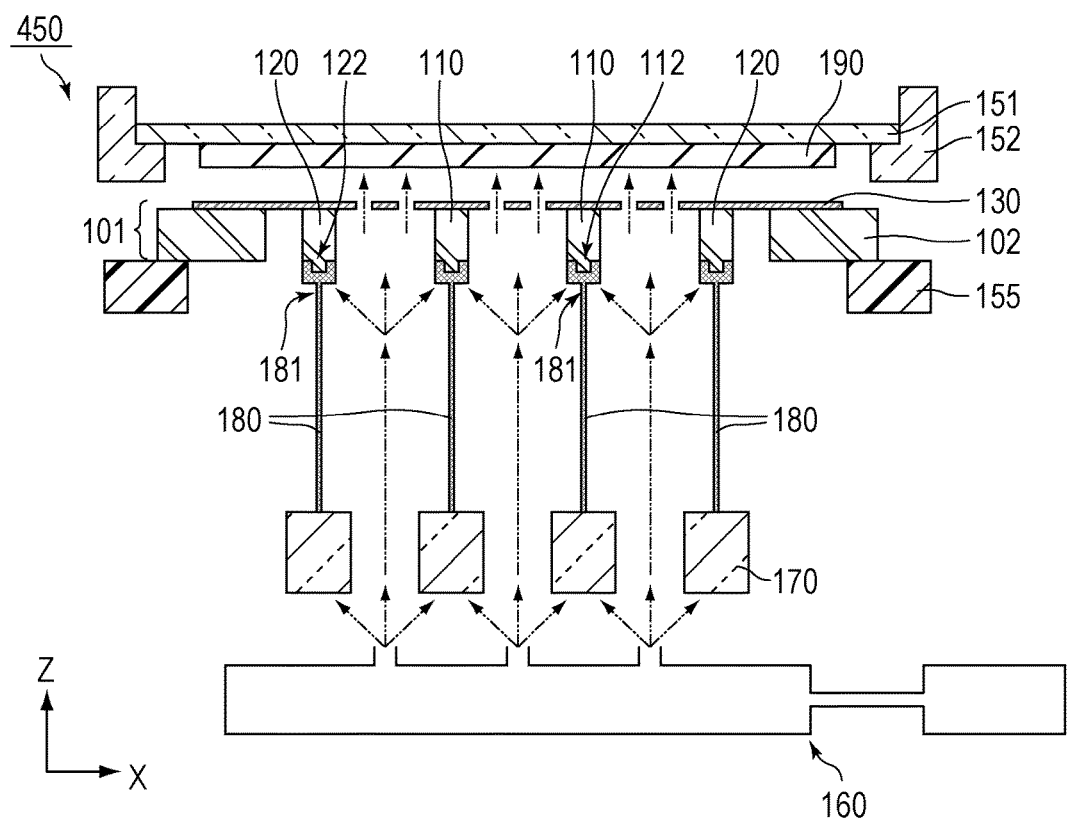
FIG. 24 is a schematic cross-sectional view of a vapor deposition apparatus according to Embodiment 4 taken in a direction perpendicular to the Y axis direction.
Figure 25:
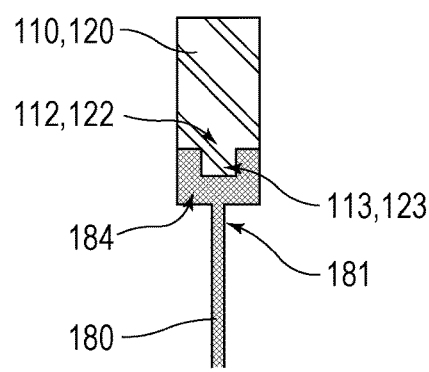
FIG. 25 is an enlarged schematic cross-sectional view of a first or second bar and a limit plate illustrated in FIG. 24.

FIGS. 24, 26, and 27 are schematic cross-sectional views of a vapor deposition apparatus according to Embodiment 4 taken in a direction perpendicular to the Y axis direction. FIG. 25 is an enlarged schematic cross-sectional view of first and second bars and limit plates illustrated in FIG. 24.

If each limit plate is simply brought into contact with the first or second bar as in Embodiment 1, there is a possibility that a minute gap would occur between these components and there is a possibility that ghosts may be generated as vapor deposition particles that have a large velocity component in the X axis direction and travel in unexpected directions would pass through this gap.

In contrast, in this embodiment, one of the first bar and the corresponding limit plate includes a recess and the other is fitted in the recess. Moreover, one of the second bar and the corresponding limit plate includes a recess and the other is fitted in the recess.

For example, as illustrated in FIGS. 24 and 25, in a vapor deposition apparatus 450 according to this embodiment, the lower portions 112 and 122 of the bars 110 and 120 are formed into a protruding shape and the bars 110 and 120 respectively have protrusions 113 and 123 that fit upper edge portions 181 of the corresponding limit plates 180. The upper edge portions 181 of the limit plates 180 are formed into a recessed shape and the limit plates 180 respectively have recesses 184 that fit the lower portions 112 and 122 of the corresponding bars 110 and 120. The protrusions 113 and 123 of the bars 110 and 120 are fitted into the recesses 184 of the corresponding limit plates 180. Thus, in a vacuum state in which the mean flight path is long, the possibility that vapor deposition particles will pass through the gap between the recess 184 and the protrusion 113 or 123 fitted therein is significantly reduced. Thus, in this embodiment, generation of ghosts can be more effectively suppressed than in Embodiment 1.

It is possible to form recesses in the limit plates 180 only and not to form protrusions on the bars 110 and 120. Specifically, as illustrated in FIG. 26, the upper edge portion 181 of each limit plate 180 may be formed into a recessed shape and each limit plate 180 may have a recess 184 that fits the lower portion 112 or 122 of the corresponding bar 110 or 120. The lower portions 112 and 122 of the bars 110 and 120 may be fitted into the recesses 184 of the corresponding limit plates 180. In this manner also, generation of ghosts can be more effectively suppressed than in Embodiment 1.

It is possible to form recesses in the bars 110 and 120 only and not to form protrusions on the limit plates 180. Specifically, as illustrated in FIG. 27, the lower portions 112 and 122 of the bars 110 and 120 may be formed into a recesses shape and the bars 110 and 120 may respectively have recesses 114 and 124 that fit the upper edge portions 181 of the corresponding limit plates 180. Then each limit plate 180 may be fitted into the recess 114 or 124 of the corresponding bar 110 or 120. In this manner also, generation of ghosts can be more effectively suppressed than in Embodiment 1.

The shapes of the bars 110 and 120 and the corresponding limit plates in the fitted portions may match exactly or not so exactly. In the former case, generation of ghost can be particularly effectively suppressed. In the latter case, installation and separation of the mask 101 and the limit plates 180 can be easily conducted and thus workability can be improved.

In this embodiment also, a temperature controlling device and temperature sensors may be provided as in Embodiment 3.

As described above, in this embodiment, one of the first bar 110 and the limit plate 180 includes a recess 114 or 184 and the other is fitted into the recess 114 or 184. One of the second bar 120 and the limit plate 180 in contact with the second bar 120 includes a recess 124 or 184 and the other is fitted into the recess 124 or 184. Thus, in a vacuum state in which the mean flight path is long, the possibility that vapor deposition particles will pass through the fitted portion is significantly reduced. Thus, in this embodiment, generation of ghosts can be more effectively suppressed than in Embodiment 1.

Embodiment 5

In this embodiment, features unique to this embodiment are mainly described and the contents that overlap with those of Embodiments 1 to 4 are omitted from the description. In this embodiment and Embodiments 1 to 4, components that have the same or similar function are referred to by the same or similar reference symbols and descriptions of these components are omitted in this embodiment. This embodiment is materially identical to Embodiment 1 except for the points described below. Although second bars have been provided in Embodiments 1 to 4 if necessary, no second bar is provided in this embodiment and instead limit plates are brought into contact with the outer frame as needed.

Figure 28:
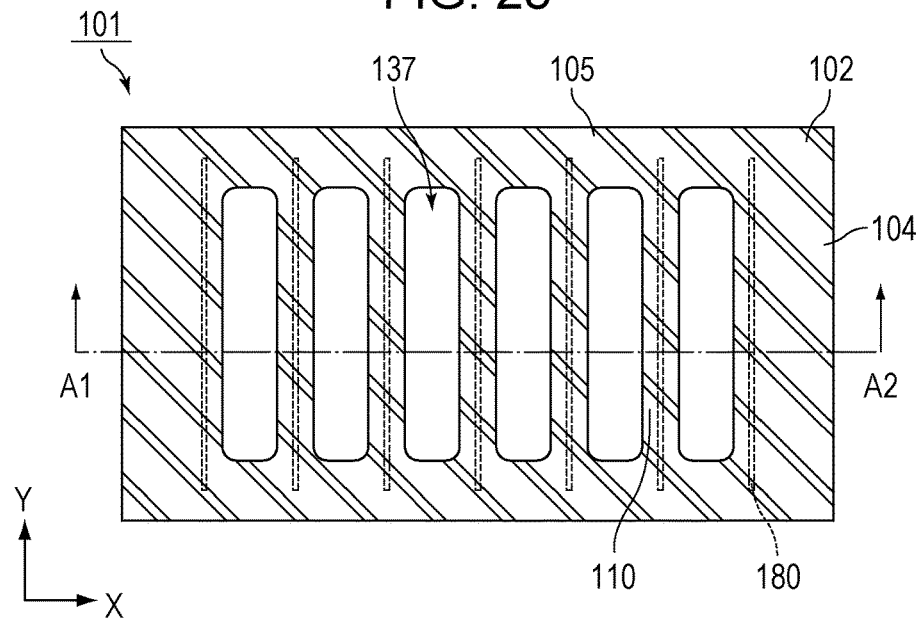
FIG. 28 is a schematic plan view of a mask for a vapor deposition apparatus according to Embodiment 5.
Figure 29:
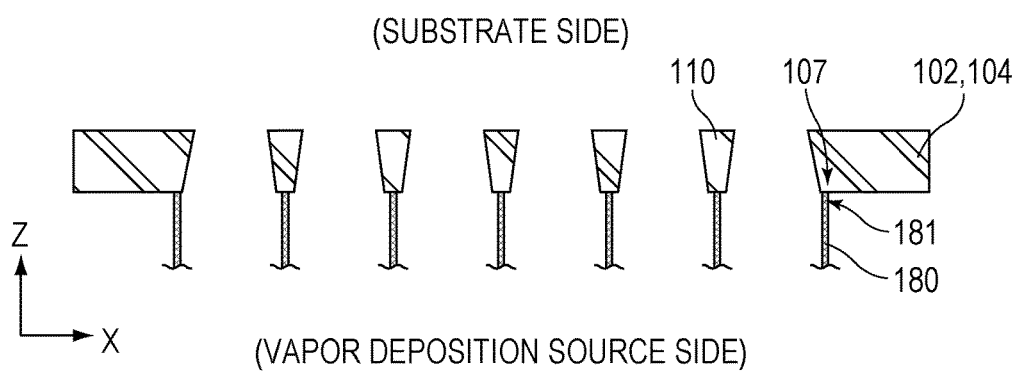
FIG. 29 is a schematic cross-sectional view of the mask for a vapor deposition apparatus according to Embodiment 5 taken along A1-A2 in FIG. 28.
Figure 30:
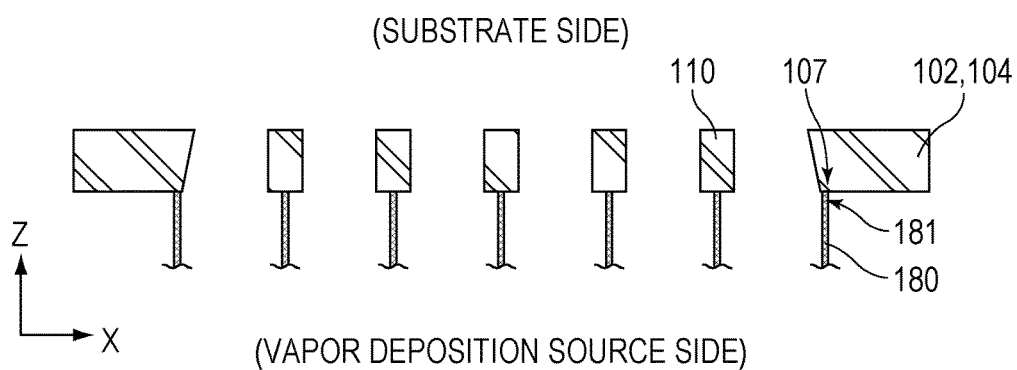
FIG. 30 is a schematic cross-sectional view of the mask for a vapor deposition apparatus according to Embodiment 5 taken along A1-A2 in FIG. 28.

FIG. 28 is a schematic plan view of a mask for a vapor deposition apparatus according to Embodiment 5. FIGS. 29 and 30 are schematic cross-sectional views of the mask for a vapor deposition apparatus according to Embodiment 5 taken along line A1-A2 in FIG. 28.

The mask 101 for a vapor deposition apparatus according to this embodiment includes an outer frame 102, multiple first bars 110, and a pattern forming portion (not illustrated in FIGS. 28 to 30) as illustrated in FIG. 28.

The outer frame 102 includes a pair of longitudinal (for example, rectangular parallelepiped) vertical frame portions 104 and a pair of longitudinal (for example, rectangular parallelepiped) horizontal frame portions 105 and each of the first bars 110 is installed between the pair of horizontal frame portions 105. A through hole 137 is formed next to each first bar 110 in the X axis direction, and the first bars 110 are disposed at, for example, regular intervals in the X axis direction. When viewed along the Z axis direction, corner portions of each through hole 137 are rounded.

As illustrated in FIGS. 29 and 30, in this embodiment also, the limit plates 180 corresponding to the first bars 110 are arranged to be in contact with the corresponding first bars 110. Meanwhile, two limit plates 180 positioned at both ends in the X axis direction are arranged to come into contact with the vertical frame portions 104 of the outer frame 102, respectively. According to this arrangement also, as in Embodiment 1, generation of ghosts due to vapor deposition particles travelling around from the side in the Y axis direction toward the pattern forming portion and having a large velocity component in the X axis direction can be suppressed.

Specifically, an outer-frame-102-side edge portion (upper edge portion) 181 of each of the two limit plates 180 positioned at both ends in the X axis direction is formed to fit a lower portion (portion on the limit plate 180 side) 107 of the vertical frame portion 104, and the upper edge portion 181 of each limit plate 180 and the lower portion 107 of the vertical frame portion 104 are in contact with each other. For example, the lower portion 107 of each vertical frame portion 104 has a flat surface and the upper edge portion 181 of each limit plate 180 has a straight contour in contact with the flat surface of the lower portion 107 of the corresponding vertical frame portion 104.

The dimensions of regions in the Y axis direction where the limit plates 180 positioned at both ends in the X axis direction and the corresponding vertical frame portions 104 are in contact with each other is not particularly limited. However, from the viewpoint of effectively suppressing generation of ghosts, the dimensions are preferably set to be larger than the dimension of each mask opening 132 in the Y axis direction.

As illustrated in FIG. 29, a surface of each vertical frame portion 104 facing the first bar 110 in a cross-section parallel to the XZ plane may be sloped so that this surface faces the vapor deposition source side or each first bar 110 may have a tapered shape that gradually narrows from the substrate side toward the vapor deposition source side. As a result, each through hole 137 may gradually spread from the substrate side toward the vapor deposition source side. Meanwhile, as illustrated in FIG. 30, in a cross-section parallel to the XZ plane, each of the first bars 110 may have an oblong shape.

Figure 31:
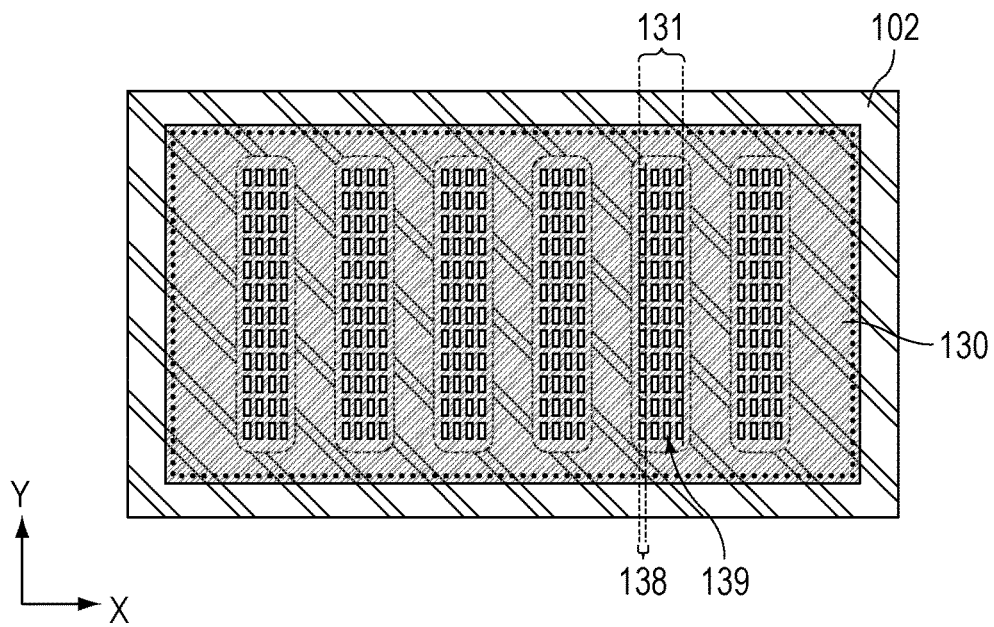
FIG. 31 is a schematic plan view of the mask for a vapor deposition apparatus according to Embodiment 5.

FIG. 31 is a schematic plan view of a mask for a vapor deposition apparatus according to Embodiment 5.

As illustrated in FIG. 31, a mask 101 for a vapor deposition apparatus according to Embodiment 5 includes a pattern forming portion 130 in which multiple opening groups 131 are formed so as to correspond to through holes 137. The peripheral portion of the pattern forming portion 130 is joined (for example, spot-welded) to the outer frame 102. The spot-welded portions are indicated by dotted lines in FIG. 31. Each opening group 131 includes multiple mask opening rows 138 disposed in the X axis direction. Each mask opening row 138 includes multiple mask openings 139 disposed along the Y axis direction.

Figure 32:
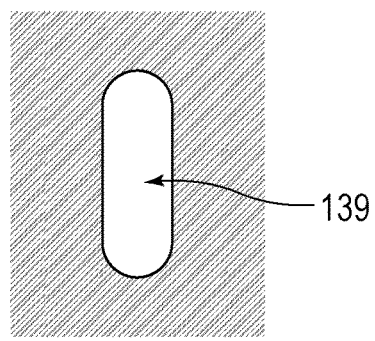
FIG. 32 is an enlarged schematic plan view of the mask for a vapor deposition apparatus according to Embodiment 5.
Figure 33:
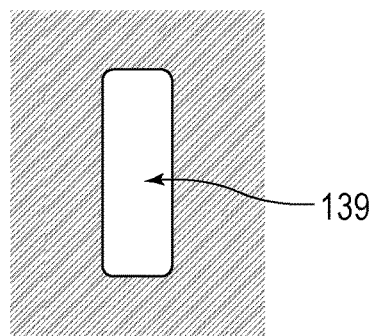
FIG. 33 is an enlarged schematic plan view of the mask for a vapor deposition apparatus according to Embodiment 5.

FIGS. 32 and 33 are enlarged schematic plan views of a mask for a vapor deposition apparatus according to Embodiment 5.

The shape of each mask opening 139 when viewed along the Z axis direction is not particularly limited. As illustrated in FIG. 32, the shape may be a race-track shape or, as shown in FIG. 33, the shape may be a rectangular shape with rounded corners.

Figure 34:
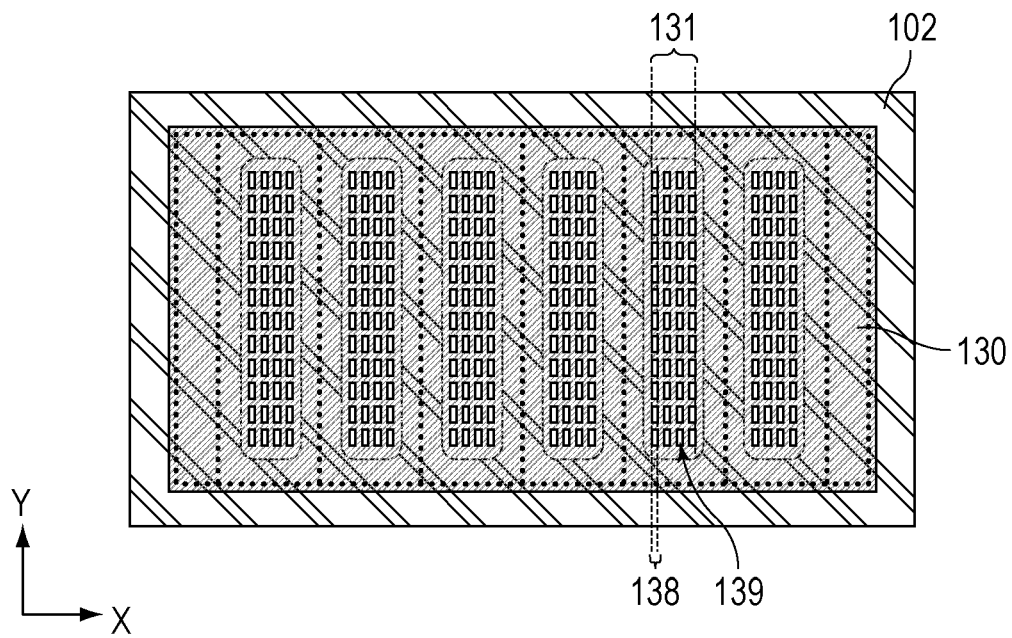
FIG. 34 is a schematic plan view of the mask for a vapor deposition apparatus according to Embodiment 5.

FIG. 34 is a schematic plan view of the mask for a vapor deposition apparatus according to Embodiment 5. In FIG. 34, spot-welded portions are indicated by dotted lines.

The first bars 110 may be simply in contact with the pattern forming portion 130 and may not be joined to the pattern forming portion 130 as illustrated in FIG. 31, or may be joined (for example, spot-welded) to the pattern forming portion 130 as illustrated in FIG. 34.

Modifications of Embodiments 1 to 5 are described below.

In each of the embodiments, multiple opening groups are formed in a pattern forming portion and multiple mask openings are formed in each of the opening groups; however, multiple mask openings may be uniformly formed in a pattern forming portion without providing multiple opening groups. Moreover, vapor deposition may be conducted on the entire vapor deposition region of the substrate by one transportation. However, in such a case, it becomes difficult to secure a space for installing the first bars as the definition of the pattern increases. Thus, from the viewpoint of increasing the definition of the deposition pattern, as described above, multiple opening groups are preferably disposed in the X axis direction and multiple first bars are preferably disposed so that each is positioned between adjacent two opening groups when viewed in the Z axis direction.

Figure 35:
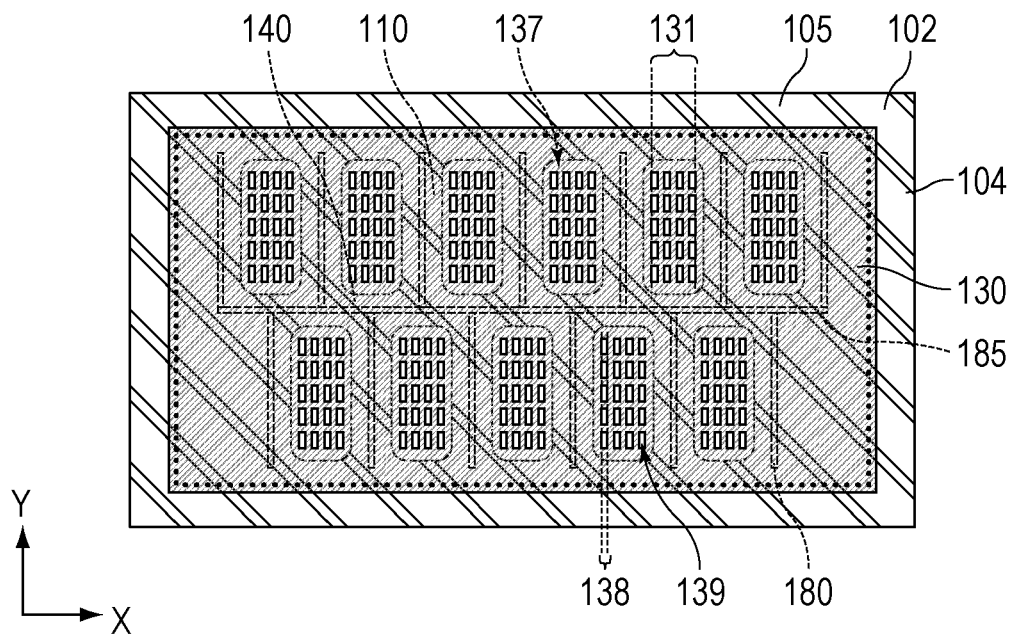
FIG. 35 is a schematic plan view of a mask for a vapor deposition apparatus according to a modification of Embodiments 1 to 5.
Figure 36:
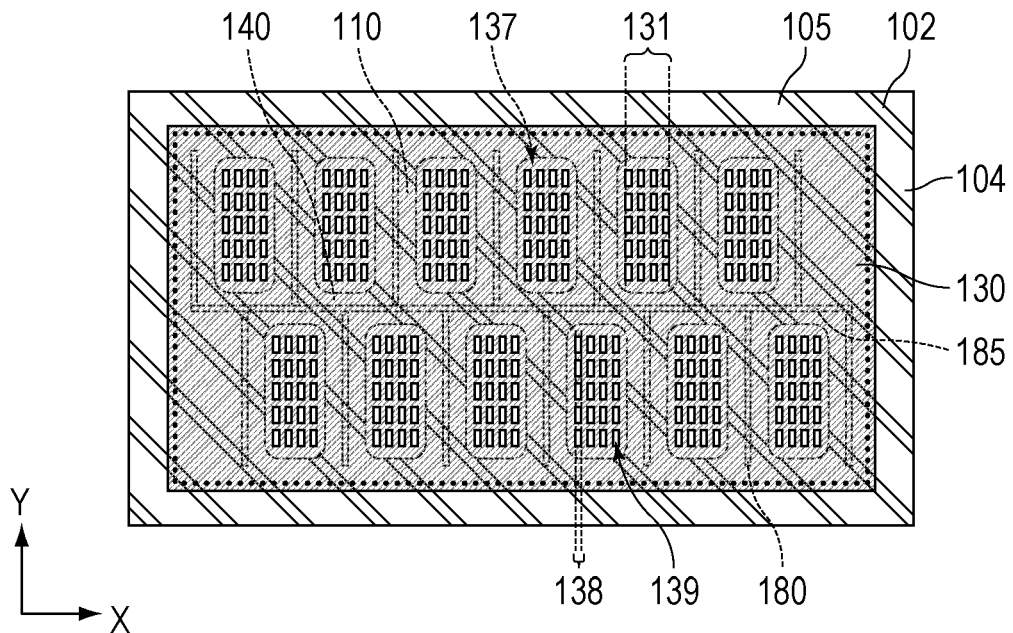
FIG. 36 is a schematic plan view of a mask for a vapor deposition apparatus according to a modification of Embodiments 1 to 5.

FIGS. 35 and 36 are schematic plan views of masks for a vapor deposition apparatus according to modifications of Embodiments 1 to 5. In FIGS. 35 and 36, spot-welded portions are indicated by dotted lines. As illustrated in FIGS. 35 and 36, a mask 101 for a vapor deposition apparatus according to this modification includes an outer frame 102 that includes a pair of longitudinal vertical frame portions 104 and a pair of longitudinal horizontal frame portions 105; a horizontal bar 140 installed along the X axis direction (for example, parallel to the X axis direction) between the pair of vertical frame portions 104; multiple first bars 110 installed between the horizontal bar 140 and each of the horizontal frame portions 105 so that through holes 137 are in zigzag alignment; and a pattern forming portion 130 in which multiple opening groups 131 corresponding the through holes 137 are in zigzag alignment. In this manner, vapor deposition can be conducted on the entire vapor deposition region of the substrate by one transportation while securing the space for installing the first bars 110. In this modification also, multiple limit plates 180 extending in the Y axis direction are provided to suppress ghosts and each of the limit plates 180 is in contact with the first bar 110 or the outer frame 102. If needed, a limit plate 185 that is in contact with the horizontal bar 140 and extends in the X axis direction is provided.

The horizontal bar 140 is longitudinal (for example, rectangular parallelepiped), is disposed on the inner side of the outer frame 102, and is fixed to the outer frame 102. Both end portions of the horizontal bar 140 are connected to the pair of vertical frame portions 104. The position (height) of the upper portion (portion on the pattern forming portion 130) of the horizontal bar 140 in the Z axis direction is substantially the same as the position (height) of the upper portion (portion on the pattern forming portion 130) of the first bar 110 in the Z axis direction and the position (height) of the upper portion (portion on the pattern forming portion 130 side) of the outer frame 102 in the Z axis direction. The surface of the upper portion of the horizontal bar 140, the surface of the upper portion of the first bar 110, and the surface of the upper portion of the outer frame 102 may be positioned on the same XY plane, for example.

The dimension of the horizontal bar 140 is not particularly limited and may be set appropriately as long as the required stiffness can be obtained and a deposition pattern can be formed at a desired position of the substrate without covering the opening groups 131.

However, since the pattern forming portion 130 is disposed on the horizontal bar 140, the first bar 110, and the outer frame 102, the flatness of the horizontal bar 140, the first bars 110, and the outer frame 102 is preferably high. Thus, the dimension (thickness) of the horizontal bar 140 in the Z axis direction is preferably substantially the same as the dimension (thickness) of each first bar 110 in the Z axis direction and the dimension (thickness) of outer frame 102 in the Z axis direction. In this manner, processability of the materials for the horizontal bar 140, the first bar 110, and the outer frame 102 can also be improved.

When the pattern forming portion 130 is joined (for example, spot-welded) to the horizontal bar 140, the pattern of the mask openings 132 may deform and an accurate pattern may not be formed on the substrate if the strength of the horizontal bar 140 is low. Thus, in such a case, assuming that the dimensions of the substrate are about 400 mm×500 mm, the width of the horizontal bar 140 in the transversal direction when viewed along the Z axis direction is preferably empirically 5 mm or more.

The method for fixing the horizontal bar 140 to the outer frame 102 is not particularly limited. As with the first bars, for example, the horizontal bar 140, the first bars 110, and the outer frame 102 may be separately prepared, the horizontal bar 140 may be joined (for example, spot-welded) to the outer frame 102, the bars 110 may be joined (for example, spot-welded) to the horizontal bar 140 and the outer frame 102, and subsequently, the first bars 110, the horizontal bar 140, and the outer frame 102 may be polished so that the pattern forming portion 130-side surfaces and the opposite surfaces have the desired parallelism and flatness. Alternatively, multiple through holes 137 may be formed in a thick plate and partition walls between the adjacent through holes 137 may be used as the first bars 110 and the horizontal bar 140. More specifically, for example, a rectangular parallelepiped material may be subjected to a drilling process or a cutting process and, if needed, a tapering process, and then at the final stage the first bars 110, the horizontal bar 140, and the outer frame 102 may be polished so that the pattern forming portion 130-side surfaces and the opposite surfaces have the desired parallelism and flatness.

Each of the opening groups 131 include multiple mask opening rows 138 arranged in the X axis direction. Each of the mask opening rows 138 includes multiple mask openings 139 arranged along the Y axis direction. The shape of each mask opening 139 when viewed along the Z axis direction is not particularly limited and may be a race-track shape as illustrated in FIG. 32 or a rectangular shape with rounded corners as illustrated in FIG. 33.

Figure 37:
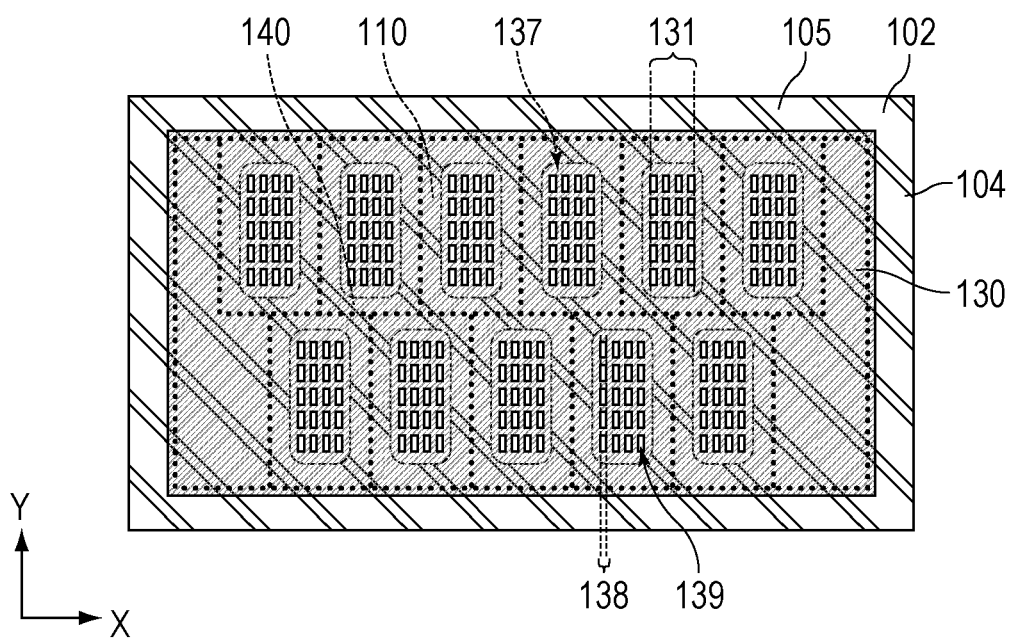
FIG. 37 is a schematic plan view of a mask for a vapor deposition apparatus according to a modification of Embodiments 1 to 5.
Figure 38:
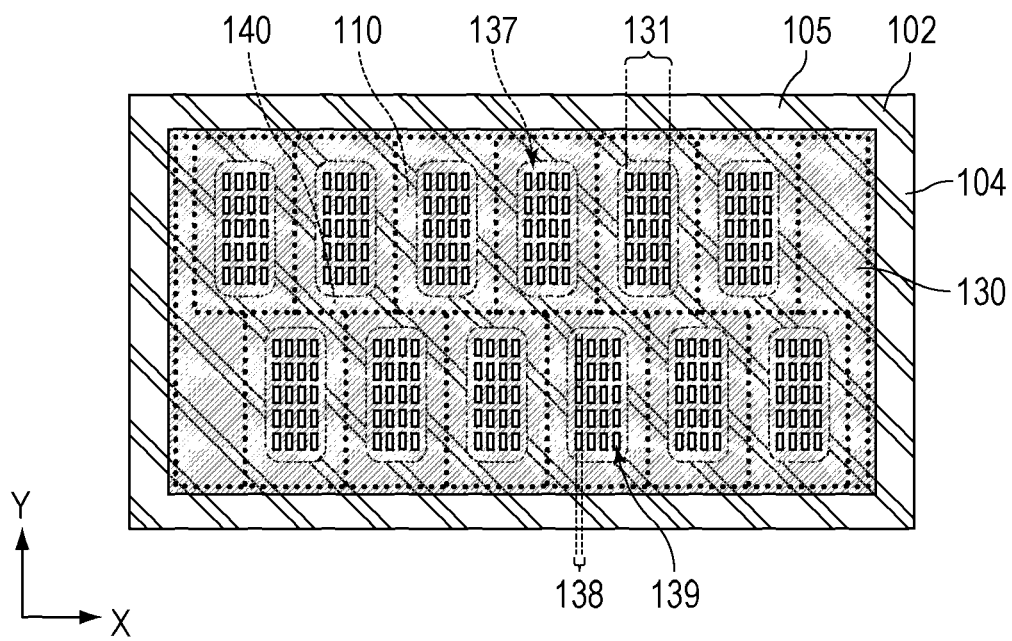
FIG. 38 is a schematic plan view of a mask for a vapor deposition apparatus according to a modification of Embodiments 1 to 5.
Figure 39:
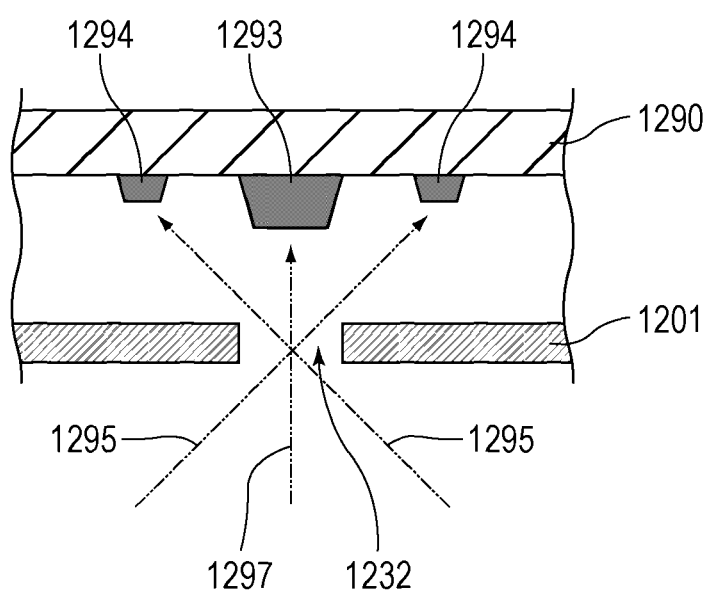
FIG. 39 is a schematic cross-sectional view of a substrate and a mask in a scan vapor deposition method.
Figure 40:
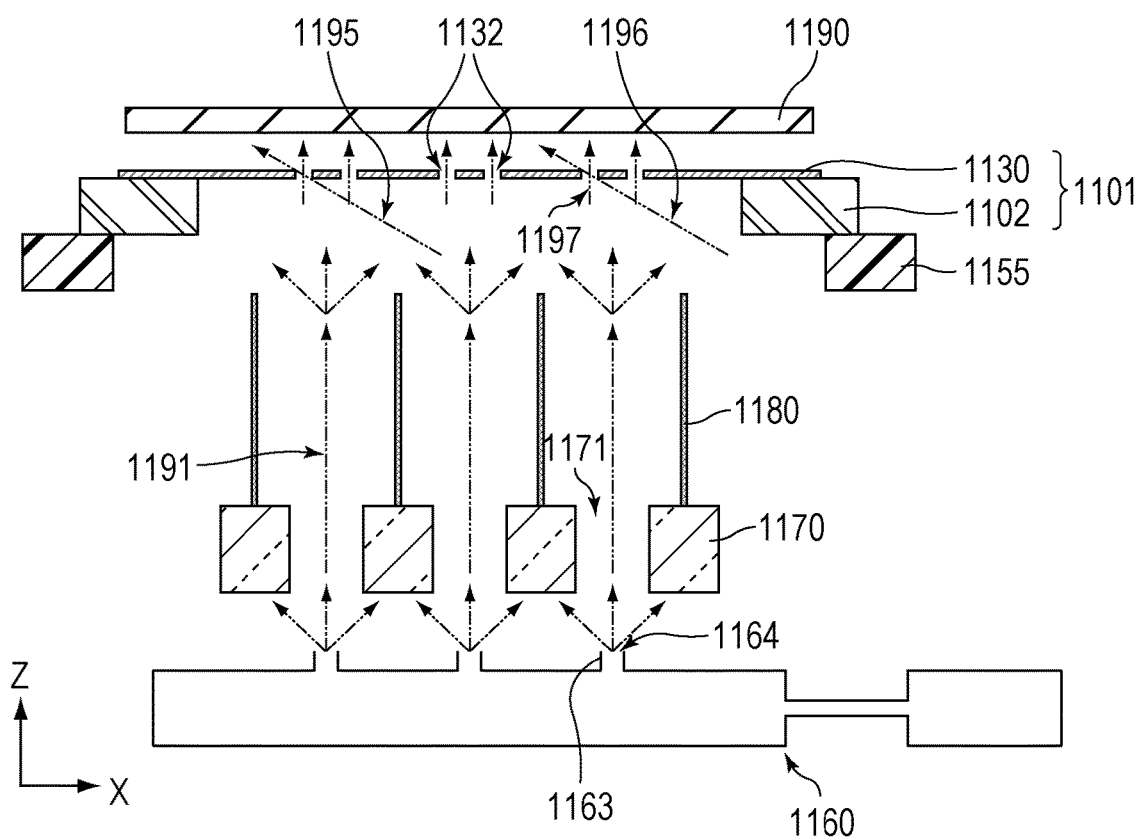
FIG. 40 is a schematic cross-sectional view of a vapor deposition apparatus according to Comparative Embodiment 1 studied by the inventors of the embodiment of the invention and is a cross-section taken in a direction perpendicular to the Y axis direction.
Figure 41:
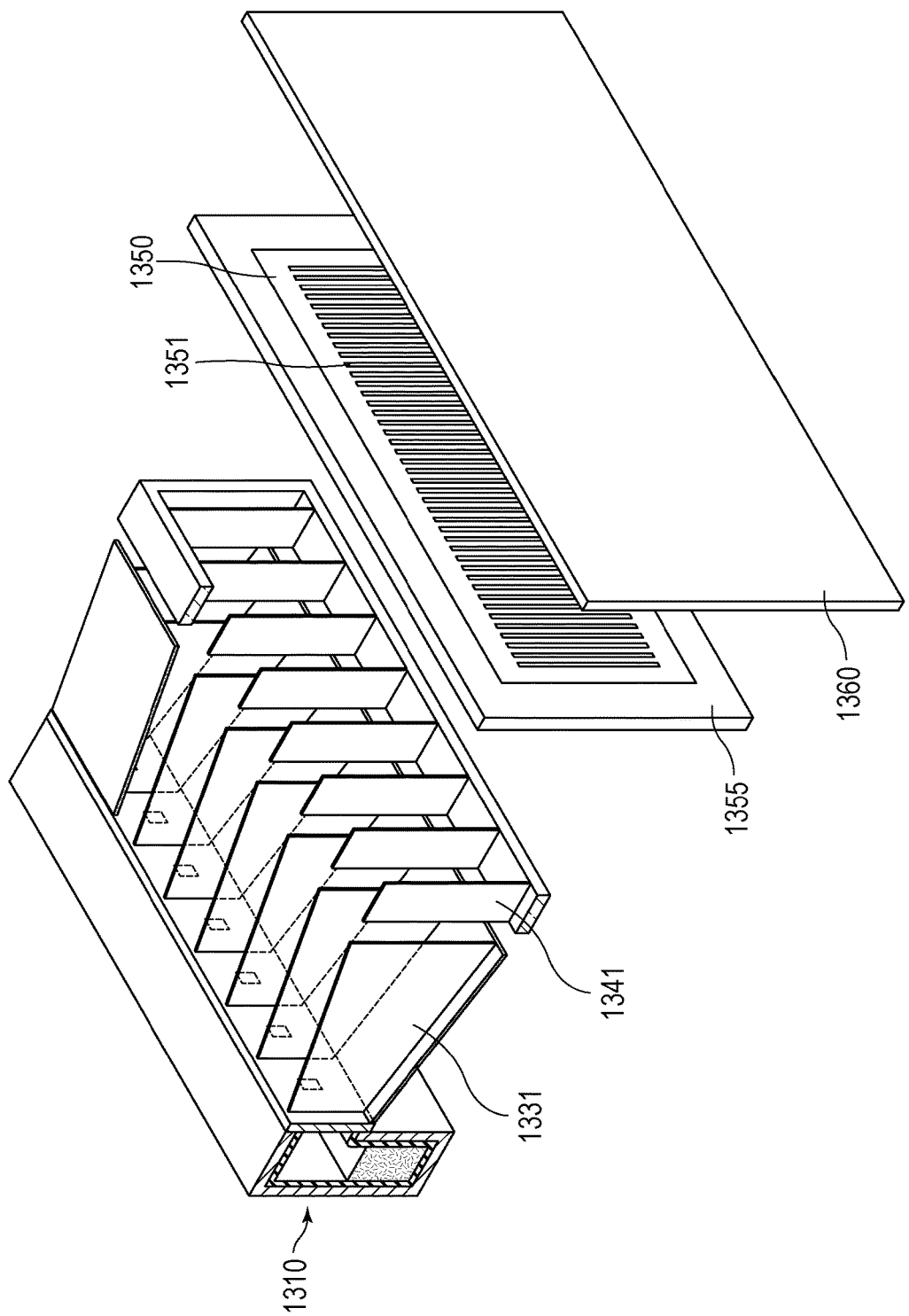
FIG. 41 is a schematic perspective view of a thin film vapor deposition apparatus described in FIG. 13 of PTL 1.

FIGS. 37 and 38 are schematic plan view of a mask for a vapor deposition apparatus according to a modification of Embodiments 1 to 5. In FIGS. 37 and 38, spot-welded portions are indicated by dotted lines.

Only the outer frame 102 may be joined (for example, spot-welded to the peripheral portion of the pattern forming portion 130 as illustrated in FIGS. 35 and 36 or the pattern forming portion 130 may be joined (for example, spot-welded) to the first bar 110, the outer frame 102, and the horizontal bar 140 along the border region of the opening groups 131 as illustrated in FIGS. 37 and 38.

The masks and vapor deposition apparatuses according to the embodiments described above may be used in vapor deposition steps other than the emission layer vapor deposition step, for example, an electron transport layer vapor deposition step S4. In this case, generation of ghosts can be suppressed in the step of vapor-depositing organic EL layers other than the emission layers and a second electrode. As such, in vapor deposition steps other than the emission layer vapor deposition step, a thin film pattern may be formed as in the emission layer vapor deposition step. For example, electron transport layers may be formed for each subpixel of each color.

The orientations of the constitutional components of the vapor deposition apparatus of each embodiment are not particularly limited. For example, arrangement of all of the constitutional components described above may be reversed upside down and the substrate may be held lengthways so that the vapor depositions flows are applied to the substrate horizontally (from sideways).

Organic EL display devices produced by using the vapor deposition apparatuses of the respective embodiments may be monochromic display apparatuses and each pixel need not be divided into multiple subpixels. In this case, in the emission layer vapor deposition step, vapor deposition of a light-emitting material of a single color may be performed to form emission layers of that color only.

In each of the embodiments, an example of forming organic layers of organic EL elements is described. However, the usage of the vapor deposition apparatus according to the embodiment of the invention is not particularly limited to production of organic EL elements and can be used in forming various types of thin film patterns.

The embodiments described above may be used in any combination without departing the gist of the embodiment of the invention. Modifications of the embodiments may be combined with other embodiments.

REFERENCE SIGNS LIST

1: organic EL display device
2: pixel
2R, 2G, 2B: subpixel
10: TFT substrate
11: insulating substrate
12: TFT
13: interlayer film
13a: contact hole
14: wire
15: edge cover
15R, 15G, 15B: opening
20: organic EL element
21: first electrode
22: hole injection and transport layer (organic layer)
23R, 23G, 23B: emission layer (organic layer)
24: electron transport layer (organic layer)
25: electron injection layer (organic layer)
26: second electrode
30: adhesive layer
40: sealing substrate
101: mask for vapor deposition apparatus
102: outer frame
103: upper portion of outer frame
104: vertical frame portion
105: horizontal frame portion
106: lower portion of outer frame
107: lower portion of vertical frame portion
110: first bar
111: upper portion of first bar
112: lower portion of first bar
113: protrusion of first bar
114: recess of first bar
120: second bar
121: upper portion of second bar
122: lower portion of second bar
123: protrusion of second bar
124: recess of second bar
130: pattern forming portion
131: opening group
132: mask opening 133: endmost opening
134: adjacent opening
135: gap
136: joined portion
137: through hole
138: mask opening row
139: mask opening
140: horizontal bar
150, 250, 350, 450: vapor deposition apparatus
151: substrate holder
152: moving mechanism (transportation mechanism)
153: shutter
154: deposition unit
155: mask holder
156: temperature controlling device
157: temperature sensor
160: vapor deposition source
161: evaporating portion
162: scattering portion
163: nozzle
164: injection port
170: aperture
171: opening of aperture
172: upper portion of aperture
180, 185: limit plate
181: upper edge portion of limit plate
182: lower edge portion of limit plate
183: limited space
184: recess of limit plate
190: substrate
191: vapor deposition flow
192: raw glass substrate
193: normal pattern
194: ghost (abnormal pattern)
195: pattern (deposited film)
256: thermocouple
258: temperature monitor

The invention claimed is:

1. A mask for a vapor deposition apparatus, comprising:
an outer frame;
a first bar disposed on an inner side of the outer frame and fixed to the outer frame;
a pattern forming portion disposed on the outer frame and the first bar and fixed to the outer frame;
a second bar disposed on the inner side of the outer frame and fixed to the outer frame;
a first through hole disposed between the first bar and the second bar; and
a second through hole disposed between the outer frame and the second bar, wherein
the pattern forming portion includes a plurality of mask openings for pattern formation,
each of the plurality of mask openings is disposed along a first direction,
the plurality of mask openings are disposed in a second direction orthogonal to the first direction,
the first bar is positioned between adjacent two mask openings among the plurality of mask openings when viewed along a third direction orthogonal to the first direction and the second direction,
among the plurality of mask openings, a mask opening positioned at one end in the second direction is assumed to be an endmost opening and another mask opening positioned next to the endmost opening is assumed to be an adjacent opening,
the second bar is positioned on a side opposite of the adjacent opening of the endmost opening when viewed along the third direction,
the first through hole overlaps the plurality of mask openings, and
the second through hole does not overlap the plurality of mask openings.

2. The mask for a vapor deposition apparatus according to claim 1, wherein
the pattern forming portion is disposed on the outer frame, the first bar, and the second bar,
the first bar is in contact with the pattern forming portion, and
the second bar is in contact with the pattern forming portion.

3. A vapor deposition apparatus for forming films on a substrate, comprising:
a deposition unit including the mask for a vapor deposition apparatus according to claim 1, a vapor deposition source configured to release vapor deposition particles, and a limit plate being disposed between the mask for a vapor deposition apparatus and the vapor deposition source and partitioning a space between the mask for a vapor deposition apparatus and the vapor deposition source so as to divide the space into a plurality of spaces aligned in the second direction; and
a moving mechanism configured to relatively move the substrate with respect to the deposition unit along the first direction while distancing the substrate from the mask for a vapor deposition apparatus, wherein
the mask for a vapor deposition apparatus is disposed so that the pattern forming portion is positioned on a substrate side and the first bar is positioned on a limit plate side, and
the limit plate is in contact with the first bar but not the pattern forming portion.

4. The vapor deposition apparatus according to claim 3, comprising an aperture disposed between the limit plate and the vapor deposition source, wherein
a plurality of openings are formed in the aperture,
the plurality of openings of the aperture are disposed in the second direction, and
the limit plate is positioned between adjacent two openings among the plurality of openings of the aperture when viewed along the third direction, and is in contact with the aperture.

5. The vapor deposition apparatus according to claim 4, wherein a width of the aperture between adjacent two openings in the second direction is wider than a width of the limit plate in the second direction.

6. The vapor deposition apparatus according to claim 3, wherein, of the first bar and the limit plate, one includes a recess and a part of the other is fitted into the recess.

7. The vapor deposition apparatus according to claim 3, wherein the deposition unit includes a temperature controlling device configured to cool the mask for a vapor deposition apparatus and a temperature sensor in contact with the mask for a vapor deposition apparatus, and
the temperature controlling device is in contact with at least one selected from the first bar and the limit plate.

8. The vapor deposition apparatus according to claim 7, wherein the temperature sensor is positioned on the substrate side.

9. The vapor deposition apparatus according to claim 3, wherein
a plurality of limit plates includes the limit plate in contact with the second bar but not the pattern forming portion.

10. The vapor deposition apparatus according to claim 9, wherein, of the second bar and the limit plate in contact with the second bar, one includes a recess and a part of the other is fitted into the recess.

11. The vapor deposition apparatus according to claim 9, wherein the deposition unit includes a temperature controlling device configured to cool the mask for a vapor deposition apparatus and a temperature sensor in contact with the mask for a vapor deposition apparatus, and
the temperature controlling device is in contact with at least one selected from the first bar and the limit plate in contact with the first bar, and is also in contact with at least one selected from the second bar and the limit plate in contact with the second bar.

12. A vapor deposition method comprising a vapor deposition step of forming films on a substrate,
the vapor deposition step being performed by using the vapor deposition apparatus according to claim 3.

13. A method for producing an organic electroluminescence element, comprising a vapor deposition step of forming films by using the vapor deposition apparatus according to claim 3.

14. A vapor deposition apparatus for forming films on a substrate, comprising:
a deposition unit including the mask for a vapor deposition apparatus according to claim 1, a vapor deposition source configured to release vapor deposition particles, a limit plate being disposed between the mask for a vapor deposition apparatus and the vapor deposition source and partitioning a space between the mask for a vapor deposition apparatus and the vapor deposition source so as to divide the space into a plurality of spaces aligned in the second direction, a temperature controlling device configured to cool the mask for a vapor deposition apparatus, and a temperature sensor in contact with the mask for a vapor deposition apparatus; and
a moving mechanism configured to relatively move the substrate with respect to the deposition unit along the first direction while distancing the substrate from the mask for a vapor deposition apparatus, wherein
the mask for a vapor deposition apparatus is disposed so that the pattern forming portion is positioned on a substrate side and the first bar is positioned on a limit plate side, and
the temperature controlling device is disposed between the first bar and the limit plate and is in contact with the first bar and the limit plate.

15. The vapor deposition apparatus according to claim 14, comprising an aperture disposed between the limit plate and the vapor deposition source, wherein
a plurality of openings are formed in the aperture,
the plurality of openings of the aperture are disposed in the second direction, and
the limit plate is positioned between adjacent two openings among the plurality of openings of the aperture when viewed along the third direction, and is in contact with the aperture.

16. The vapor deposition apparatus according to claim 14, wherein
a plurality of limit plates includes the limit plate being disposed such that the temperature controlling device is disposed between the second bar and the limit plate, and being in contact with the temperature controlling device, and
the temperature controlling device is in contact with the second bar.

* * * * *